United States Patent
Kies et al.

(10) Patent No.: US 10,901,606 B2
(45) Date of Patent: Jan. 26, 2021

(54) METHODS OF DIRECT MANIPULATION OF MULTI-LAYERED USER INTERFACES

(71) Applicant: QUALCOMM Incorporated, San Diego, CA (US)

(72) Inventors: Jonathan Kies, Encinitas, CA (US); Robyn Teresa Oliver, Escondido, CA (US); Robert Tartz, San Marcos, CA (US); Douglas Brems, San Diego, CA (US); Suhail Jalil, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 16/101,692

(22) Filed: Aug. 13, 2018

(65) Prior Publication Data
US 2019/0113995 A1    Apr. 18, 2019

Related U.S. Application Data

(60) Provisional application No. 62/572,453, filed on Oct. 14, 2017, provisional application No. 62/572,465, (Continued)

(51) Int. Cl.
*G09G 5/00* (2006.01)
*G06F 3/0488* (2013.01)
(Continued)

(52) U.S. Cl.
CPC .......... *G06F 3/0488* (2013.01); *G06F 1/3231* (2013.01); *G06F 3/013* (2013.01); (Continued)

(58) Field of Classification Search
CPC ......... G06F 1/3231; G06F 2203/04104; G06F 2203/04106; G06F 3/013; G06F 3/017; (Continued)

(56) References Cited

U.S. PATENT DOCUMENTS 8,358,226 B2   1/2013 Reynolds et al.
8,797,283 B2   8/2014 Waas
(Continued)

OTHER PUBLICATIONS

International Search Report and Written Opinion—PCT/US2018/046648—ISA/EPO—Nov. 9, 2018, 14 pages.

*Primary Examiner* — Insa Sadio
(74) *Attorney, Agent, or Firm* — The Marbury Law Group, PLLC

(57) ABSTRACT

In some embodiments, a processor of the mobile computing device may receive an input for performing a function with respect to content at the mobile device in which the content at the mobile device is segmented into at least a first command layer having one or more objects and a second command layer having one or more objects. The processor may determine whether the received input is associated with a first object of the first command layer or a second object of the second command layer. The processor may determine a function to be performed on one of the first or second objects based on whether the first command layer or the second command layer is determined to be associated with the received input, and the processor may perform the determined function on the first object or the second object.

56 Claims, 26 Drawing Sheets

Related U.S. Application Data filed on Oct. 14, 2017, provisional application No. 62/572,455, filed on Oct. 14, 2017, provisional application No. 62/572,460, filed on Oct. 14, 2017, provisional application No. 62/572,471, filed on Oct. 14, 2017.

(51) Int. Cl.
| | |
|---|---|
| *G06F 3/048* | (2013.01) |
| *G06F 1/3231* | (2019.01) |
| *G06F 3/041* | (2006.01) |
| *G06F 3/01* | (2006.01) |
| *G06F 3/044* | (2006.01) |
| *H03K 17/96* | (2006.01) |
| *G06F 3/0354* | (2013.01) |

(52) U.S. Cl.
CPC .......... *G06F 3/017* (2013.01); *G06F 3/03547* (2013.01); *G06F 3/041* (2013.01); *G06F 3/044* (2013.01); *G06F 3/048* (2013.01); *G06F 3/0412* (2013.01); *G06F 3/04166* (2019.05); *G06F 3/04883* (2013.01); *H03K 17/9622* (2013.01); *G06F 2203/04104* (2013.01); *G06F 2203/04106* (2013.01)

(58) Field of Classification Search
CPC .... G06F 3/03547; G06F 3/041; G06F 3/0412; G06F 3/0414; G06F 3/0416; G06F 3/0418; G06F 3/044; G06F 3/048; G06F 3/0488; G06F 3/04883; H03K 17/9622
See application file for complete search history.

(56) References Cited

U.S. PATENT DOCUMENTS

| | | | |
|---|---|---|---|
| 8,854,320 B2 | 10/2014 | Hirata et al. | |
| 8,988,356 B2 | 3/2015 | Tseng | |
| 9,152,271 B2 | 10/2015 | Schmidt et al. | |
| 9,389,830 B2 | 7/2016 | Yuan | |
| 9,519,356 B2 | 12/2016 | Hinckley et al. | |
| 9,557,846 B2 | 1/2017 | Baharav et al. | |
| 9,588,629 B2 | 3/2017 | Jordan et al. | |
| 9,772,764 B2 | 9/2017 | Elyada et al. | |
| 10,067,664 B2 | 9/2018 | Kim | |
| 2006/0197750 A1 | 9/2006 | Kerr et al. | |
| 2011/0053641 A1 | 3/2011 | Lee et al. | |
| 2011/0087963 A1 | 4/2011 | Brisebois et al. | |
| 2011/0163986 A1* | 7/2011 | Lee | G06F 1/1692 345/173 |
| 2012/0139860 A1 | 6/2012 | Hotelling et al. | |
| 2012/0268411 A1 | 10/2012 | Chen et al. | |
| 2012/0271545 A1* | 10/2012 | Cheng | G06F 1/169 701/431 |
| 2013/0106710 A1 | 5/2013 | Ashbrook et al. | |
| 2013/0194235 A1 | 8/2013 | Zanone et al. | |
| 2013/0257746 A1 | 10/2013 | Cherkasov et al. | |
| 2013/0265276 A1 | 10/2013 | Obeidat et al. | |
| 2014/0078086 A1 | 3/2014 | Bledsoe et al. | |
| 2015/0042588 A1 | 2/2015 | Park et al. | |
| 2015/0128078 A1 | 5/2015 | Oh et al. | |
| 2015/0177945 A1 | 6/2015 | Sengupta et al. | |
| 2015/0212647 A1 | 7/2015 | Kim et al. | |
| 2015/0227166 A1* | 8/2015 | Lee | G06F 1/169 345/173 |
| 2015/0363035 A1 | 12/2015 | Hinckley et al. | |
| 2016/0004384 A1 | 1/2016 | Sato | |
| 2016/0212710 A1 | 7/2016 | Ting et al. | |
| 2016/0239148 A1 | 8/2016 | Lee et al. | |
| 2016/0282988 A1 | 9/2016 | Poupyrev | |
| 2016/0291731 A1* | 10/2016 | Liu | G06F 1/1656 |
| 2017/0046125 A1 | 2/2017 | Gargi et al. | |
| 2017/0115782 A1 | 4/2017 | Hinckley et al. | |
| 2019/0114005 A1 | 4/2019 | Kies et al. | |
| 2019/0114021 A1 | 4/2019 | Oliver et al. | |

* cited by examiner

METHODS OF DIRECT MANIPULATION OF MULTI-LAYERED USER INTERFACES

RELATED APPLICATIONS

This application claims the benefit of priority to U.S. Provisional Patent Application Ser. No. 62/572,453 entitled "Managing And Mapping Multi-Sided Touch" filed on Oct. 14, 2017, to U.S. Provisional Patent Application Ser. No. 62/572,465 entitled "Methods For Integrating Multi-Touch Across Rear/Side Surfaces And A Front Display" filed on Oct. 14, 2017, to U.S. Provisional Patent Application Ser. 62/572,455 entitled "Methods of Direct Manipulation of Multi-Layered User Interfaces" filed on Oct. 14, 2017, to U.S. Provisional Patent Application Ser. 62/572,460 entitled "Methods For Detecting Device Context In Order To Alter Touch Capacitance" filed on Oct. 14, 2017, and to U.S. Provisional Patent Application Ser. No. 62/572,471 entitled "Method And Apparatus To Accommodate Both Wireless Charging And Back Touch Sensing" filed on Oct. 14, 2017. The contents of these documents are incorporated herein by reference.

BACKGROUND

Mobile computing devices may use a wide variety of input methods. In addition to buttons and other physical input devices, mobile computing devices typically include an electronic display capable of detecting the presence and location of the touch within the display area (i.e., a "touchscreen"). Numerous software applications for mobile computing devices make use of touchscreen inputs, and thus touchscreens have dramatically expanded the type and range of possible user interactions with mobile computing devices.

However, touchscreen interactions require the user's focused attention to see a target to touch (e.g., an icon, text, etc.) or a response to the input. Further, increasingly complex software applications may be difficult or cumbersome to control through interactions with a touchscreen. Moreover, many interactions with mobile computing devices require one hand to hold the mobile computing device so that fingers of the other hand may interact with the touchscreen.

SUMMARY

Various embodiments include methods that may be implemented on a processor of a mobile computing device having a one or more touch sensors for managing multilayer controls of the mobile computing device. Various embodiments may include a processor of the mobile computing device receiving an input at a mobile computing device for performing a function with respect to content at the mobile device in which the content at the mobile device is segmented into at least a first command layer having one or more objects and a second command layer having one or more objects, determining whether the received input is associated with a first object of the first command layer or a second object of the second command layer, determining a function to be performed on one of the first or second objects based on whether the first command layer or the second command layer is determined to be associated with the received input, and performing the determined function on the first object or the second object.

In some embodiments, receiving the input at the mobile computing device for performing a function with respect to content at the mobile device may include receiving the input at one of the touch sensors of the mobile computing device for performing a function with respect to content at the mobile device. Some embodiments may further include obtaining a command layer translation table from a memory of the mobile computing device, and determining a touch sensor at which the input was received in which determining the function to be performed on one of the first or second objects may include determining the function associated with the received input and the associated command layer based on the determined touch sensor using the translation table.

In some embodiments, the first command layer may include a first image layer of an image displayed by the mobile device, the second command layer may include a second image layer of the displayed image, and performing the determined function on the first object or the second object may include performing the determined function on an element of the first image layer or on an element of the second image layer.

In some embodiments, the first command layer may include a foreground layer of an image displayed by the mobile device, the second command layer may include a background layer of the displayed image, and performing the determined function on the first object or the second object may include performing the determined function on an element of the foreground layer or on an element of the background layer.

In some embodiments, the first command layer may include a first dimension of an image displayed by the mobile device, the second command layer may include a second dimension of the displayed image, and performing the determined function on the first object or the second object may include performing the determined function on the first dimension of the image or on the second dimension of the image.

In some embodiments, the first command layer may include a first text layer of text displayed by the mobile device, the second command layer may include a second text layer of the displayed text, and performing the determined function on the first object or the second object may include performing the determined function on an element of the first text layer or on an element of the second text layer.

In some embodiments, the first command layer may include a processor-generated image layer of digital objects in an extended reality image displayed by the mobile device, the second command layer may include a real image layer of real objects displayed in the displayed extended reality image, and performing the determined function on the first object or the second object may include performing the determined function on an extended reality image element within the first extended reality image layer or on a real element within the real image layer.

In some embodiments, the first command layer may include a first application executing on the mobile device, the second command layer may include a second application executing on the mobile device, and performing the determined function on the first object or the second object may include sending an instruction to perform the determined function to the first application or the second application.

In some embodiments, the first command layer may include a representation of a first device configured to receive commands from the mobile computing device, the second command layer may include a representation of a second device configured to receive commands from the mobile computing device, and performing the determined function on the first object or the second object may include sending an instruction to perform the determined function to the first device or the second device.

In some embodiments, a first group of the one or more touch sensors disposed substantially on a front of the mobile computing device may be mapped to the first command layer, and a second group of the one or more touch sensors disposed substantially on a back of the mobile computing device may be mapped to the second command layer. In such embodiments, the received input is one of two or more inputs received by the processor at overlapping times from one of the touch sensors of the first group and one of the touch sensors of the second group. In such embodiments, a third group of the one or more touch sensors disposed substantially on a side of the mobile computing device may be mapped to one or more of the first command layer and the second command layer, and in some embodiments, the received input may be one of two or more inputs received by the processor at overlapping times from one of the touch sensors of the third group and a touch sensor from among the first group and the second group.

Further embodiments may include a mobile computing device including one or more touch sensors and a processor coupled to the one or more touch sensors and configured with processor-executable instructions to perform operations of any of the methods summarized above. Further embodiments may include a non-transitory processor-readable storage medium having stored thereon processor-executable instructions configured to cause a processor of a mobile computing device having one or more touch sensors to perform operations of any of the methods summarized above. Further embodiments may include a mobile computing device having one or more touch sensors and means for performing functions of any of the methods summarized above.

BRIEF DESCRIPTION OF THE DRAWINGS

The accompanying drawings, which are incorporated herein and constitute part of this specification, illustrate exemplary embodiments of the invention, and together with the general description given and the detailed description, serve to explain the features herein.

DETAILED DESCRIPTION

Figure 1A:
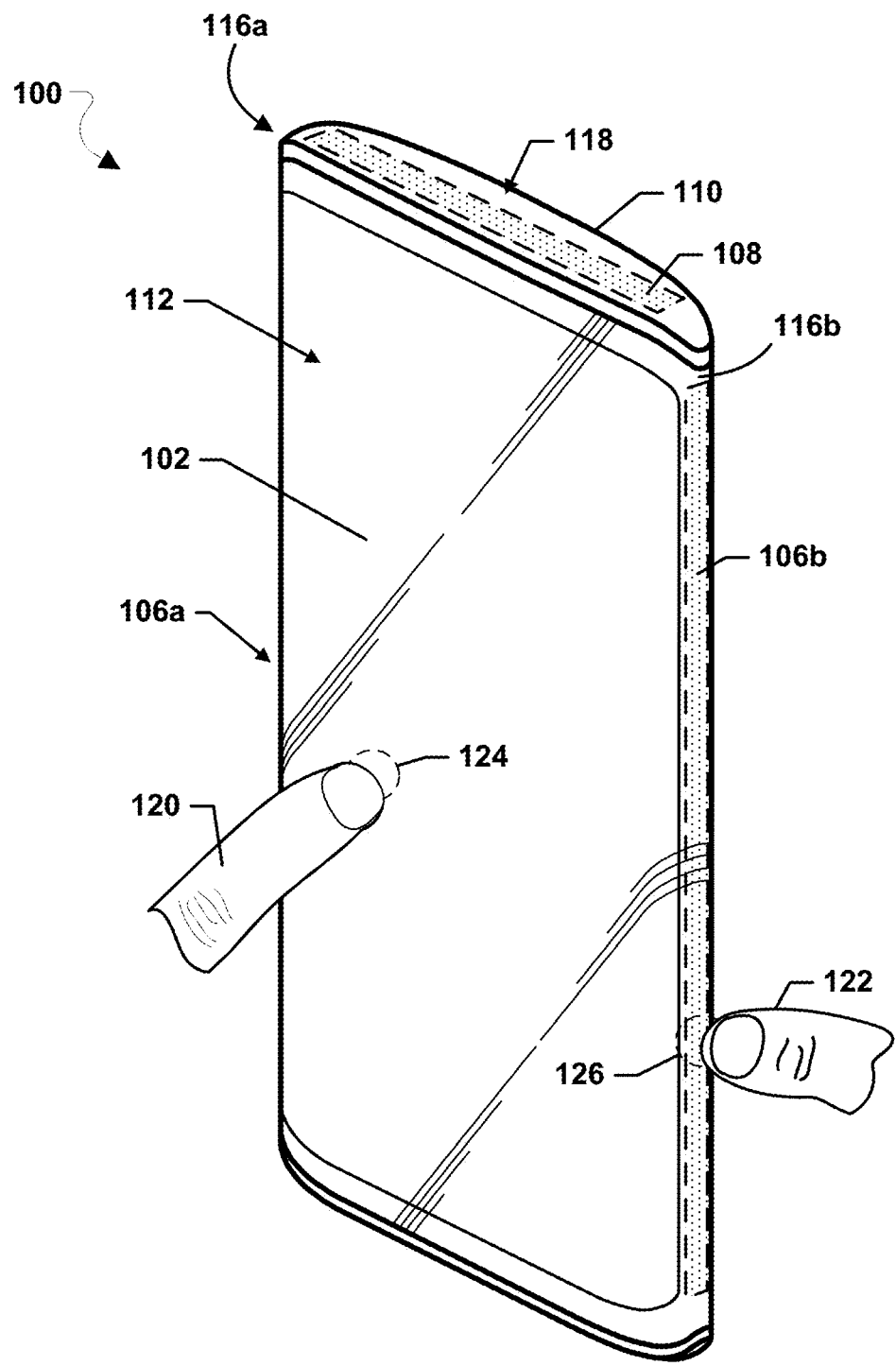
FIG. 1A is a perspective view diagram of user interactions with a mobile computing device having touch sensors.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The term "mobile computing device" is used herein to refer to any one or all of variety of small computing devices, particularly computing devices including touch sensors (e.g., capacitive sensors, pressure touch sensors, touchscreen displays, and other suitable sensors configured detect and localize a user touch on a surface of the device), a programmable processor and memory and circuitry for receiving user inputs. Examples of computing devices for which the various embodiments are particularly useful include smartphones, tablet computing devices configured to be held on the edges by a user, wearable computing devices (including smart glasses, extended reality glasses, and other similar devices), other similar computing platforms, and other similar devices.

Touchscreen interactions require a user's focused attention to see a target to touch (e.g., an icon, text, etc.) or a response to the input. Further, more complex software applications may be difficult or cumbersome to control through interactions with a touchscreen. Moreover, many interactions with mobile computing devices require one hand to hold the mobile computing device so that fingers of the other hand may interact with the touchscreen.

Various embodiments enable a wide range of functionality and operational control of a mobile computing device that includes a plurality of touch sensitive input sensors on surfaces in addition to a touch screen display, such as one or more touch sensors positioned on the back area, the sides, the top edge and the bottom edge of the device in addition to a touch screen display. By correlating detected touches and or gestures on two or more of the mobile computing device touch sensitive input sensors to functions for an executing application, operating state or condition, or other devices under control of the mobile computing device, various embodiments enable greater functionality and a broader range of user input controls that may be implemented with various applications and devices. By relating individual touch sensors to different command layers of input-defined functionality, various embodiments enable mobile computing devices with multiple touch sensors to be configured through applications and operating states to enable expanded user control over multiple elements or dimensions of content, thus improving the user experience. Various embodiments improve the operation of mobile computing devices by enabling two (or more) different objects or sets of objects to be independently controlled, commanded, or manipulated without changing selections or interface menus, with control inputs that may be entered via separate user interfaces at any time including the same time (e.g., simultaneously). Put another way, various embodiments improve the operation of mobile computing devices by enabling the processing of different commands for controlling different objects or set of objects independently including but not limited to simultaneously or in overlapping times. This contrasts with conventional mobile computing devices, in which inputs to touch sensors are mapped into a single command layer, and two different objects cannot be independently controlled, commanded, or manipulated simultaneously or at overlapping times.

Figure 5A:
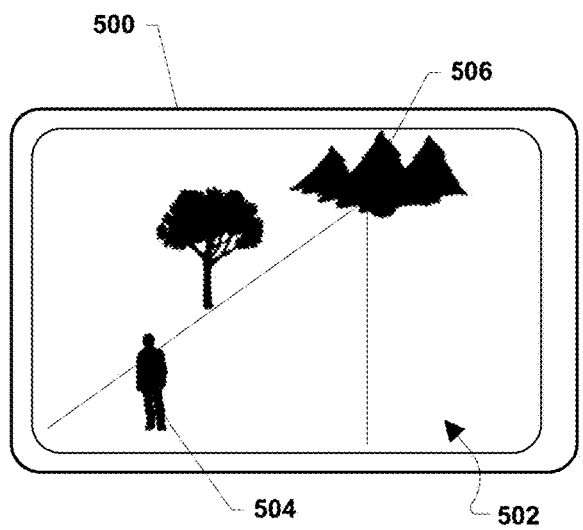
FIG. 5A illustrates a mobile computing device displaying an image having a foreground image layer and a background image layer according to various embodiments.
Figure 5B:
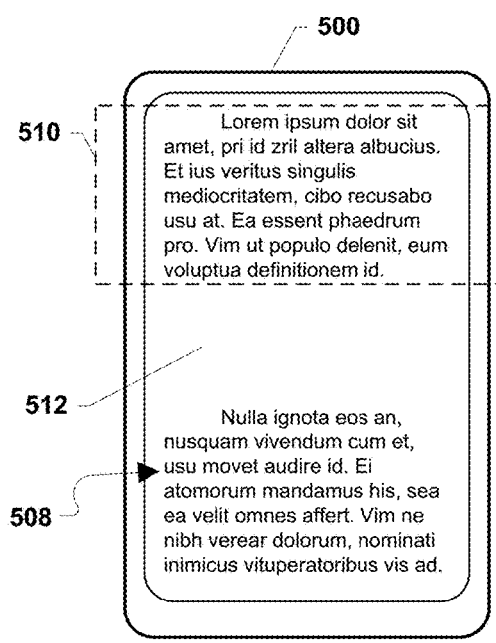
FIG. 5B illustrates a mobile computing device displaying text having a first text layer and a second text layer according to various embodiments.
Figure 5C:
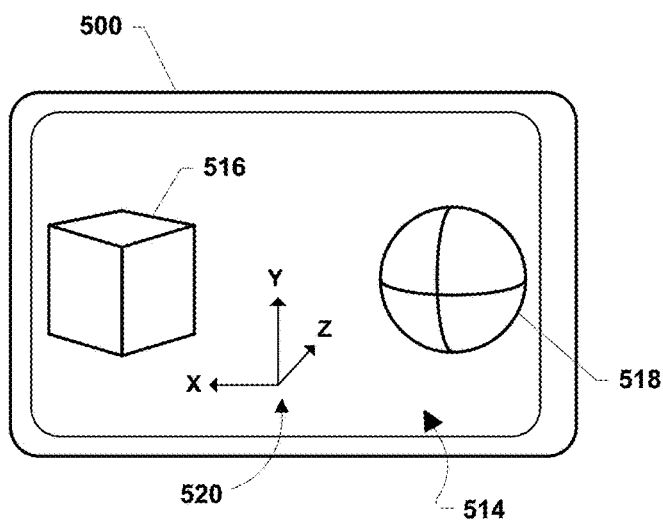
FIG. 5C illustrates a mobile computing device displaying a multidimensional image.
Figure 5D:
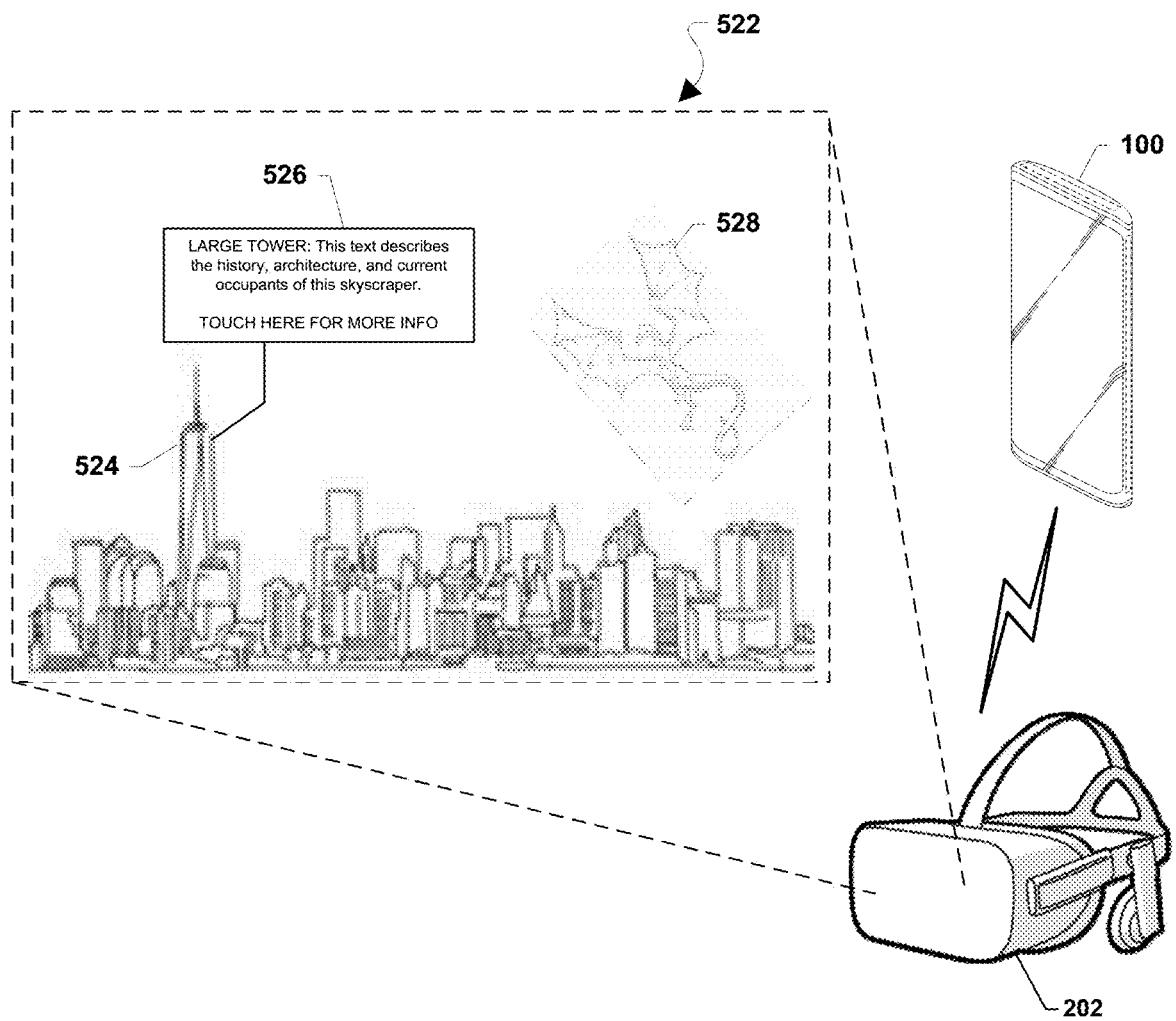
FIG. 5D illustrates a mobile computing device in communication with an audiovisual device displaying an extended reality image according to various embodiments.
Figure 5E:
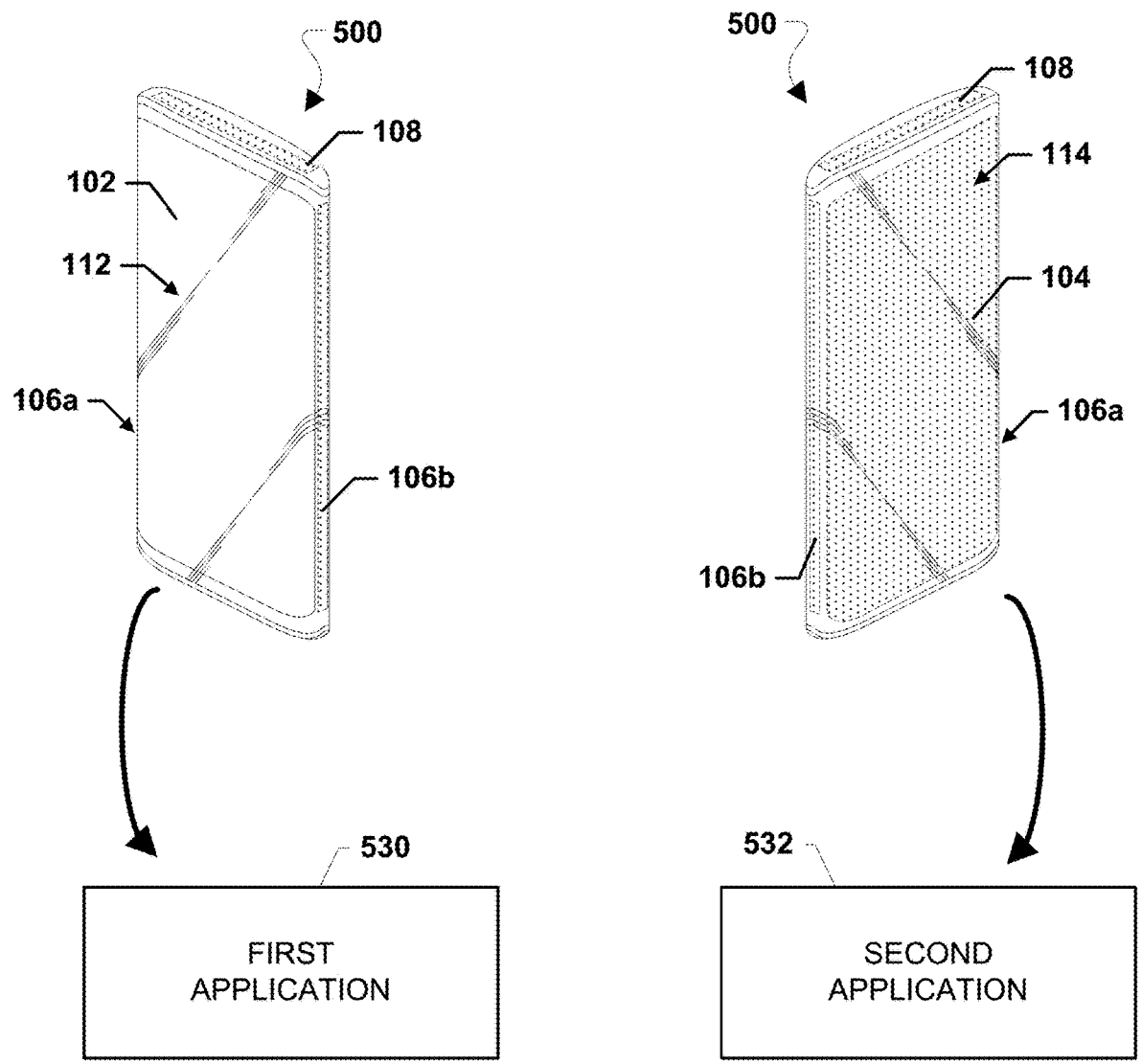
FIG. 5E illustrates a mobile computing device configured to control a plurality of applications executing on the mobile computing device according to various embodiments.
Figure 5F:
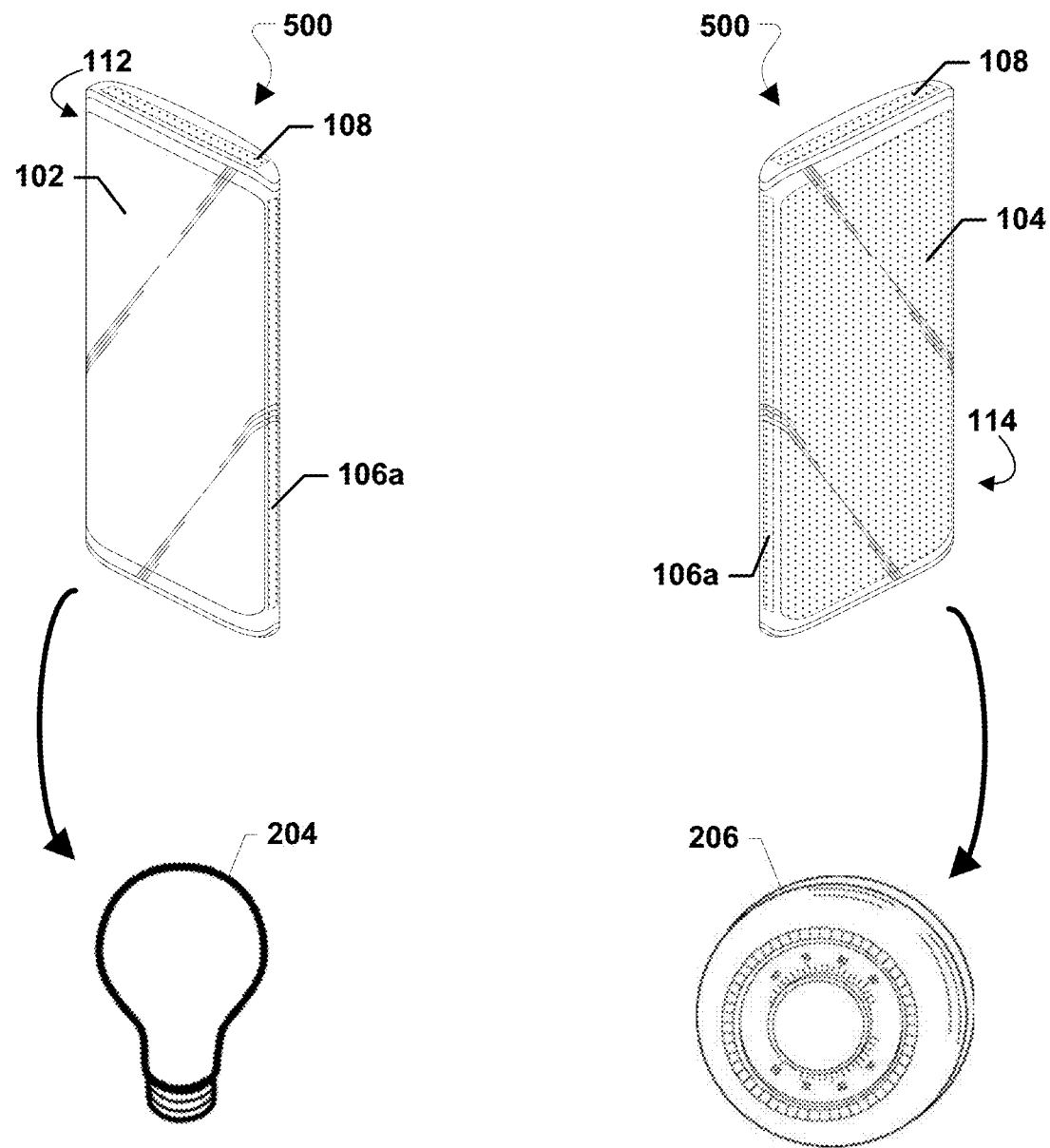
FIG. 5F illustrates a mobile computing device configured to communicate with and/or control a plurality of devices according to various embodiments.

As an example, some embodiments may enable a user to individually and independently control (e.g., move, resize, rotate, edit, etc.) a foreground image or image object (or multiple images/objects) and a background image/image object in an application displaying such images (e.g., an imaging editing application) by touching two (or more) touch sensors (e.g., a front-side sensor and a backside sensor) of a mobile computing device, including but not limited to simultaneous or overlapping timed touches, as illustrated in FIGS. 5A and 5C. As another example, some embodiments may enable a user to individually and independently manipulate (e.g., move, resize, edit, highlight, etc.) two text layers within a text document, such as by entering touch gestures for controlling a first text layer (e.g., a main document text) on a front-side touch sensor and entering touch gestures for controlling a second text layer (e.g., comments, highlight, footnotes, citations, highlights, background, etc.) on a backside touch sensor as illustrated in FIG. 5B. As another example, an extended reality application executing on a mobile computing device having multiple touch sensors and implementing various embodiments may enable a user to control a real image layer using one touch sensor (e.g., a front-side sensor) while also (including but not limited to at overlapping times) controlling extended reality image elements (e.g., information balloons, animations, etc.) using another touch sensor (e.g., a rear-side sensor) as illustrated in FIG. 5D. As another example, a mobile computing device having multiple touch sensors and implementing various embodiments may enable a user to control two applications individually and independently by entering touch gestures on a front-side sensor to control one application while entering touch gestures on a back-side sensor to control another application, as illustrated in FIG. 5E. As another example, a mobile computing device having multiple touch sensors and implementing various embodiments may enable a user to control two other devices individually and independently via separate user interfaces by entering touch gestures on a front-side sensor to control one device, such as an Internet of Things (IoT) lightbulb, while entering touch gestures on a back-side sensor to control another device, such as an IoT thermostat, as illustrated in FIG. 5F. In each of these examples, user configuration settings and applications executing on the mobile computing device may configure or define command layers including specific functionality mapped to particular touch gestures and associated with particular touch sensors to provide developers and users with flexibility making use of multiple touch sensors to enable multi-dimensional controls over content, functionality and other devices.

Figure 1B:
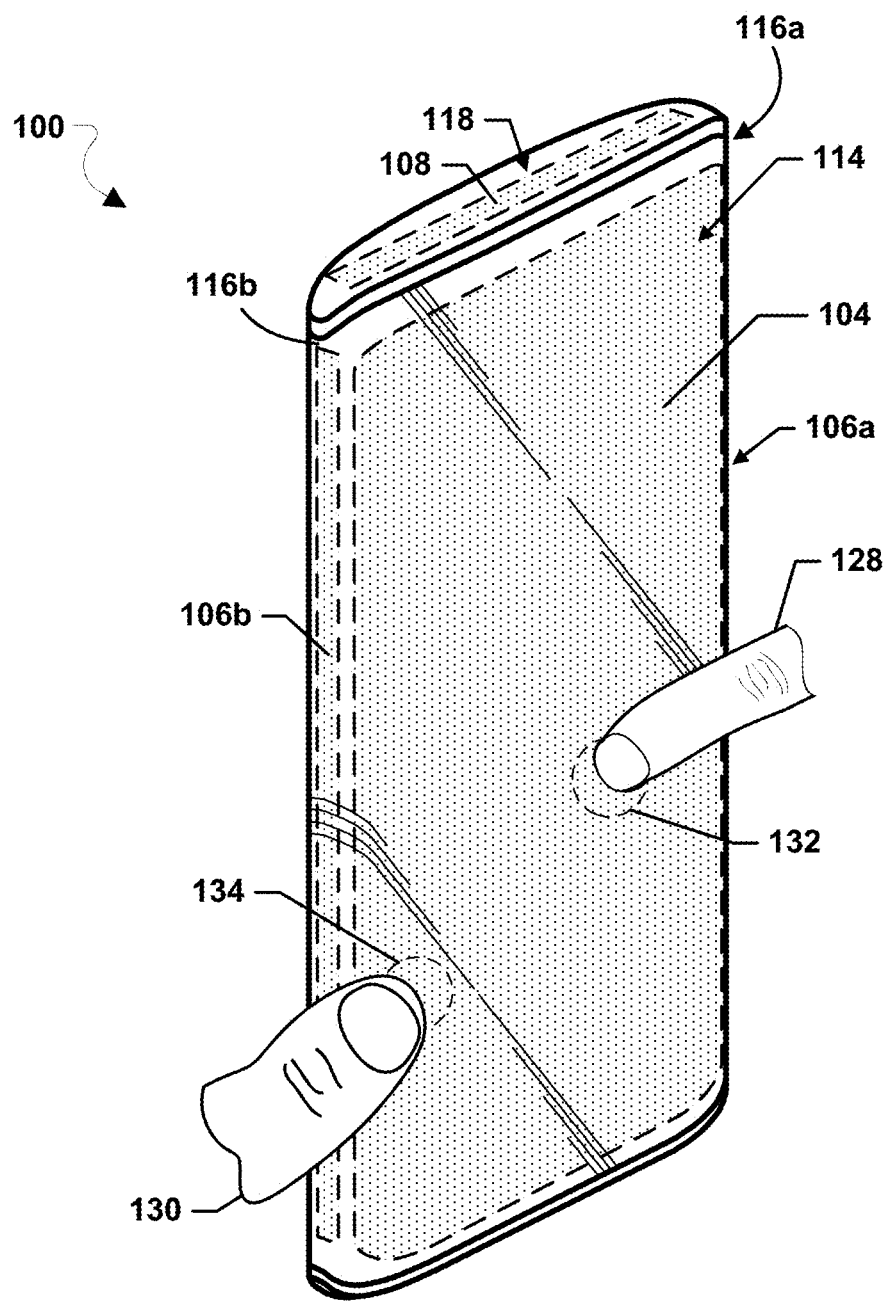
FIG. 1B is a perspective view diagram of user interactions with a mobile computing device having touch sensors.

Various embodiments may be implemented within a variety of mobile computing devices, an example of which is illustrated in FIGS. 1A and 1B. With reference to FIGS. 1A and 1B, a mobile computing device 100 may include a body 110 having a front area 112, a rear area 114, two sides 116a, 116b between the front area 112 and the rear area 114, and a top area 118 between the front area 112 and the rear area 114. The front area 112 may include a touch sensor 102 that may be incorporated within a display in the form of a touchscreen display. The rear area 114 may include a touch sensor 104. One or both of the sides 116a, 116b may include a touch sensor 106a, 106b. The top area 118 may include a touch sensor 108. Thus, the body 110 of the mobile computing device 100 may include one or more touch sensors on the front area 112, the rear area 114, the one or more sides 116a, 116b, and the top area 118. The touch sensors 102, 104, 106a, 106b, 108 may be configured to receive an input 124, 132 from a user's finger 120, 128 and/or an input 126, 134 from a user's thumb 122, 130. In some embodiments, each of the touch sensors 102, 104, 106a, 106b, 108 may include one or more touch sensors.

A touch sensor 102, 104, 106a, 106b, 108 is configured to detect a change in capacitance at a location where the sensor is touched (or nearly touched) by an object, particularly be a user's hand, thumb or fingers. While finger and thumb touches 124, 126, 132, 134 on the touch sensors 102, 104, 106a, 106b, 108 are illustrated in FIGS. 1A and 1B, the sensors may detect a change in capacitance from any contact with a user's body, such as contact with a user's palm or face, touches by a stylus or another similar input device, and the like. In some embodiments, a touch sensor 102, 104, 106a, 106b, 108 may detect two or more contact locations (e.g., a multi-touch sensor). In some embodiments, a touch sensor 102, 104, 106a, 106b, 108 may detect a pressure of one or more contacts. Outputs from the various touch sensors 102, 104, 106a, 106b, 108 may be provided to a processor (e.g., a processor that is included within or coupled to the touch sensors 102, 104, 106a, 106b, 108) that is configured to determine locations of touches that may be treated as user inputs to the mobile computing device 100.

In some embodiments, a processor of the mobile computing device 100 and/or of the touch sensors 102, 104, 106a, 106b, 108 may determine that one or more contacts have a duration that is less than, equal to, or greater than a threshold period of time. In some embodiments, such a processor may determine characteristics of the contact or contacts on one or more of the touch sensors 102, 104, 106a, 106b, 108. For example, the contact characteristics may include a duration of contact, a number of contact points, a size of the contact point(s), a sequence of contacts, a pattern of simultaneous contacts, and a level of pressure or force applied during the contact(s). Contact associated with a user gripping the mobile computing device may be determined from various inputs, including a combination of concurrent contacts at multiple locations of the touch sensors 102, 104, 106a, 106b, 108, which may be persistent for at least a minimum duration. In some embodiments, the processor of the mobile computing device may distinguish between a tap, a double tap, a long press, a sweep or flick, a drag, a predefined gesture including a plurality of touch and/or pressure inputs, a grip, other contacts, or any combination thereof. A predefined gesture may be a set or sequence of one or more contacts with the touch sensors 102, 104, 106a, 106b, 108. The predefined gesture may be configured by a user, established by an application on the mobile computing device, or may be provided as a factory-installed default. In some embodiments, the touch sensors 102, 104, 106a, 106b, 108 may be configured to detect a proximity or near-contact (e.g., a "hover") by a user's finger or thumb prior to or without physical contact.

While touch sensors 102, 104, 106a, 106b, 108 are discussed herein generally in terms of touch sensors that detect touches based on changes in capacitance, such sensors are used merely as an example of one type of input sensor suitable for use with the various embodiments. Other types of input sensors, such as resistive-sensing input sensors, infrared sensing input sensors, resistive force sensors, etc., may be used in various embodiments.

Figure 2:
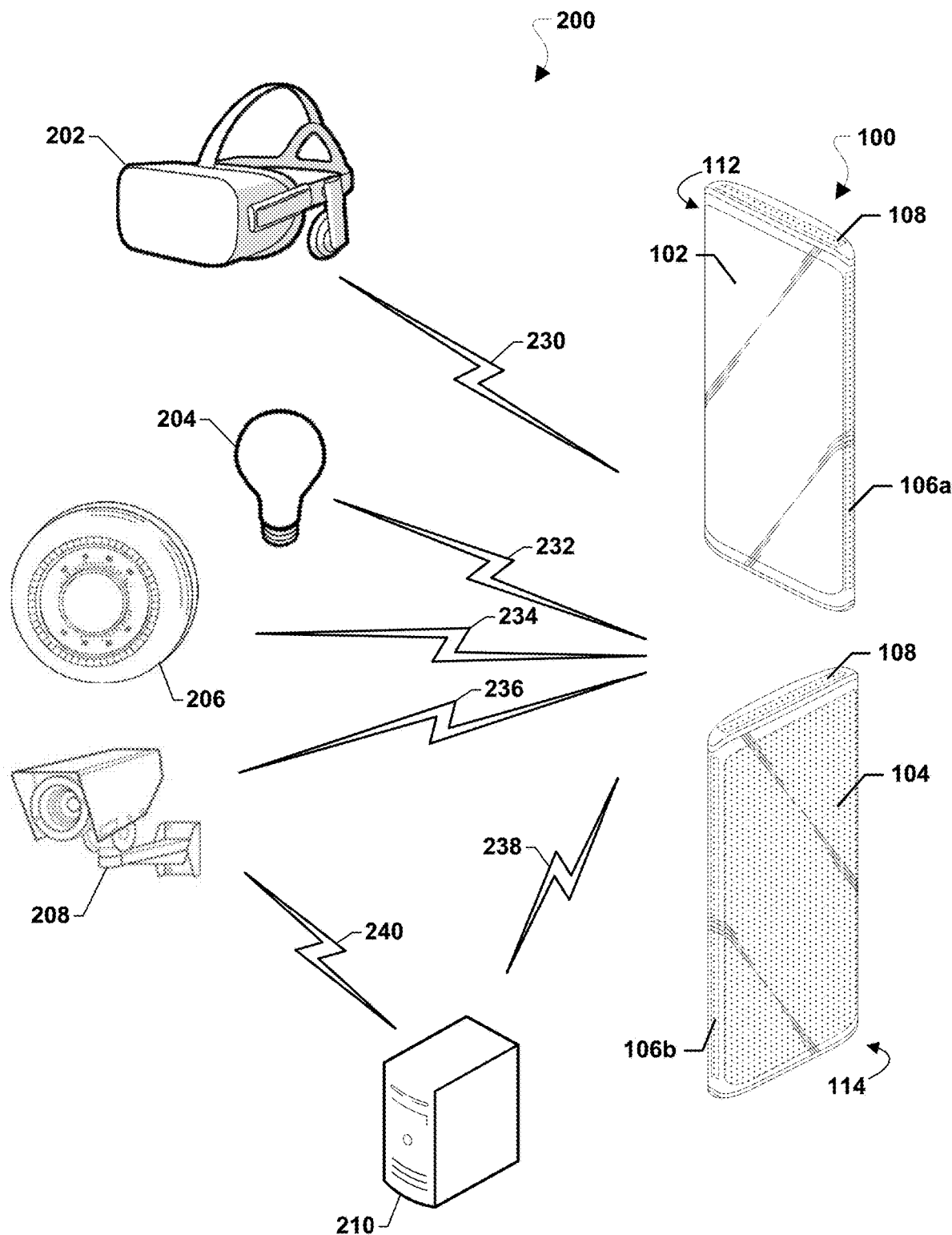
FIG. 2 is a system block diagram of a communication system suitable for use with various embodiments.

Various embodiments may be implemented within a variety of communication systems 200, an example of which is illustrated in FIG. 2. With reference to FIGS. 1A-2, the communication system 200 may include the mobile computing device 100 and one or more other devices, for example, an audiovisual device 202, one or more Internet of Things (IoT) devices, such as a smart light bulb or smart lighting system 204, a smart thermostat 206, an IoT security camera 208, and an IoT hub device 210.

The mobile computing device 100 may communicate with one or more of the other devices 202-210 over wired or wireless communication links 230-238. In some embodiments, the IoT devices 204-210 may communicate with each other via one or more wireless communication links. In some embodiments, the mobile computing device 100 may communicate with one or more of the IoT devices 204-208 via the IoT hub device 210. When implemented as wireless communication links, the communication links 230-238 may include a plurality of carrier signals, frequencies, or frequency bands, each of which may include a plurality of logical channels. The wireless communication links 230-238 may utilize one or more radio access technologies (RATs). Examples of RATs that may be used in a wireless communication link include 3GPP Long Term Evolution (LTE), 3G, 4G, 5G, Global System for Mobility (GSM), Code Division Multiple Access (CDMA), Wideband Code Division Multiple Access (WCDMA), Worldwide Interoperability for Microwave Access (WiMAX), Time Division Multiple Access (TDMA), and other mobile telephony communication technologies cellular RATs. Further examples of RATs that may be used in one or more of the various wireless communication links within the communication system 100 include medium range protocols such as Wi-Fi, LTE-U, LTE-Direct, LAA, MuLTEfire, and relatively short range RATs such as ZigBee, Bluetooth, and Bluetooth Low Energy (LE).

In various embodiments, a processor of the mobile computing device 100 may be configured to communicate with and/or control (e.g., send information to, receive information from, and/or send commands to) the audiovisual device 202 and the IoT devices 204-210 as further described below.

Figure 3:
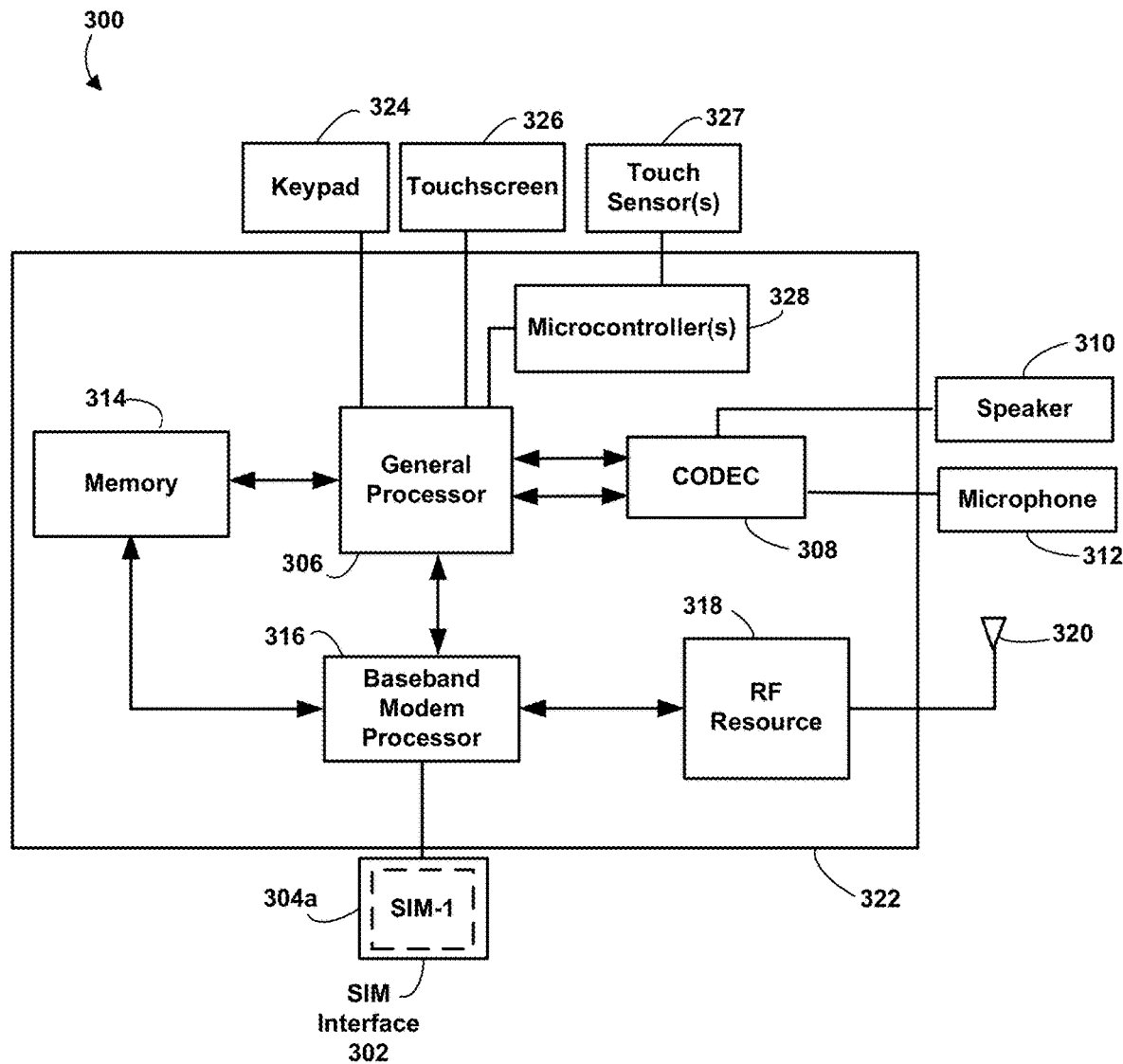
FIG. 3 is a component block diagram of a mobile computing device suitable for implementing various embodiments.

FIG. 3 is a functional block diagram of an example mobile computing device 300 that is suitable for implementing various embodiments. With reference to FIGS. 1A-3, the mobile computing device 300 may be similar to the mobile computing device 100. For example, the mobile computing device 300 may be a multi-SIM computing device, such as a multiple SIM multiple standby (MSMS) computing device. The mobile computing device 300 may include at least one subscriber identity module (SIM) interface 302, which may receive a first SIM ("SIM-1") 304a that is associated with a first subscription. In some embodiments, the at least one SIM interface 302 may be implemented as multiple SIM interfaces 302, which may receive at least a second that is associated with at least a second subscription.

A SIM in various embodiments may be a Universal Integrated Circuit Card (UICC) that is configured with SIM and/or universal SIM (USIM) applications, enabling access to a variety of different networks. The UICC may also provide storage for a phone book and other applications. Alternatively, in a code division multiple access (CDMA) network, a SIM may be a UICC removable user identity module (R-UIM) or a CDMA subscriber identity module (CSIM) on a card.

Each SIM 304a may have a CPU, ROM, RAM, EEPROM and I/O circuits. One or more of the first SIM 304a and any additional SIMs used in various embodiments may contain user account information, an international mobile station identifier (IMSI), a set of SIM application toolkit (SAT) commands and storage space for phone book contacts. One or more of the first SIM 304a and any additional SIMs may further store home identifiers (e.g., a System Identification Number (SID)/Network Identification Number (NID) pair, a Home PLMN (HPLMN) code, etc.) to indicate the SIM network operator provider. An Integrated Circuit Card Identity (ICCID) SIM serial number may be printed on one or more SIM 304a for identification. In some embodiments, additional SIMs may be provided for use on the mobile computing device 300 through a virtual SIM (VSIM) application (not shown). For example, the VSIM application may implement remote SIMs on the mobile computing device 300 by provisioning corresponding SIM profiles.

The mobile computing device 300 may include at least one controller, such as a general-purpose processor 306, which may be coupled to a coder/decoder (CODEC) 308. The CODEC 308 may in turn be coupled to a speaker 310 and a microphone 312. The general-purpose processor 306 may also be coupled to at least one memory 314. The memory 314 may be a non-transitory tangible computer readable storage medium that stores processor-executable instructions. For example, the instructions may include routing communication data relating to a subscription though the transmit chain and receive chain of a corresponding baseband-RF resource chain. The memory 314 may store operating system (OS), as well as user application software and executable instructions. The general-purpose processor 306 and memory 314 may each be coupled to at least one baseband-modem processor 316. Each SIM 304a in the mobile computing device 300 may be associated with a baseband-RF resource chain that includes at least one baseband-modem processor 316 and at least one radio frequency (RF) resource 318.

The RF resource 318 may include receiver and transmitter circuitry coupled to at least one antenna 320 and configured to perform transmit/receive functions for the wireless services associated with each SIM 304a of the computing device 300. The RF resource 318 may implement separate transmit and receive functionalities, or may include a transceiver that combines transmitter and receiver functions. The RF resource 318 may be configured to support multiple radio access technologies/wireless networks that operate according to different wireless communication protocols. The RF resource 318 may include or provide connections to different sets of amplifiers, digital to analog converters, analog to digital converters, filters, voltage controlled oscillators, etc. Multiple antennas 320 and/or receive blocks may be coupled to the RF resource 318 to facilitate multimode communication with various combinations of antenna and receiver/transmitter frequencies and protocols (e.g., LTE, WiFi, Bluetooth and/or the like).

The baseband-modem processor of a mobile computing device 300 may be configured to execute software including at least one modem stack associated with at least one SIM. SIMs and associated modem stacks may be configured to support a variety of communication services that fulfill different user requirements. Further, a particular SIM may be provisioned with information to execute different signaling procedures for accessing a domain of the core network associated with these services and for handling data thereof.

In some embodiments, the general-purpose processor 306, memory 314, baseband-modem processor 316, and RF resource 318 may be included in a system-on-chip device 322. The SIMs 304a and their corresponding interface(s) 302 may be external to the system-on-chip device 322. Further, various input and output devices may be coupled to components of the system-on-chip device 322, such as interfaces or controllers. Example user input components suitable for use in the mobile computing device 300 may include, but are not limited to, a keypad 324, a touchscreen 326, such as a beveled edge touchscreen, and one or more touch sensors 327. The one or more touch sensors 327 may be similar to the touch sensors 102, 104, 106a, 106b, 108 described with reference to FIGS. 1A-2.

In various embodiments, the one or more touch sensors 327 may be connected to one or more microcontrollers 328, and the microcontroller(s) 328 may be connected to the general-purpose processor 306. In various embodiments, the microcontroller(s) 328 may be configured with microcontroller-executable instructions to perform operations to determine whether a contact is occurring on the one or more touch sensors 327. In various embodiments, the microcontroller(s) 328 may be configured with microcontroller-executable instructions to perform operations to determine the location of the contact. In various embodiments, the microcontroller(s) 328 may be configured with microcontroller-executable instructions to perform operations to send an indication of the contact including contact parameter information to the general-purpose processor 306. In various embodiments, the general-purpose processor 306 may receive an indication of a contact from the microcontroller(s) 328.

Figure 4A:
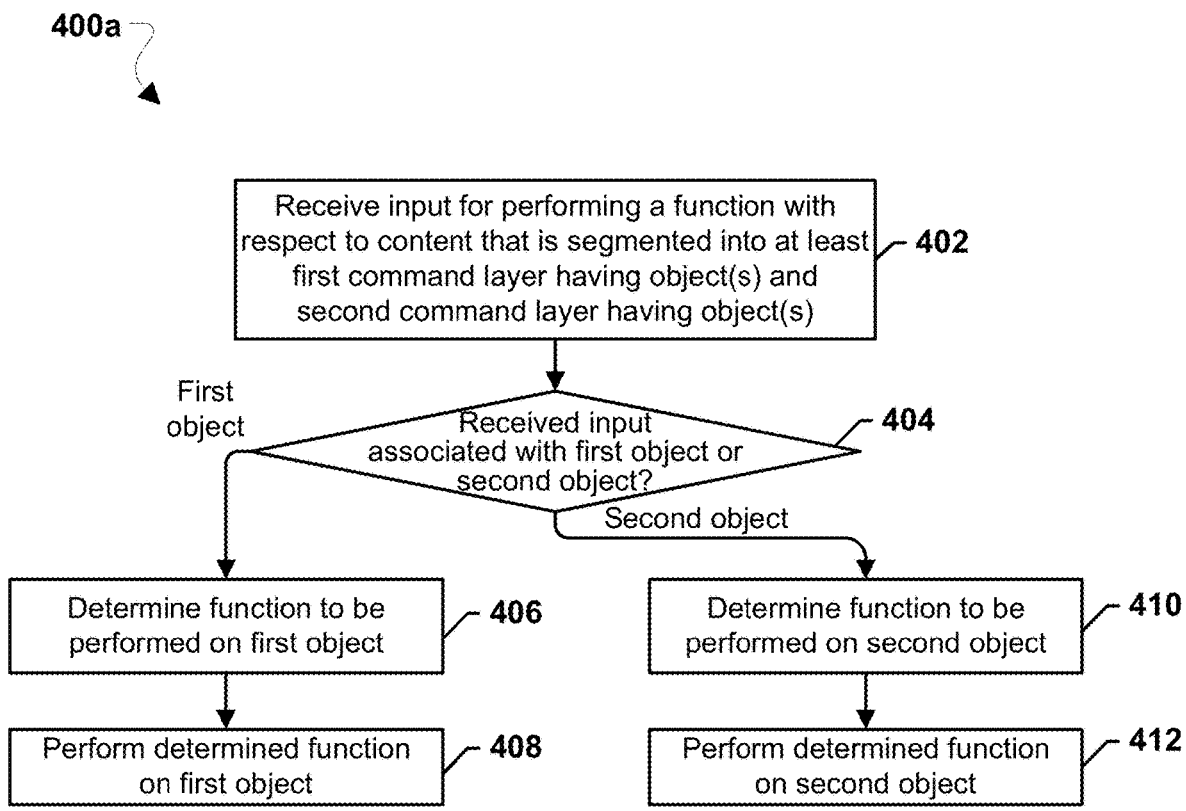
FIG. 4A is a process flow diagram illustrating a method of managing multisensor inputs received in sequence according to various embodiments.

FIG. 4A is a process flow diagram illustrating a method 400a of managing multisensor inputs received in sequence according to various embodiments. With reference to FIGS. 1A-4A, the method 400a may be implemented in hardware components and/or software components of the mobile computing device (e.g., 100, 300), the operation of which may be controlled by one or more processors (e.g., the general-purpose processor 306) of the mobile computing device.

In block 402, the processor of a mobile computing device may receive an input (e.g., a user input) relating to performing a function with respect to content that is segmented into at least a first command layer having one or more objects and a second command layer having one or more objects. In one embodiment, the content may be segmented into multiple command layers, each layer having one or more controllable objects. In various embodiments, the processor may receive the input from one or more touch sensors of the mobile computing device. In some examples, each command layer of the multiple command layers may be associated with a specific set of commands that cause one or more operations to be performed with respect to the one or more objects associated with the command layer.

In determination block 404, the processor may determine whether the received input is associated with a first object of the first command layer or a second object of the second command layer. In some embodiments, the processor may generate and/or determine one or more associations of an input with the first object, the first command layer, the second object, and/or the second command layer. In some embodiments, the determination may be performed according one or more of one or more association tables defining associations between inputs and commands or functions associated with each command layer. In some embodiments, each input may be defined according to various input characteristics such as specific sensors from which the input is received, shape of input, magnitude of input (e.g., force, size, velocity) or other similar characteristics that define an input. In some embodiments, the determination may be performed using a machine learning technique that determines characteristics of the input and associates such characteristics with a specific command associated with a command layer or an object of the command layer. In some embodiments, a combination of the methods described below may be used to determine an association of the received input and the command layer or an object associated with the command layer.

As an example, the processor of the mobile device may receive an input at one of the touch sensors of the mobile computing device and associate the input to a function to perform on a particular portion of content (e.g., a first layer of text, images, video, audio, etc.) processed and/or rendered on the mobile device. The association of various objects to various command layers to various touch sensors may be explained using the example of a mobile computing device executing an extended reality application in which the display renders application-generated graphics onto of a display of an image captured by a camera image (see FIG. 5D). In this example, the processor of the mobile computing device may receive a user input on the front side touch sensor 102 for manipulating (e.g., zooming, dimming, panning, etc.) the displayed camera image (e.g., displayed on an extended reality head-mounted display), and receive a user input for manipulating (e.g., resizing, moving, rotating, etc.) the augmented reality image or object on a backside touch sensor 104. The processor may process such user inputs by determining that the input received at the front side touch sensor 102 is associated with a first command layer that controls the camera image display and determining that the received input (e.g., a touch gesture like a tap, swipe, etc.) is associated with a function that is associated with (i.e., to be performed by) the first command layer that controls the camera image (e.g., a city scape as illustrated in FIG. 5D). Similarly, the processor may receive an input on the backside touch sensor 104 and determine that the input received on that touch sensor 104 is associated with the second command layer of functionality that controls application-generated augmented reality images or objects. The processor may determine that the input received on the backside touch sensor 104 is associated with an image object (e.g., an image of a dragon 528 as illustrated in FIG. 5D) that is associated with or controlled by the second command layer. As a further example, the processor may receive an input on another touch sensor 106a, 106b, or 108 and determine whether such an input is associated with the first command layer (the real image) or the second command layer (the augmented reality object), and use such inputs to further control the corresponding image or visual object. Alternatively, the processor may determine that the received input on the other touch sensor 106a, 106b, or 108 is associated with a third object that is controlled by a third command layer, such as presenting an information balloon 526 on the displayed image as illustrated in FIG. 5D. This extended reality application is but one example of how various embodiments enable users to execute multi-dimensional controls over applications, objects and devices on mobile computing devices featuring multiple touch sensors as described herein.

In response to determining that the received input is associated with a first object of the first command layer (i.e., determination block 404="First object"), the processor may determine a function to be performed on the first object in block 406. In some embodiments, the processor may generate and/or determine one or more function(s) to be performed on object(s) and/or command layer(s) according to one or more of one or more association tables defining associations between inputs and commands associated with the first command layer (for example, the command layer translation table 600, further described below). In some examples, the processor may define the received input according to one or more input characteristics, such as specific sensors from which the input is received (e.g., the touch sensor 102, 104, 106a, 106b 108), a shape of the input, a magnitude of input (e.g., force, size, velocity), or another similar characteristic that defines the input. In some embodiments, the processor may use a machine learning technique to determine characteristics of the input and to associate such characteristics with a specific function associated with the first command layer.

In block 408, the processor may perform the determined function on the first object.

In response to determining that the received input is associated with a second object of the second command layer (i.e., determination block 404="Second object"), the processor may determine a function to be performed on the second object in block 410. In some embodiments, the processor may generate and/or determine one or more function(s) to be performed on object(s) and/or command layer(s) according to one or more association tables defining associations between inputs and commands associated with the second command layer. In some embodiments, the processor may define the received input according to one or more input characteristics such as specific sensors from which the input is received (e.g., the touch sensor 102, 104, 106a, 106b 108), a shape of the input, a magnitude of input (e.g., force, size, velocity), or another similar characteristic that defines the input. In some embodiments, the processor may use a machine learning technique to determine characteristics of the input and to associate such characteristics with a specific function associated with the second command layer.

In block 412, the processor may perform the determined function on the second object.

The operations of the method 400 may be applied to a wide range of applications and implementations executing on a mobile computing device featuring multiple touch sensors. Some non-limiting examples of such applications and implementations are described in the following paragraphs.

In some embodiments, the processor may obtain a command layer translation table from a memory of the mobile computing device, determine a touch sensor at which the input was received, and use the command layer translation table associated with the determined touch sensor to identify a function that should be performed. Said another way, the processor may determine the function associated with the received user input and the associated command layer based on the determined touch sensor using the translation table as further described below with reference to FIG. 6.

In some embodiments, the processor of the mobile computing device may map a first group of the one or more touch sensors disposed substantially on a front of the mobile computing device (e.g., the touch sensor 102, which may include one or more sensors) to the first command layer, and map a second group of the one or more touch sensors disposed substantially on a back of the mobile computing device (e.g., touch sensor 104 which may include one or more sensors) to the second command layer. In some embodiments, the processor may map a third group of the one or more touch sensors disposed substantially on a side of the mobile computing device (e.g., the touch sensors 106a, 106b, 108, which may each include one or more sensors) to one or more of the first command layer and the second command layer.

In some embodiments, the first command layer may include a first text layer of text displayed by the mobile device, and the second command layer may include a second text layer of the displayed text as described below with reference to FIG. 5B.

In some embodiments, the first command layer may include a first image layer of an image displayed by the mobile device, and the second command layer may include a second image layer of the displayed image. For example, the first command layer may include a foreground layer of an image displayed by the mobile device, and the second command layer may include a background layer of the displayed image as described below with reference to FIG. 5A. As another example, the first command layer may include a first dimension of an image displayed by the mobile device, and the second command layer may include a second dimension of the displayed image as described below with reference to FIG. 5C.

In some embodiments, the first command layer may include a processor-generated image layer of digital objects in an extended reality image displayed by the mobile device, and the second command layer may include a real image layer of real objects displayed in the displayed extended reality image, as described below with reference to FIG. 5D.

In some embodiments, the first command layer may include a first application executing on the mobile device, and the second command layer may include a second application executing on the mobile device as described below with reference to FIG. 5E.

In some examples, the first command layer associated with a first touch sensor (e.g., a front-side sensor) may include commands that may be communicated to a first device configured to receive commands from the mobile computing device, and the second command layer associated with a second touch sensor (e.g., a back-side sensor) may include commands that may be communicated to a second device configured to receive commands from the mobile computing device as described below with reference to FIG. 5F.

Figure 4B:
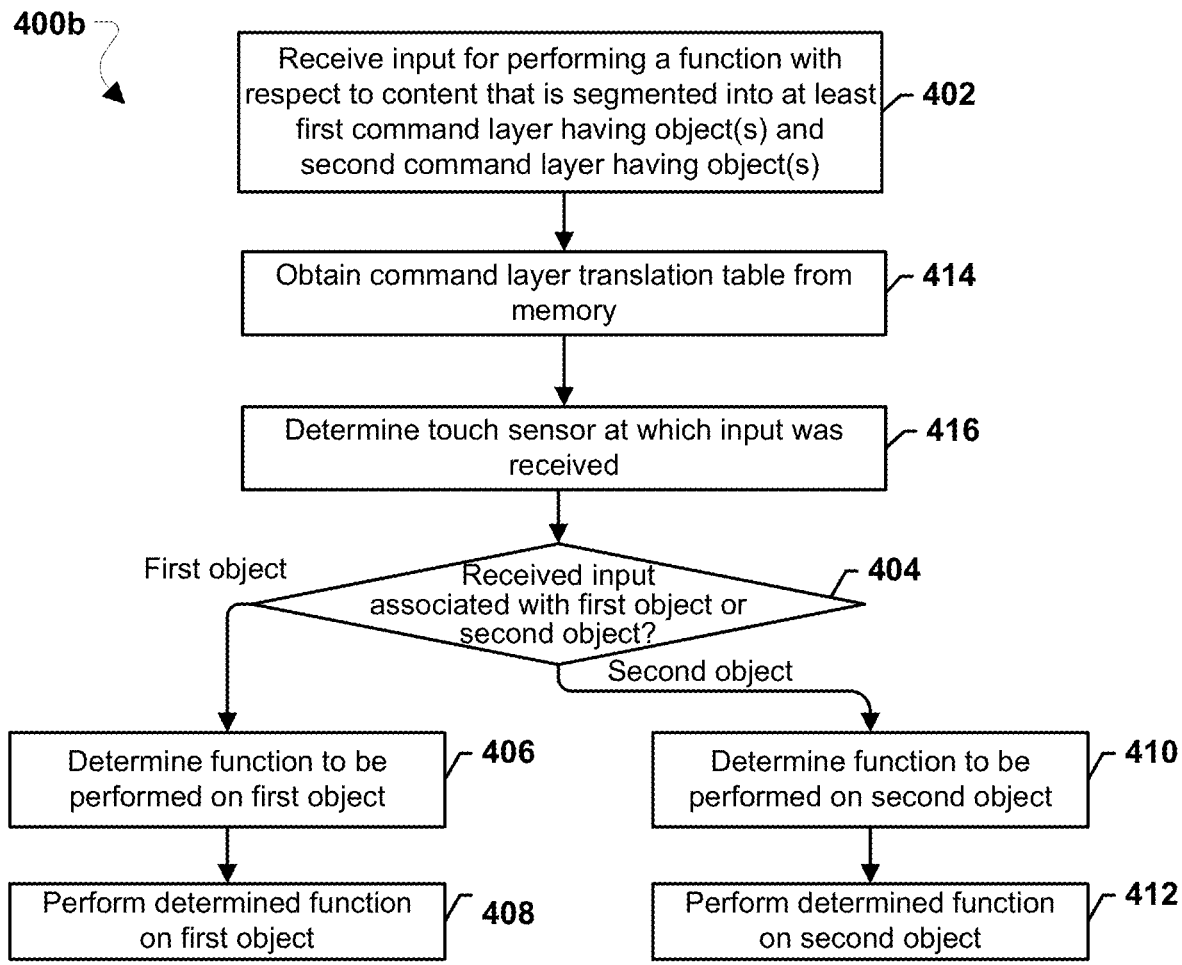
FIG. 4B is a process flow diagram illustrating a method of managing multisensor inputs received in sequence according to various embodiments.

FIG. 4B is a process flow diagram illustrating a method 400b of managing multisensor inputs received in sequence according to various embodiments. With reference to FIGS. 1A-4B, the method 400b may be implemented in hardware components and/or software components of the mobile computing device (e.g., 100, 300), the operation of which may be controlled by one or more processors (e.g., the general-purpose processor 306) of the mobile computing device. In blocks 402-412, the processor may perform operations of like-numbered blocks of the method 400a as described with reference to FIG. 4A.

In block 414, the processor may obtain a command layer translation table from a memory of the mobile computing device. In some embodiments, the processor may obtain the one or more translation tables from an application running on the mobile computing device. In some embodiments, the processor may obtain the one or more translation tables from an operating system of the mobile computing device, from memory (e.g., non-volatile memory), or from another software and/or hardware element of the mobile computing device other than the application running on the mobile computing device. In some embodiments, the translation table may be a static translation table. In some embodiments, the translation table may be a dynamic translation table that the processor may generate based on dynamic, real-time, or runtime information. For example, the processor may generate a dynamic translation table based on or more conditions or states of the mobile computing device, an application running on the mobile computing device, an identification of one or more other devices (e.g., the audiovisual device 202, the smart thermostat 206, the IoT security camera 208, the IoT hub device 210) in communication with the mobile computing device, and other suitable dynamic or real-time information. As another example, the processor may generate one or more dynamic translation tables in response to user inputs, such as in a calibration, training or configuration routine in which the user provides inputs or commands that enable the processor to correlate particular touch sensors and/or user inputs and/or applications to user-selected command layer(s) and functionality. The use of command layer translation tables is further described below.

In block 416, the processor may determine a touch sensor at which the input was received. For example, the processor may determine that the input was received at one of the touch sensors 102, 104, 106a, 106b, 108, and 327.

In determination block 404, the processor may determine whether the received input is associated with a first object of the first command layer or a second object of the second command layer based in part one or more characteristics of the input. In one example, the determination of block 404 may be based on at least the touch sensor on which the input was received. In one example, the determination may be based on a command layer translation table. The processor may then perform the operations in blocks 406-412 as described with reference to FIG. 4A.

Figure 4C:
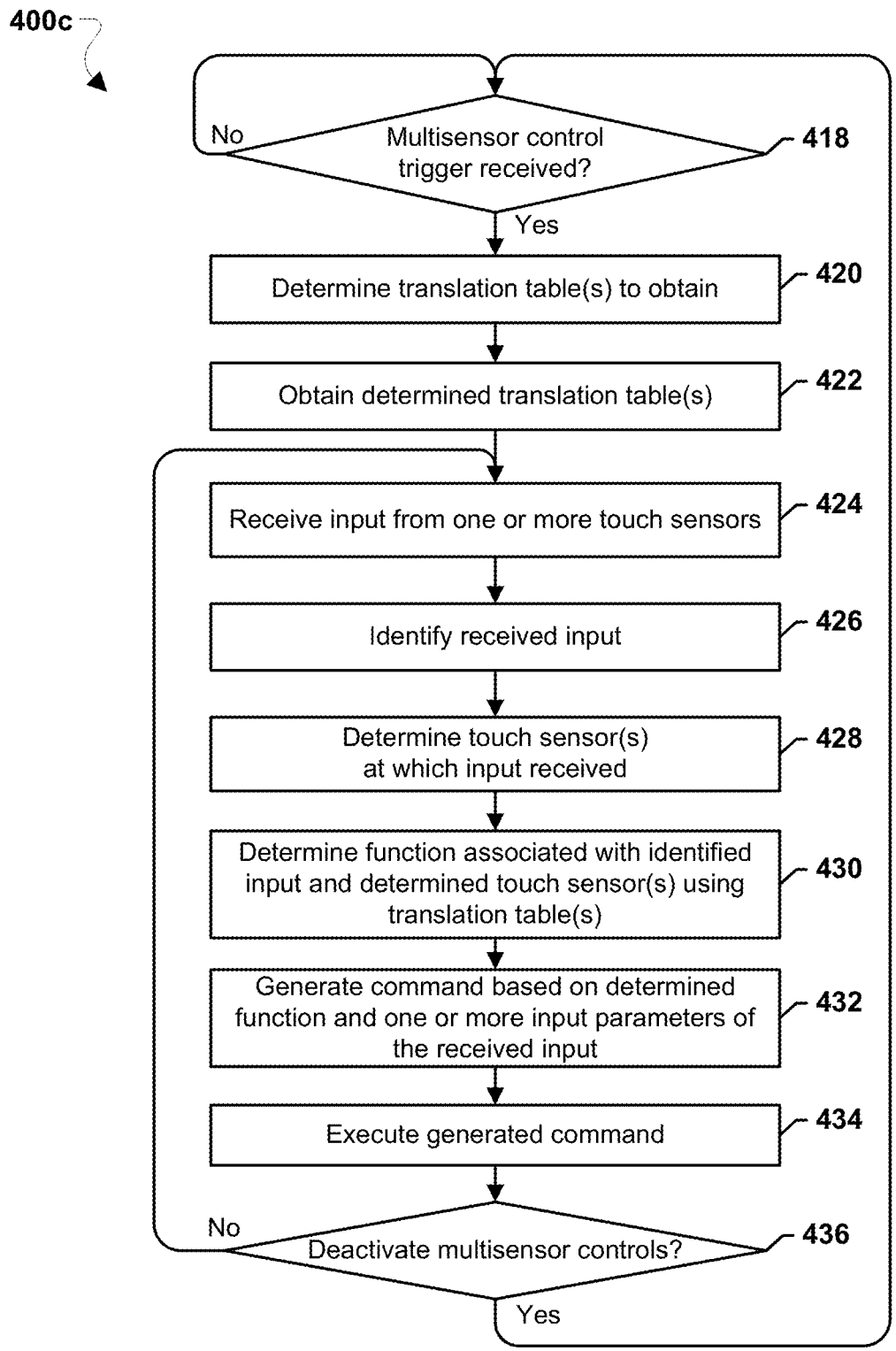
FIG. 4C is a process flow diagram illustrating a method of managing multisensor inputs received in sequence according to various embodiments.

FIG. 4C illustrates a method 400c of managing responses to user inputs on a mobile computing device having multiple user-input sensors as illustrated in FIGS. 1A and 1B and described above according to various embodiments. For ease of reference, the term "multisensor controls" is used herein to refer to the management of user inputs received at more than one touch sensor of the mobile computing device (e.g., the touch sensors 102, 104, 106a, 106b, 108) to enable a user to control different devices (e.g., displays, IoT devices, etc.), different applications, and/or different layers or portions of content (e.g., text, images, sound, etc.) processed on the mobile computing device by interacting with touch gestures on different touch sensors. Various embodiments are discussed in terms of touch sensors, but other input sensors and other input-receiving devices of the mobile computing device may also be used, such as a power button, a volume button, or another button, switch, slider, and the like. With reference to FIGS. 1A-4C, the method 400c may be implemented in hardware components and/or software components of the mobile computing device (e.g., 100, 300), the operation of which may be controlled by one or more processors (e.g., the general-purpose processor 306) of the mobile computing device.

In determination block 418, the processor of the mobile computing device may determine whether a multisensor control trigger is received. In various embodiments, the multisensor control trigger may be a determination or a command in response to which the processor may receive multisensor control inputs and process the multisensor control inputs.

In response to determining that the multisensor control trigger has not been received (i.e., determination block 418="No"), the processor may continue to determine whether the multisensor control trigger has been received in determination block 418.

In response to determining that the multisensor control trigger has been received (i.e., determination block 418="Yes"), the processor may determine one or more translation tables (e.g., the translation table 600 described below with reference to FIG. 6) to obtain from a memory of the mobile computing device in block 420. In some embodiments, the processor may obtain the one or more translation tables from an application running on the mobile computing device. In some embodiments, the processor may obtain the one or more translation tables from an operating system of the mobile computing device, from memory, or from another software and/or hardware element of the mobile computing device other than the application running on the mobile computing device.

In block 422, the processor may obtain the determined one or more translation tables.

In block 424, the processor may receive an input from one or more touch sensors of the mobile computing device (e.g., the touch sensors 102, 104, 106a, 106b, 108, 327).

In block 426, the processor may identify the received input. In some embodiments, the processor of the mobile computing device may distinguish between a tap, a double tap, a long press, a sweep or flick, a drag, a predefined gesture including a plurality of touch and/or pressure inputs, a grip, a release, a hover, other contacts, or any combination of concurrent, simultaneous, or sequence of interactions with a touch sensor. As used herein, the term "tap" refers to a user touch that is more than a mere touch of the surface as touch sensors on the sides and back of mobile computing device are likely to be touched in the normal usage and carrying of the device. Thus, a "tap" may be a forceful push on the touch surface (i.e., a strong tap) that can be distinguished from inadvertent touches or handling of the device.

In block 428, the processor may determine the one or more touch sensors at which the input was received. In some embodiments, the processor may determine whether the touch sensor(s) at which the input was received is a front sensor, a back sensor, a side sensor, etc. In some embodiments, information about the input may also include an identification of the one or more touch sensors. In such embodiments, the operations of blocks 426 and 428 may be performed in a single operation. In some embodiments, a microcontroller (e.g., 328) associated with a touch sensor may provide the identification of the touch sensor. In some embodiments the processor may determine the touch sensor(s) at which the input was received based on a pin, port, or other physical input through which the processor receives the information about the input.

In block 430, the processor may determine a multisensor function associated with the identified input and the determined one or more touch sensors using the determined one or more translation tables.

In block 432, the processor may generate a command based on the determined function and one or more input parameters of the received input. In some embodiments, the generated command may be specific to a computing device context and/or specific to an application running on the mobile computing device. In some embodiments, the one or more input parameters of the received input may include the identification of the received input (e.g., a type of input). In some embodiments, the one or more input parameters may include a degree, a range, a type, a magnitude, a width, a length, a velocity, a direction, a vector, a change in velocity, direction, or vector, a number of inputs, a duration of one or more inputs, a value that is below, exceeds, and/or is equal to a threshold (or two or more thresholds), as well as any combination of the foregoing.

In block 434, the processor may execute the generated command In some embodiments, executing the generated command may include executing by the processor the command to perform a function of an application running on the mobile computing device that is associated with a particular touch sensor as further described below with reference to FIGS. 5E and 17. In some embodiments, executing the generated command may include executing by the processor the command to operate a function of the mobile computing device as further described below with reference to FIG. 12. In some embodiments, executing the generated command may include sending, issuing, or transmitting the command to another device (e.g., an IoT device) in communication with the mobile computing device, in which first commands for a first device (e.g., an IoT lightbulb 204) are segmented to a first command layer and second commands for a second device (e.g., an IoT thermostat 206) are segmented to a second command layer, as further described below with reference to FIGS. 5F and 18.

In determination block 436, the processor may determine whether to deactivate the multisensor controls. In some embodiments, the activating the multisensor controls may include placing the mobile computing device into an operating state in which processor does not receive multisensor control inputs and/or does not process multisensor control inputs. In some embodiments, the processor may determine whether to deactivate the multisensor controls based on a timer, clock, or another time-based function, at the expiration of which the processor may deactivate the multisensor controls. In some embodiments, the processor may determine whether to deactivate the multisensor controls based on an input, a command, deactivation of an application, an application entering for changing into a background or idle mode, entering by the mobile computing device into an idle state, a low-power state, a sleep mode, or another similar operational state, and the like.

In response to determining not to deactivate the multisensor controls (i.e., determination block 436="No"), the processor may receive another input from one or more of the touch sensors in block 424.

In response to determining to deactivate the multisensor controls (i.e., determination block 436="Yes"), the processor may deactivate multisensory controls and await receipt of another multisensor control trigger in determination block 418.

Figure 4D:
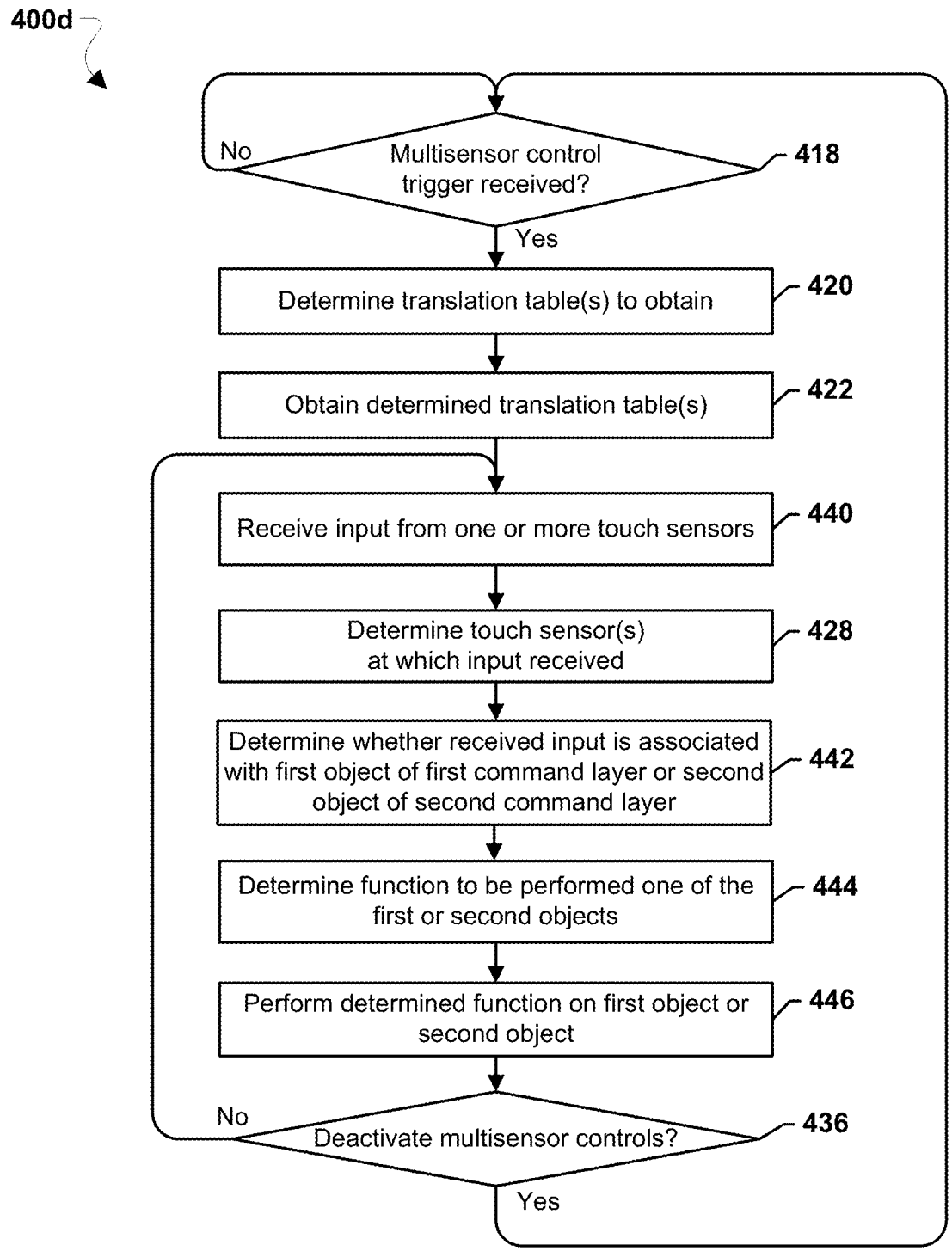
FIG. 4D is a process flow diagram illustrating a method of managing multisensor inputs received in sequence according to various embodiments.

FIG. 4D illustrates a method 400d of managing responses to user inputs on a mobile computing device having multiple user-input sensors as illustrated in FIGS. 1A and 1B according to various embodiments. With reference to FIGS. 1A-4D, the method 400d may be implemented in hardware components and/or software components of the mobile computing device (e.g., 100, 300), the operation of which may be controlled by one or more processors (e.g., the general-purpose processor 306) of the mobile computing device. Various embodiments are discussed in terms of touch sensors, but other input sensors and other input-receiving devices of the mobile computing device may also be used, such as a power button, a volume button, or another button, switch, slider, and the like. In blocks 418-422, 428, and 436 the processor of the mobile computing device may perform operations of like-numbered blocks of the method 400c as described.

In block 440, the processor may receive an input from one or more touch sensors (e.g., the touch sensors 102, 104, 106a, 106b, 108, 327).

In block 442, the processor may determine whether the received input is associated with a first object of the first command layer or a second object of the second command layer. This determination may be based at least in part on the determined touch sensor at which the input was received (e.g., the touch sensor 102, 104, 106a, 106b 108). In some embodiments, the processor may determine whether the received input is associated with the first object of the first command layer or the second object of the second command layer according one or more of one or more association tables defining associations between inputs and commands associated with the first and second object and/or the first and second command layer. In some examples, the processor may define the received input according to one or more input characteristics, such as specific sensors from which the input is received (e.g., the touch sensor 102, 104, 106a, 106b 108), a shape of the input, a magnitude of input (e.g., force, size, velocity), or another similar characteristic that defines the input. In some embodiments, the processor may use a machine learning technique to determine characteristics of the input and to associate such characteristics with a specific function associated with the first object (or the first command layer) or the second object (or the second command layer).

In block 444, the processor may determine a function to be performed on one of the first or second objects based on whether the first command layer or the second command layer is determined to be associated with the received input.

In block 446, the processor may perform the determined function on the first object or the second object.

FIGS. 5A-5F illustrate examples of various embodiments implemented on a mobile computing device 500. With reference to FIGS. 1A-5F, the mobile computing device 500 may include hardware components and/or software components of the mobile computing device (e.g., 100, 300), the operation of which may be controlled by one or more processors (e.g., the general-purpose processor 306) of the mobile computing device. Various embodiments are discussed in terms of touch sensors, but other input sensors and other input-receiving devices of the mobile computing device may also be used, such as a power button, a volume button, or another button, switch, slider, and the like.

Referring to FIG. 5A, in some embodiments, the mobile computing device 500 may display an image 502, which may include a foreground layer including one or more objects in the foreground of the image 502 (e.g., object 504), and a background layer including one or more objects in the background of the image 502 (e.g., object 506).

In some embodiments, the processor of the mobile computing device 500 may segment the objects of the image 502 into a first command layer and a second command layer. For example, the processor may segment object 504 into the first command layer and may segment object 506 into the second command layer.

In some embodiments, the processor of the mobile computing device 500 may determine whether a received input is associated with the first command layer or the second command layer. For example, an input received at touch sensor 102 may be associated with the first command layer, and an input received at touch sensor 104 may be associated with the second command layer. In some embodiments, the processor may determine an image function to be performed on an object of the image 502 in the associated command layer. For example, the processor may determine that a received input (e.g., at the touch sensor 102) is associated with the first command layer to which the object 504 has been segmented. The processor may determine an image function to be performed based on the received input and may perform the determined the image function on the foreground layer of the image 502 and/or on the object 504. As another example, the processor may determine that a received input (e.g., at the touch sensor 104) is associated with the second command layer to which the object 506 has been segmented. The processor may determine an image function to be performed based on the received input and may perform the determined image function on the background layer of the image 504 and/or on the object 506.

In some embodiments, an image function may include any selection, alteration, transformation, or processing of an object, including changing a size, dimension, color, rotation, focus, blur, texture, skew, stretch, bend, warp, copy, paste, cut, or other transformation of an object.

FIG. 5B illustrates the mobile computing device 500 displaying text having a first text layer and a second text layer according to various embodiments. The mobile computing device 500 may display the text 508. The text 508 may include a first text layer 510 and a second text layer 512. For example, the first text layer 510 may include displayed words, symbols, images, graphics, and the like. As another example, the second text layer 512 may include a non-text area, which include a background of the text 508.

In some embodiments, the processor of the mobile computing device 500 may segment the text 508 into a first command layer and a second command layer. For example, the processor may segment the first text layer 510 into the first command layer and segment the second text layer 512 into the second command layer.

In some embodiments, the processor of the mobile computing device 100 may determine whether a received input is associated with the first command layer or the second command layer. For example, an input received at touch sensor 102 may be associated with the first command layer, and an input received at touch sensor 104 may be associated with the second command layer. In some embodiments, the processor may determine a text function to be performed on the text 248 in the associated command layer. For example, the processor may determine that a received input (e.g., at the touch sensor 102) is associated with the first command layer to which the first text layer 510 has been segmented. The processor may determine a text function to be performed based on the received input and may perform the determined text function on the first text layer 510 and/or an element of the first text layer 510 (e.g., on one or more letters, words, symbols, paragraphs, in-line images, etc.). As another example, the processor may determine that a received input (e.g., at the touch sensor 104) is associated with the second command layer to which the second text layer 512 has been segmented. The processor may determine a text function to be performed based on the received input and may perform the determined text function on the second text layer 512. In some embodiments, functions associated with the second text layer may be functions: altering or adjusting an entire sentence, paragraph, page, or an entire document (e.g., global document functions); background colors, textures, patterns, shapes, and the like; document orientation, size, formatting, etc.; and other similar functions typically associated with text functions beyond text entry.

Some embodiments enable users to control the display of objects (e.g., 516, 518) on, about or along multiple dimensions based on the particular touch sensor on which user inputs are received. FIG. 5C illustrates the mobile computing device 500 displaying an image 514 including two-dimensional renditions of three-dimensional objects 516, 518 within three spatial dimensions along X, Y, and Z axes 520. However, the dimensions about which displayed objects may be controlled according to some embodiments are not limited to spatial dimensions, and may include dimensions or ranges for any other visual adjustments.

In some embodiments, the processor of the mobile computing device 500 may segment a displayed image 514 or objects (e.g., 516 or 518) within the image into a first command layer associated with a first touch sensor (e.g., a front sensor 102) for controlling a displayed image along/about a first dimension and a second command layer associated with a second touch sensor (e.g., a backside sensor 104) for controlling the displayed image along/about a second dimension. For example, the processor may process user inputs received on the first touch sensor as inputs for rotating or translating an object (e.g., 516 or 518) about/ along a first dimension (e.g., the X dimension), and process user inputs received on the second touch sensor as inputs for rotating or translating the object (e.g., 516 or 518) about/ along a second dimension (e.g., the Y dimension) to enable a user to view the three-dimensional objects from different directions and/or locations. In some embodiments, the processor of the mobile computing device 500 may further segment the image 514 or objects (e.g., 516 or 518) within the image into a third command layer associated with a third touch sensor (e.g., a right-side sensor 116*b*) for controlling the displayed image along/about a third dimension. For example, the processor may process user inputs received on the third touch sensor as inputs for rotating or translating the object (e.g., 516 or 518) about/along a third dimension (e.g., the Z dimension). In some embodiments, the processor of the mobile computing device 500 may further segment the image 514 or objects (e.g., 516 or 518) within the image into a fourth command layer associated with a fourth touch sensor (e.g., a left-side sensor 106*a*) for controlling the displayed image along/about a fourth dimension, such as time, color, transparency, focus, texture, etc. For example, the processor may process user inputs received on the fourth touch sensor as inputs for changing the object (e.g., 516 or 518) along a time dimension to enable the user to view of the object changes with time. As another example, the processor may process user inputs received on the fourth touch sensor as inputs for changing the color of the object (e.g., 516 or 518) along a spectrum dimension to enable the user to view of the object in various colors. In some embodiments, the processor of the mobile computing device 500 may further segment the image 514 or objects (e.g., 516 or 518) within the image into further dimensions associated with further touch sensors such as a top-side sensor 108.

In some embodiments, the processor of the mobile computing device 500 may receive an input from a touch sensor and determined the associated command layer (e.g., first, second, third, etc. command layer), determine an image function to be performed on/along/about the dimension corresponding to the associated command layer, and perform the determined function on the image. For example, the processor may determine that a received input (e.g., at the touch sensor 102) is associated with the first command layer to which the first dimension (e.g., the X dimension) of an image object (e.g., 516 or 518) has been segmented. Continuing this example, the processor may determine that the image function to be performed on the image object about the first dimension based on the received input is a rotation, and then perform the determined the image function on the object by rotating the object about/along the X axis. In some embodiments, an image function may include any selection, alteration, transformation, or processing of an image in, about or along the associated dimension, including rotation, translation, color change, size adjustment, focus, blur, texture, skew, stretch, bend, warp, copy, paste, cut, or other transformation of an object.

FIG. 5D illustrates the mobile computing device 500 in communication with an audiovisual device displaying an extended reality image according to various embodiments. With reference to FIGS. 1A-5D, the audiovisual device 202 may display an image 522, which may include an extended reality image that includes real objects and digital objects. In some embodiments, the audiovisual device 202 may include a wearable device capable of providing an extended reality (XR) display of information and images, which may include virtual reality (VR), augmented reality (AR), mixed reality (MR), and other similar presentations of information and/or images.

"Extended reality" refers to a range of digital output (which may include images, text, sound, tactile output, as well as output detectable with other senses) that includes wholly digital output as well as an integration of digital information with a real environment. For example, the audiovisual device 202 may include a transparent or translucent display that forms a surface of the audiovisual device 202 through which a user may see. Aspects of the real environment that are visible through the display of the audiovisual device 202 in some embodiments are referred to herein as "real objects," such as real object 524. Further, the display of the audiovisual device 202 may show digital information that is also visible to the user. Digital information displayed on the display of the audiovisual device 202 is referred to herein as "digital objects," such as digital objects 526 and 528. Digital objects may include illusory images, text, icons, animations, and other displayable digital information.

In some embodiments, the processor of the mobile computing device 100 that is in communication with the audiovisual device 202 may segment the objects of the image 522 into a first command layer and a second command layer. For example, the processor may segment the real object 524 into the first command layer and segment the digital objects 526 and 528 into the second command layer.

In some embodiments, the processor of the mobile computing device 100 may determine whether a received input is associated with the first command layer or the second command layer. For example, an input received at a first touch sensor 102 may be associated with the first command layer, and an input received at a second touch sensor 104 may be associated with the second command layer. In some embodiments, the processor may determine an image function to be performed on an object of the image 522 in the associated command layer. For example, the processor may determine that a received input (e.g., at the touch sensor 102) is associated with the first command layer to which the real object 524 has been segmented. The processor may determine an extended reality image function to be performed based on the received input and perform the determined the extended reality image function on the real object 524. As another example, the processor may determine that a received input (e.g., at the touch sensor 104) is associated with the second command layer to which the digital objects 526 and 528 have been segmented. The processor may determine an extended reality image function to be performed based on the received input and perform the determined extended reality image function on the digital object 526 and/or 528.

FIG. 5E illustrates the mobile computing device 500 configured to control a plurality of applications executing on the mobile computing device according to various embodiments. With reference to FIGS. 1A-5E, a processor of the mobile computing device 500 may be configured to communicate with and/or control (e.g., send information to, receive information from, and/or send commands to) a first application 530 and a second application 532, each executing on the mobile computing device 500.

In various embodiments, the mobile computing device 500 may receive an input at one or more touch sensors of the mobile computing device 500 (e.g., any of the touch sensors 102, 104, 106*a*, 106*b*, 108, 327). In some embodiments, functions of the first application 530 and the second application 532 may be segmented into different command layers.

For example, a first command layer may be associated with functions of the first application 530 and a second command layer may be associated with functions of the second application 532.

In some embodiments, a processor of the mobile computing device 500 may determine whether a received input is associated with a first command layer or a second command layer. For example, an input received at a first touch sensor 102 may be associated with the first command layer. As another example, an input received at a second touch sensor 104 may be associated with the second command layer. In some embodiments, the processor may determine a function to be performed on an application associated with the associated command layer. For example, the processor may determine that a received input (e.g., at the first touch sensor 102) is associated with the first command layer to which first application functions have been segmented. The processor may determine a first application function to be performed based on the received input, and may perform the determined the first application function. For example, the processor may send information, an instruction, a command, etc. to the first application 530. As another example, the processor may determine that a received input (e.g., at the touch sensor 104) is associated with the second command layer to which second application functions have been segmented. The processor may determine a second application function to be performed based on the received input and perform the determined the second application function. For example, the processor may send information, an instruction, a command, etc. to the second application 532.

FIG. 5F illustrates the mobile computing device 500 configured to communicate with and/or control a plurality of devices according to various embodiments. With reference to FIGS. 1A-5F, a processor of the mobile computing device 100 may be configured to communicate with and/or control (e.g., send information to, receive information from, and/or send commands to) various devices, such as the audiovisual device 202 and the IoT devices 204-210. The smart lighting system 204 and the smart thermostat 206 are illustrated in FIG. 5F as but two examples of devices with which the mobile communication device 100 may be configured to communicate.

In some embodiments, functions of other devices (e.g., the smart lighting system 204 and the smart thermostat 206) may be segmented into different command layers. For example, a first command layer may be associated with functions of the smart lighting system 204 and a second command layer may be associated with functions of the smart thermostat 206. In various embodiments, functions of other devices (e.g., the audiovisual device 202, the smart thermostat 206, the IoT security camera 208, and the IoT hub device 210) may be segmented into other command layers.

In some embodiments, a processor of the mobile computing device 100 may determine whether a received input is associated with a first command layer or a second command layer. For example, an input received at a first touch sensor 102 may be associated with a first command layer. As another example, an input received at a second touch sensor 104 may be associated with a second command layer. In some embodiments, the processor may determine a function to be performed on a device associated with the associated command layer. For example, the processor may determine that a received input (e.g., at the first touch sensor 102) is associated with the first command layer, to which smart lighting system commands have been segmented. The processor may determine a smart lighting system function to be performed based on the received input and perform the determined the smart lighting system function. For example, the processor may send information to the smart lighting system 204, receive information from the smart lighting system 204, and/or send an instruction to the smart lighting system 204. As another example, the processor may determine that a received input (e.g., at the touch sensor 104) is associated with the second command layer to which smart thermostat commands have been segmented. The processor may determine a smart thermostat function to be performed based on the received input and perform the determined smart thermostat function. For example, the processor may send information to the smart thermostat 206, receive information from the smart thermostat 206, and/or send an instruction to the smart thermostat 206. Similarly, functions of other various devices and systems may be segmented into different command layers.

Figure 6:
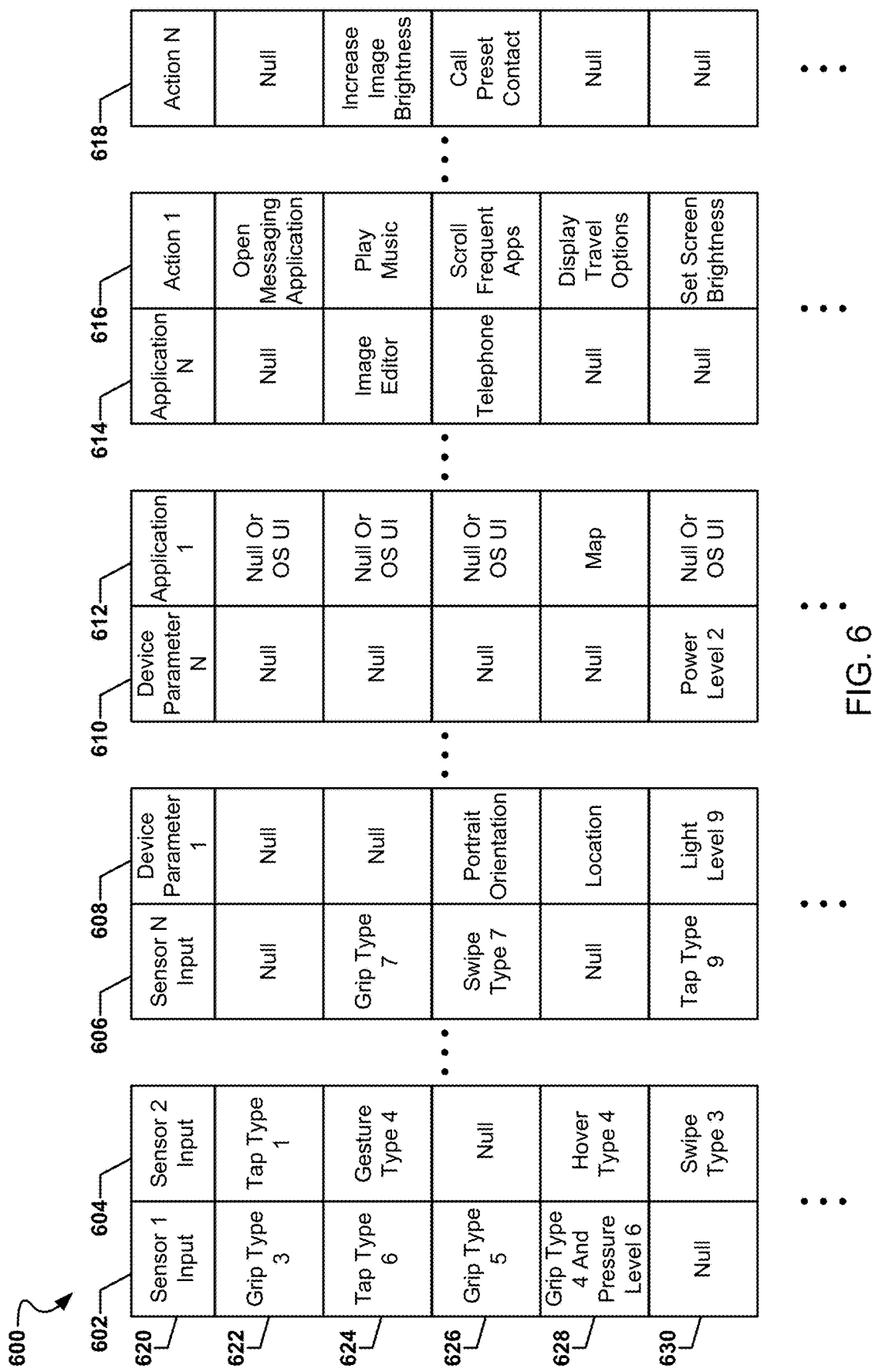
FIG. 6 is an example multisensor input translation table suitable for implementing various embodiments

FIG. 6 illustrates an example multisensor input translation table 600 suitable for implementing various embodiments. For ease of reference, the term "multisensor input" is used herein to refer to user inputs received at more than one touch sensor of the mobile computing device (e.g., the touch sensors 102, 104, 106a, 106b, 108) to enable a user to control different devices (e.g., displays, IoT devices, etc.), different applications, and/or different layers or portions of content (e.g., text, images, sound, etc.) processed on the mobile computing device by interacting with touch gestures on different touch sensors. Various embodiments are discussed in terms of touch sensors, but other input sensors and other input-receiving devices of the mobile computing device may also be used, such as a power button, a volume button, or another button, switch, slider, and the like. FIG. 6 is provided as but one example of any number of data structures that could be used to relate various combinations of sensor inputs from front, back, side, top, and/or bottom sensors to particular actions or functionality depending upon the computing device state and/or executing applications. Further, other forms of relating various combinations of sensor inputs to particular functionality depending upon device state and executing applications may be used to implement various embodiments, such as cascaded decision trees implemented in software, hardware or a combination of software and hardware. Thus, the translation table 600 is intended as a non-limiting example of a data structure type implementation of various embodiments. In some embodiments, the data structures may be generated by a processor of a mobile computing device (e.g., the general processor 306, etc.) In some embodiments, the data structures may be generated using a machine learning technique.

In embodiments using a translation table implementation, a multisensor input translation table 600 may include multiple types of data, including any number or combination of sensor inputs, device parameters, applications, and/or actions. In the example illustrated in FIG. 6, the multisensor input translation table 600 includes a number of columns 602, 604, 606, 608, 610, 612, 614, 616, 618 corresponding to the data types. The example data columns include: Sensor 1 Input corresponding with column 602; Sensor 2 Input corresponding with column 604; Sensor N Input corresponding with column 606; Device Parameter 1 corresponding with column 608; Device Parameter N corresponding with column 610; Application 1 corresponding with column 612; Application N corresponding with column 614; Action 1 corresponding with column 616; and Action N corresponding with column 618. A multisensor input translation table 600 may be configured to relate data of the various data types, including at least one sensor input from columns 602,

604, 606 and at least one action from columns 616, 618. The relationships between the data of the various data types may be represented in the multisensor input translation table 600 by rows 620, 622, 624, 626, 628, 630.

A multisensor input translation table 600 may include data of a sensor input data type, which may be referred to as sensor input data. The sensor input data may represent interactions with a number of touch sensors (e.g., touch sensor 102, 104, 106a, 106b, 108, 327 in FIGS. 1A-3). Non-limiting examples of sensor interactions that may be recognized by the various touch sensors include a grip, a tap, a press, a swipe, a gesture, a release, or a hover, and any combination of concurrent, simultaneous, or sequence of interactions with a touch sensor. The sensor input data may represent qualities of the interactions with the touch sensor, such as location, area, duration, direction, speed, pressure, number, frequency, or sequence of interactions with a touch sensor.

Each column 602, 604, 606 in a multisensor input translation table 600 corresponding to the sensor input data type may be associated with a touch sensor. The number of columns 602, 604, 606 corresponding to the sensor input data type may depend on the number of touch sensors, up to N touch sensors. For example, column 602 may correspond to a touch sensor of a back of a mobile computing device 100, column 604 may correspond to a touch sensor of a front of a mobile computing device 100, and column 606 may correspond to any number of touch sensors of any number of sides of a mobile computing device 100. In some embodiments, different columns may be used for the touch sensors on each side of a mobile computing device 100 (e.g., sensor 106a, 106b).

A multisensor input translation table 600 may include data of a device parameter data type, which may be referred to as device parameter data. The device parameter data may represent any number and combination of mobile computing device parameters other than interactions with a touch sensor. For example, device parameter data may include readings or signals from other sensors of the mobile computing device, such as a light sensor, an accelerometer, a gyroscope, a temperature sensor, a voltage and/or current sensor, an infrared sensor, etc. Device parameter data may include location data of the mobile computing device, such as global positioning system (GPS) data. Device parameter data may include wired or wireless connection data of the mobile computing device, such as cellular, Wi-Fi, Bluetooth, near-filed communication (NFC), etc., or wired peripheral device connection data, including status of a connection or identification of a device to which the mobile computing device is connected. Device parameter data may include mobile computing device state data, such as a power state (e.g., full, low, charging, specific battery charge or power level, etc.) or an activity state (e.g., active, sleep, hibernate, etc.) of the mobile computing device. Each column 608, 610 corresponding to the device parameter data type may be associated with device parameter data. The number of columns 608, 610 corresponding to the device parameter data type may depend on the number of device parameter data, up to N device parameter data. The number of device parameter data may depend on a number of device parameter data associated with a combination of sensor input data in a row 620, 622, 624, 626, 628, 630 of the multisensor input translation table 600.

The multisensor input translation table 600 may include data of an application data type, which may be referred to as application data. The application data may represent identification any number and combination of applications on the mobile computing device. Applications on the mobile computing device may include an operating system (OS) user interface (UI), applications integrated into the operating system to implement native functions of the mobile computing device, or applications loaded to the mobile computing device by an operating system developer or a mobile computing device manufacturer, distributor, seller, or user. By way of examples, applications may include: a telephone application, a camera or video application, a photo gallery application, an image editing application, a media player application, a word processing application, a calendar application, a map application, a display control application, a messaging application, an email application, a game application, a home assistant application (such as, Google Home, Amazon Echo, Apple HomePod), a web browser application, a clock application, a keyboard, an alert manager application, a mobile computing device profile manager application, a privacy application, an application launcher or switcher, etc. Each column 608, 610 corresponding to the device parameter data type may be associated with a device parameter data. The number of columns 612, 614 corresponding to the application data type may depend on the number of application data, up to N application data. The number of application data may depend on a number of application data associated with a combination of sensor input data in a row 620, 622, 624, 626, 628, 630 of the multisensor input translation table 600.

The multisensor input translation table 600 may include data of an action data type, which may be referred to as action data. The action data may represent any number and combination of actions implemented on the mobile computing device in response to any combination of a combination of sensor input data, device parameter data, or application data. The action data may include code or trigger values for, identifiers of, or references to code for implementing an action on the mobile computing device. Actions may include any number or combinations of functions of the operating system or applications on the mobile computing device. By way of examples, actions may include: taking a picture; starting, stopping, or pausing recording of a video or sound; changing a background image of an image or video; adjusting focus of an image or video at different focal lengths; adjust degree of background blur or other segmentation effects of an image or video; adjust face beautification effects of an image or video; switching between front and rear facing cameras; adjust extended reality (XR) features that can be super-imposed on an image, video, or map; adjusting other XR content on display such as increasing brightness of graphics in an image, video, or map; placing a bounding box on a person or object of interest in an image, video, or map; moving the selection among several people or objects in image, video, or map; selecting to show additional information on a target in image, video, or map; displaying a graphic box with information about a target image, video, or map; zooming in/out on an image, video, or map; zoom in on a specific anchor point in a map; displays a grid of thumbnail images in an image gallery or a video gallery; highlighting an image or recording in an image gallery, video gallery, or audio library; previewing an item in an image gallery, video gallery, audio library, message inbox, email inbox, contacts list, or appointments calendar; or moving forward or backward in an image gallery, video recording or video gallery, audio recording or audio library, message inbox, email inbox, contacts list, appointments calendar, or between. Further examples of actions include: turning off a ringer; toggling a silent or a vibrate mode; increasing or decreasing a ringer volume; disabling or enabling lights for alerts, turning a screen on or off; increasing or decreasing a screen brightness; reading out a current time; or shifting mode of the mobile computing device, such as putting the mobile computing device into a privacy mode where the content shown is filtered to be appropriate for others (e.g., only certain types of pictures may appear in a gallery, some texts may not appear, some applications may not appear, etc.). Further examples of actions include: answering, placing on hold, returning to, or terminating a telephone or voice over internet protocol (VOIP) call; muting or unmuting a telephone or VOIP call; or increasing or decreasing the volume of a telephone or VOIP call. Further examples of actions include mouse type actions, such as: placing a cursor, adjust a position of the cursor, trigger text selection, copying, or pasting; scrolling; or right button click type actions, such as opening deeper features/actions within an application, triggering menus. Further examples of actions include changing keyboards (e.g., from a text keyboard to a punctuation or an emoji keyboard) by toggling through or selecting different keyboards; or correcting a user's texting offsets (i.e., differences between target key and actual touch location). Further examples of actions include: automatically launching an application; bring up an application switcher; switching to a previous or next application in a stack; switching back to a current application; scrolling through the application switcher; bring a background application forward; sending an application to the background; controlling a background application; or displaying a home screen. Further examples of actions include prompting a special interface for making touches one-handed. Further examples of actions include transforming the mobile computing device into a home assistant (such as, Google Home, Amazon Echo, Apple HomePod). Further examples of actions include moving the mobile computing device into a state of readiness to interpret sensor input data or device parameter data as distinct commands. Further examples of actions include controlling interaction with a connected computing device, such as showing or hiding, moving, etc. extended reality content. Further examples of actions include increasing or decreasing the sensitivity of the touch sensors. Each column 608, 610 corresponding to the device parameter data type may be associated with a device parameter data. The number of columns 616, 618 corresponding to the action data type may depend on the number of action data, up to N action data. The number of action data may depend on a number of application data or device parameter data associated with a combination of sensor input data in a row 620, 622, 624, 626, 628, 630 of the multisensor input translation table 600.

Rows 620, 622, 624, 626, 628, 630 of the multisensor input translation table 600 may associate data of the columns 602, 606, 606, 608, 610, 612, 614, 616, 618. A processor (e.g., general-purpose processor 206 of FIG. 2) may access a row 620, 622, 624, 626, 628, 630 of the multisensor input translation table 600 having a combination of sensing input data in a combination of columns 602, 604, 606 corresponding to sensor input data received by the mobile computing device via a combination of touch sensors. The processor may determine an action to execute from the action data in a column 616, 618 of the row 620, 622, 624, 626, 628, 630 based on any combination of the device parameter data, the application data, or the action data in any combination of columns 608, 610, 612, 614, 616, 618 of the row 620, 622, 624, 626, 628, 630.

In some embodiments, the application data associated with a combination of sensor input data in a row 620, 622, 624, 626, 628, 630 of a multisensor input translation table 600 may be added to with additional columns 612, 614 or overwritten. For example, a running application may be associated with an action in response to a combination of sensor input data. The application data for the running application may be added to a row 620, 622, 624, 626, 628, 630 of the multisensor input translation table 600 having the combination of sensor input data by adding a column 612, 614. In another example, a running application may preempt action in response to a combination of sensor input data for other applications, and the combination of sensor input data in a row 620, 622, 624, 626, 628, 630 of the multisensor input translation table 600 may be associated with the running application; and disassociated with another application by overwriting the application data of the other application with the application data of the running application.

In some embodiments, the device parameter data or the action data associated with a combination of sensor input data in a row 620, 622, 624, 626, 628, 630 of the multisensor input translation table 600 may be expanded with additional columns 608, 610, 616, 618 or overwritten based on the application data in the row 620, 622, 624, 626, 628, 630. Similar to the application data addition examples, the device parameter data or the action data associated may be associated with a combination of sensor input data and an application data in a row 620, 622, 624, 626, 628, 630 of the multisensor input translation table 600. The device parameter data or the action data associated with a running application may be added to a row 620, 622, 624, 626, 628, 630 of the multisensor input translation table 600 having the combination of sensor input data and the application data by adding a column 608, 610, 616, 618. In embodiments in which the running application preempts action for other applications, the device parameter data or the action data for the running application may be associated with the combination of sensor input data and running application data in a row 620, 622, 624, 626, 628, 630; and the device parameter data or the action data for the other application may be disassociated from the combination of sensor input data and running application data in a row 620, 622, 624, 626, 628, 630 by overwriting the device parameter data or the action data with the device parameter data or the action data of the running application.

In various embodiments, new application data, device parameter data, or action data associated with a combination of sensor input data in a row 620, 622, 624, 626, 628, 630 already containing application data, device parameter data, or action data may be added to the multisensor input translation table 600 by adding a new row associating the combination of sensor input data with the new application data, device parameter data, or action data. In some embodiments, multiple multisensor input translation tables 600 may be implemented for various inputs from combinations of touch sensors, sets of device parameters, applications, or sets of actions. In some embodiments, the multisensor input translation table 600 may be stored on, loaded to, or accessed from a memory (e.g., memory 314 of FIG. 3) of the mobile computing device by the processor, such memory including a non-volatile storage memory, a volatile main memory, such as a random access memory (RAM), and/or a volatile cache memory.

Figure 7:
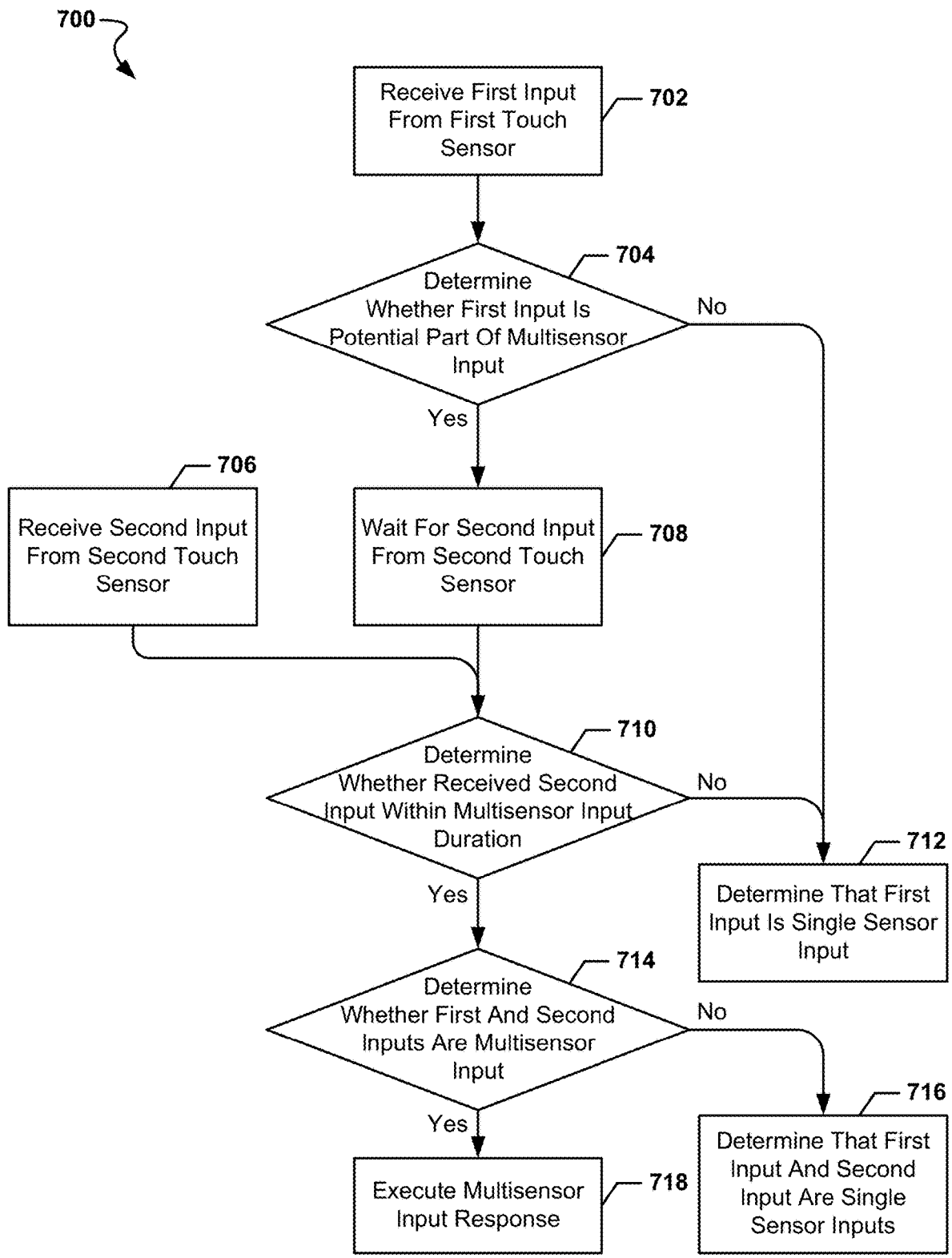
FIG. 7 is a process flow diagram illustrating a method of managing multisensor inputs received in sequence according to various embodiments.

FIG. 7 illustrates a method 700 of managing multisensor inputs received in sequence according to various embodiments. With reference to FIGS. 1A-7, the method 700 may be implemented in hardware components and/or software components of the mobile computing device (e.g., 100, 300 in FIGS. 1A-3), the operation of which may be controlled by one or more processors (e.g., the general-purpose processor 206) of the mobile computing device. In order to encompass the alternative configurations enabled in various embodiments, the hardware implementing the method 700 is referred to herein as a "processing device."

In block 702, the processing device may receive a first input from a first touch sensor (e.g., touch sensor 102, 104, 106a, 106b, 108, 327 in FIGS. 1A-3). In some embodiments, a user may interact with a surface or area (e.g., front area 112, rear area 114, sides 116a, 116b, and top area 118 in FIGS. 1A and 1B) of the mobile computing device having a touch sensor. The user interaction with a touch sensor may trigger a response by the processing device or a microcontroller (e.g., microcontroller 328 in FIG. 3) associated with the touch sensor. The response may include signals or data configured to indicate qualities of the interactions with the touch sensor, such as location, area, duration, direction, speed, pressure, number, frequency, or sequence of interactions with the touch sensor. In some embodiments, the processing device may be configured to derive some such qualities of the interactions with the touch sensor from other qualities of the interactions with the touch sensor, as described further herein with reference to the method 800 in FIG. 8. The processing device may receive the signals or data configured to indicate qualities of the interactions with the touch sensor.

In determination block 704, the processing device may determine whether the first input from the first touch sensor is a potential part of a multisensor input. In some embodiments, a multisensor input may be a combination of a user interaction with a first touch sensor and a user interaction with a second touch sensor. Specific combinations of a user interaction with a first touch sensor and a user interaction with a second touch sensor may define a multisensor input by being associated with a multisensor input response to the multisensor input. In some embodiments, definitions of multisensor inputs may be stored on the mobile computing device in a memory (e.g., memory 314 of FIG. 3) of the mobile computing device. For example, the definitions of multisensor inputs may be stored in a multisensor input data structure (e.g., multisensor input translation table 600 of FIG. 6) configured to relate the combinations of a user interaction with a first touch sensor and a user interaction with a second touch sensor with multisensor input responses. To determine whether the first input is a potential part of a multisensor input, the processing device may compare the first input with data (e.g., sensor data in columns 602, 604, 606 of FIG. 6) in the multisensor input data structure associated with the first touch sensor. It is possible that the first input may be determined to be part of any number of multisensor inputs, but subsequent second inputs from a second touch sensor may not fit the definitions of a multisensory input in combination with the first input. Therefore, it may be that the first input is determined to be a potential part of a multisensor input, because it may be uncertain that the second input of a multisensor input will succeed the first input. In such circumstances, the first input may not be combined with the second input to trigger a multisensor input response, described further herein with reference to block 712.

In response to determining that the first input from the first touch sensor is not a potential part of a multisensor input (i.e., determination block 704="No"), the processing device may determine that the first input is a single sensor input in block 712. The processing device may not identify the first input in a definition of a multisensor input in determination block 704. As such, there may not be any need to continue to determine whether a successive second input from a second touch sensor in combination with the first input combine to make a multisensor input. Therefore, the processing device may classify the first input as a single sensor input and terminate the instance of the method 700 triggered by receiving the first input from a first touch sensor in block 702.

In response to determining that the first input from the first touch sensor is a potential part of a multisensor input (i.e., determination block 704="Yes"), the processing device may wait for a second input from a second touch sensor in block 708. In some embodiments, the multisensor input may be a combination of the first user interaction with the first touch sensor and the second user interaction with the second touch sensor in a sequence within a multisensor input sequence duration. The multisensor input sequence duration may represent a designated period, such as time, transistor flops, etc., from receiving the first input during which the processing device may receive the second input. The processing device may wait the multisensor input sequence duration before responding to the first input to allow the user an opportunity to interact with the second touch sensor to implement a multisensor input as a sequence of inputs on the first and second touch sensors.

In determination block 710, the processing device may determine whether the second input from the second touch sensor is received during the multisensor input sequence duration. In some embodiments, the processing device may receive the second input during the multisensor input sequence duration, and in some embodiments, the multisensor input sequence duration may expire before the processing device receives a second input.

In response to determining that the second input from the second touch sensor is not received during the multisensor input sequence duration (i.e., determination block 710="No"), the processing device may determine that the first input is a single sensor input in block 712, as described herein.

In some embodiments, the processing device may receive a second input from a second capacitive input device in block 706 at any time after receiving the first input from the first capacitive input device in block 702 and before determining that the second input from the second touch sensor is not received during the multisensor input sequence duration in determination block 710. In some embodiments, the processing device may run multiple instances of the method 700 in parallel, and the second input received in block 706, in other instances of the method 700, may be the first instance received in block 702.

After receiving the second input from the second capacitive input device in block 706 and in response to determining that the second input from the second touch sensor is received during the multisensor input sequence duration (i.e., determination block 710="Yes"), the processing device may determine whether the first input from the first touch sensor and the second input from the second touch sensor combine as a multisensor input. Similar to determining whether the first input is a potential part of a multisensor input in determination block 704, the processing device may use the multisensor input data structure configured to relate combinations of user interactions with a first touch sensor and a second touch sensor with multisensor input responses to determine whether the second input combines with the first input as a multisensor input. In some embodiments, the processing device may compare the second input with data (e.g., sensor data in columns 602, 604, 606 of FIG. 6) in the multisensor input data structure to determine whether the second input matches any entries of the multisensor input data structure, and compare the entries with entries that match the first input identified in determination block 704. In some embodiments, the processing device may compare the second input with data in the entries of the multisensor input data structure that match the first input identified in determination block 704. Matching entries for the first input and the second input or data for the second input in entries for the first input may indicate that the first input and the second input define a multisensor input in the multisensor input data structure. No matching entries for the first input and the second input or data for the second input in entries for the first input may indicate that the first input and the second input do not define a multisensor input in the multisensor input data structure.

In response to determining that the first input from the first touch sensor and the second input from the second touch sensor do not combine as a multisensor input (i.e., determination block 714="No"), the processing device may determine that the first input and the second input are single sensor inputs in block 716. Similar to determining that the first input is a single sensor input in block 712, the processing device may not identify the combination of the first input and the second input in a definition of a multisensor input in determination block 714. As such, there may not be any need to continue implementing the method 700 for the combination of the first input and the second input. Therefore, the processing device may classify the first input and the second input as single sensor inputs and terminate the instance of the method 700 triggered by receiving the first input from a first touch sensor in block 702.

In response to determining that the first input from the first touch sensor and the second input from the second touch sensor do combine as a multisensor input (i.e., determination block 714="Yes"), the processing device may execute a multisensor input response in block 718. As described herein, the multisensor input data structure may relate the multisensor input and a multisensor input response. The processing device may execute code (e.g., action data in columns 616, 618 in FIG. 6) of the multisensor input response from the multisensor input data structure or referenced to (e.g., action data in columns 616, 618 in FIG. 6) from the multisensor input data structure.

Figure 8:
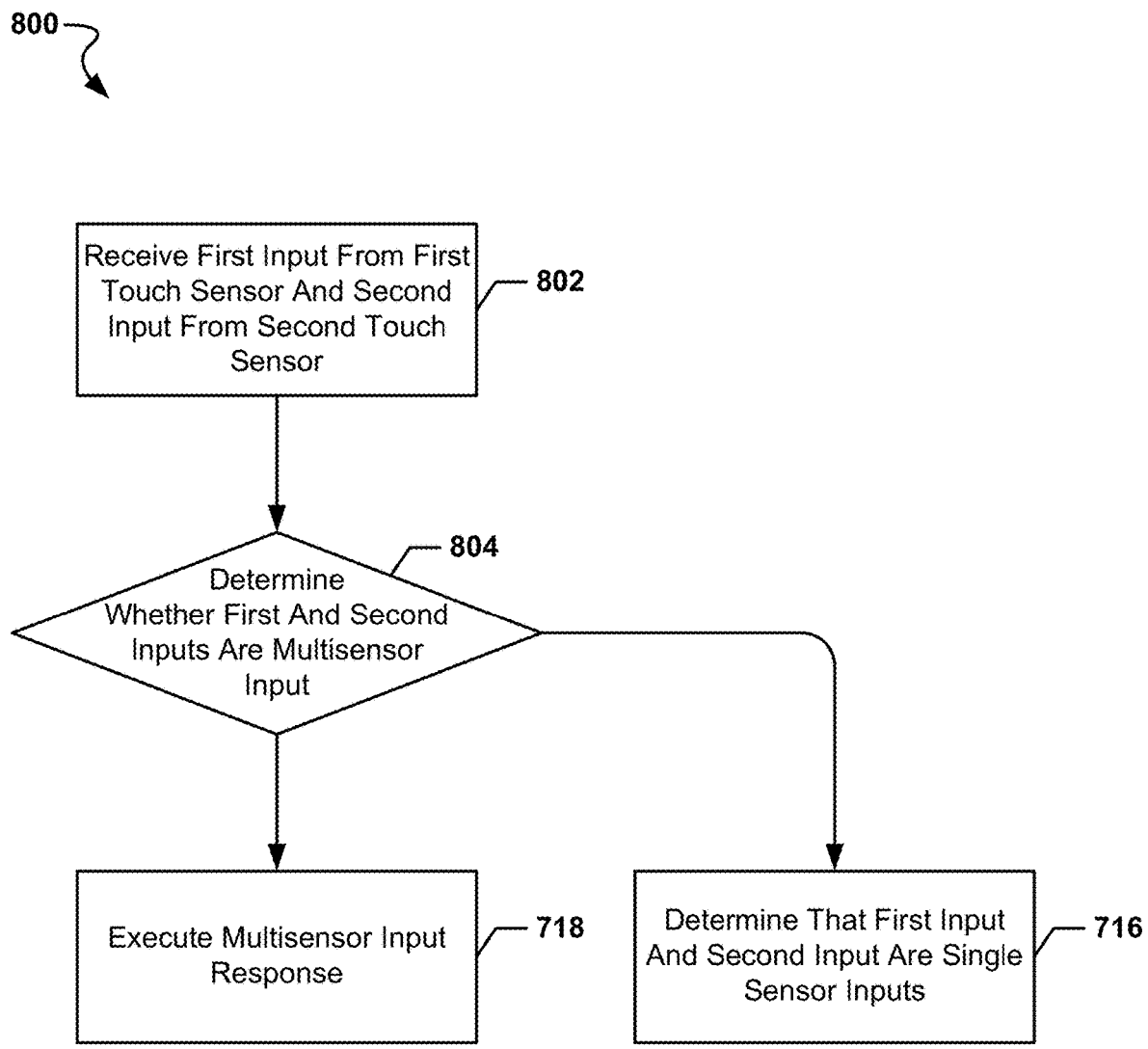
FIG. 8 is a process flow diagram illustrating a method of managing multisensor inputs for independently controlling or manipulating separate objects, elements or layers according to various embodiments.

FIG. 8 illustrates a method 800 of managing multisensor inputs for independently controlling or manipulating separate objects, elements or layers according to various embodiments. With reference to FIGS. 1A-8, the method 800 may be implemented in hardware components and/or software components of the mobile computing device (e.g., 100, 300 in FIGS. 1A-3), the operation of which may be controlled by one or more processors (e.g., the general-purpose processor 306) of the mobile computing device. In order to encompass the alternative configurations enabled in various embodiments, the hardware implementing the method 800 is referred to herein as a "processing device."

In some embodiments, blocks 716 and 718 may be implemented in manners similar to those described for blocks 716 and 718 with reference to the method 700 in FIG. 7.

In block 802, the processing device may receive a first input from a first touch sensor (e.g., touch sensor 102, 104, 106a, 106b, 108, 327 in FIGS. 1A-3) and a second input from a second touch sensor (e.g., touch sensor 102, 104, 106a, 106b, 108, 327 in FIGS. 1A-3). In some embodiments, a user may interact with multiple surfaces or areas (e.g., front area 112, rear area 114, sides 116a, 116b, and top area 118 in FIGS. 1A and 1B) of the mobile computing device having touch sensors. The user interactions with the touch sensors may trigger responses by the processing device or microcontrollers (e.g., microcontroller 328 in FIG. 3) associated with the touch sensors. The responses may include signals or data configured to indicate qualities of the interactions with the touch sensors, such as location, area, duration, direction, speed, pressure, number, frequency, or sequence of interactions with the touch sensor. In some embodiments, the processing device may be configured to derive some such qualities of the interactions with the touch sensors from other qualities of the interactions with the touch sensor, as described further herein with reference to the method 700 in FIG. 7. The processing device may receive the signals or data configured to indicate qualities of the interactions with the touch sensors. In some embodiments, the user interactions with the touch sensors may occur simultaneously or concurrently (e.g., two or more of the interactions occurring at overlapping times). Similarly, the processing device may receive the first input and the second input at different times, concurrently, or overlapping in time.

In determination block 804, the processing device may determine whether the first input from the first touch sensor and the second input from the second touch sensor combine as a multisensor input. In some embodiments, a multisensor input may be a combination of a user interaction with a first touch sensor and a user interaction with a second touch sensor. Specific combinations of a user interaction with a first touch sensor and a user interaction with a second touch sensor may define a multisensor input by being associated with a multisensor input response to the multisensor input. In some embodiments, definitions of multisensor inputs may be stored on the mobile computing device in a memory (e.g., memory 314 of FIG. 3) of the mobile computing device. For example, the definitions of multisensor inputs may be stored in a multisensor input data structure (e.g., multisensor input translation table 600 of FIG. 6) configured to relate the combinations of a user interaction with a first touch sensor and a user interaction with a second touch sensor with multisensor input responses. To determine whether the first input and the second input combine as a multisensor input, the processing device may compare the first input with data (e.g., sensor data in columns 602, 604, 606 of FIG. 6) in the multisensor input data structure associated with the first touch sensor and the second input with data (e.g., sensor data in columns 602, 604, 606 of FIG. 6) in the multisensor input data structure associated with the second touch sensor. In some embodiments, the processing device may compare the first input and the second input with data in the multisensor input data structure to determine whether the first input and the second input match any entries of the multisensor input data structure, and compare the entries for the first input and the entries for the second input with each other to find matching entries. In some embodiments, the processing device may compare the second input with data in the entries of the multisensor input data structure that match the first input. Matching entries for the first input and the second input or data for the second input in entries for the first input may indicate that the first input and the second input define a multisensor input in the multisensor input data structure. It is possible that either the first input and/or the second may be identified as part of any number of multisensor inputs, but not for the same definition of a multisensory input in combination. No matching entries for the first input and the second input or data for the second input in entries for the first input may indicate that the first input and the second input do not define a multisensor input in the multisensor input data structure.

In response to determining that the first input from the first touch sensor and the second input from the second touch sensor do not combine as a multisensor input (i.e., determination block 804="No"), the processing device may determine that the first input and the second input are single sensor inputs in block 716.

In response to determining that the first input from the first touch sensor and the second input from the second touch sensor do combine as a multisensor input (i.e., determination block 804="Yes"), the processing device may execute a multisensor input response in block 718.

Figure 9:
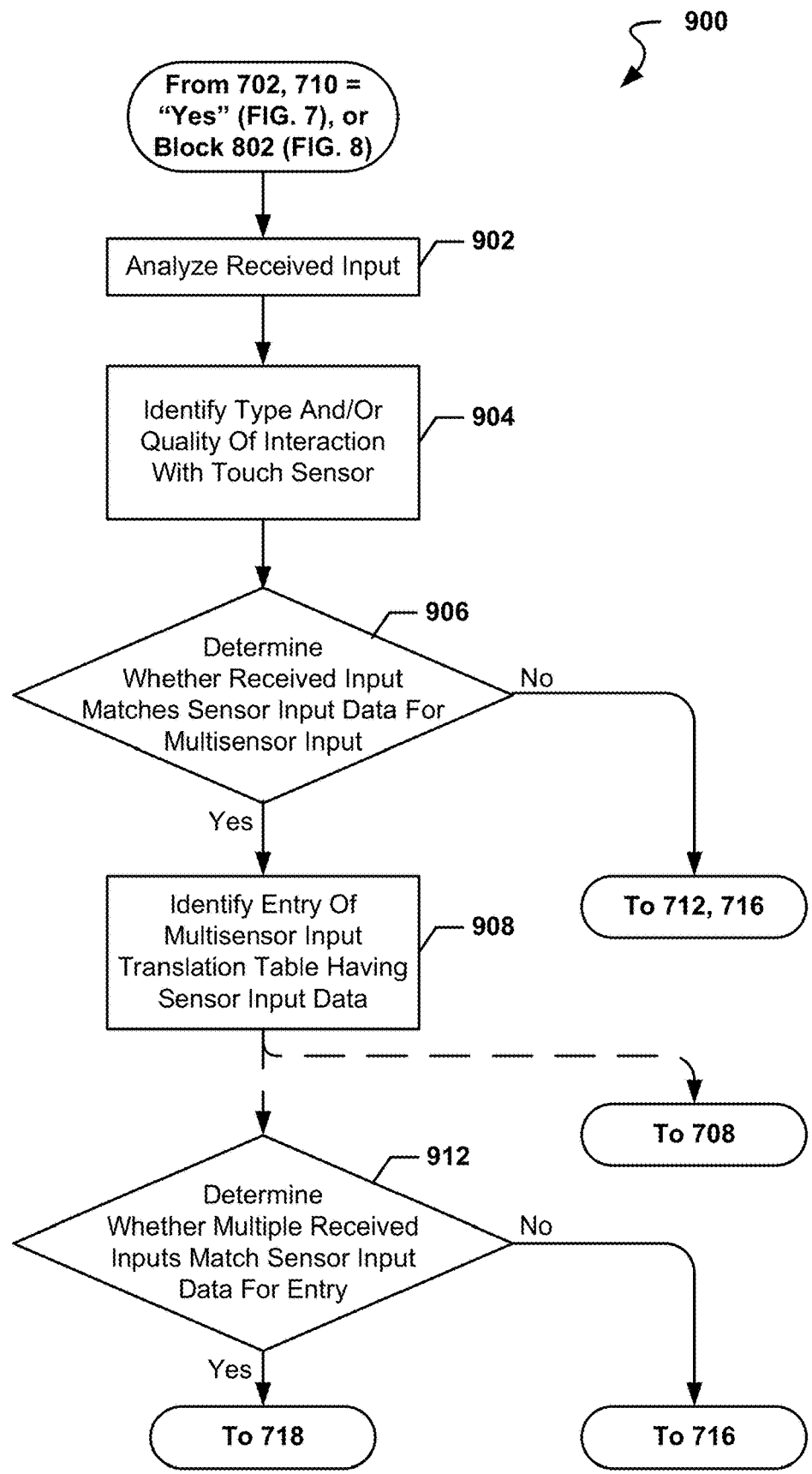
FIG. 9 is a process flow diagram illustrating a method of determining whether received inputs are multisensor inputs are according to various embodiments.

FIG. 9 illustrates a method 900 of determining whether received inputs are multisensor inputs are according to various embodiments. With reference to FIGS. 1A-9, the method 900 may be implemented in hardware components and/or software components of the mobile computing device (e.g., 100, 300 in FIGS. 1A-3), the operation of which may be controlled by one or more processors (e.g., the general-purpose processor 306) of the mobile computing device. In order to encompass the alternative configurations enabled in various embodiments, the hardware implementing the method 900 is referred to herein as a "processing device."

In block 902, the processing device may analyze a received input from a touch sensor (e.g., touch sensor 102, 104, 106a, 106b, 108, 327 in FIGS. 1A-3). The received input may be any of the first input received from the first touch sensor and the second input received from the second touch sensor as described herein with reference to blocks 702, 706, and 802 of the methods 700, 800 in FIGS. 7 and 8. The received input may actually include multiple received inputs that combine to make a single user interaction with the touch sensor. As described herein, the received input may include signals or data configured to indicate qualities of the interactions with the touch sensors, such as location, area, duration, direction, speed, pressure, number, frequency, or sequence of interactions with the touch sensor. The processing device may identify the received input any of the qualities indicated by the received input. The processing device may also derive qualities of the received input from the identified qualities of the received input. For example, the identified qualities of the received input may include only location of the user interaction with a touch sensor, which may indicate a touch sensor in an array of touch sensors or a location on a touch sensor. Multiple locations may be included in the received input. The processing device may determine the changes in the locations of the received input in relation to time. From the changes in the locations of the received input in relation to time, the processing device may determine qualities of the received input. Multiple non-exhaustive or limiting examples follow. The processing device may determine a duration of the received input based on a time for which locations are recorded. The processing device may determine a direction of the received input based on changes in the location. The processing device may determine a speed of the received input based on changes in location in relation to time. The processing device may determine an area covered by the received input based on the locations recorded. The processing device may determine a pressure at location of the received input based on a pattern of the locations recorded with reference to time. The processing device may determine a number of interactions with the touch sensor of the received input based on a pattern of locations and lack of locations recorded. The processing device may determine a frequency of the interactions with the touch sensor of the received inputs based on a pattern of locations and lack of locations recorded with reference to time. The processing device may determine a sequence of the interactions with the touch sensor of the received inputs based on a pattern of locations and lack of locations recorded and other received or derived qualities with reference to time. The qualities of the received input may be derived using various techniques, algorithms, or heuristics.

In block 904, the processing device may identify a type and/or a quality of the interaction with the touch sensor. Based on the analysis of the received input, the processing device may determine aspects of the interaction with the capacitive input senor that may indicate the type and/or quality of the interaction with the touch sensor. The processing device may determine multiple non-exhaustive or limiting examples of types and/or a qualities for the interaction with the touch sensor including: a tap; a strong tap; a quick tap; multiple taps; a location of a tap; a press; a duration of a press; a pressure of a press; a location of a press; a swipe; a single finger swipe; a multiple finger swipe; a speed of a swipe, a length of a swipe, a location of a swipe; a gesture; a shape of the gesture; a hover; a height of a hover; a duration of a hover; a location of a hover; a grip; a handedness of a grip, a number of hands or fingers used for a grip, a location of a grip; a pressure of a grip; or an area of a grip; a part of a body or object used to make the interaction. The qualities and/or types of the interactions with the touch sensor may be derived using various techniques, algorithms, or heuristics.

In determination block 906 the processing device may determine whether the received input matches sensor input data for a multisensor input. As described herein, the mobile computing device may include a multisensor input data structure (e.g., multisensor input translation table 600 of FIG. 6) configured to relate the combinations of a user interactions with touch sensors with multisensor input responses (e.g., action data in columns 616, 618 of FIG. 6). The multisensor input data structure may include sensor input data (e.g., sensor data in columns 602, 604, 606 of FIG. 6) that may represent the interactions with the touch sensors, including qualities and/or types of the interactions with the touch sensors. To determine whether the received input matches sensor input data for a multisensor input, the processing device may compare the qualities and/or types of the interactions with the touch sensors of the received input and the sensor input data in the multisensor input data structure. The processing device may determine whether the qualities and/or types of the interactions with the touch sensors of the received input matches any of the sensor input data.

In response to determining that the received input does not match any sensor input data for a multisensor input (i.e. determination block 906="No"), the processing device may determine that the received input is a single sensor input in block 712, described herein with reference to the method 700 in FIG. 7, or the processing device may determine that multiple received inputs are single sensor inputs in block 716, described herein with reference to the method 700 in FIG. 7 or the method 800 in FIG. 8.

In response to determining that the received input does match any sensor input data for a multisensor input (i.e. determination block 906="Yes"), the processing device may identify a multisensor input having the sensor input data in block 908. As described herein, the multisensor input data structure may include entries (e.g., row 620, 622, 624, 626, 628, 630 of FIG. 6) relating the sensor input data with a multisensor input response. From matching the received input with sensor input data, the processing device may identify the entries in the multisensor input data structure having the sensor input data. The entries may correspond to multisensor inputs defined by the sensor input data for the entry.

In some embodiments, in which only one input is received, the processing device may wait for a second input from a second touch sensor in block 708, as described herein with reference to the method 700 in FIG. 7.

In some embodiments, in which only multiple inputs are received, the processing device may determine whether multiple received inputs match sensor inputs data for an entry in determination block 912. From matching the received inputs with sensor input data, the processing device may identify the entries in the multisensor input data structure having the sensor input data for multiple received inputs. The entry having the sensor input data for multiple received inputs may correspond to multisensor inputs defined by the sensor input data for the entry.

Figure 10:
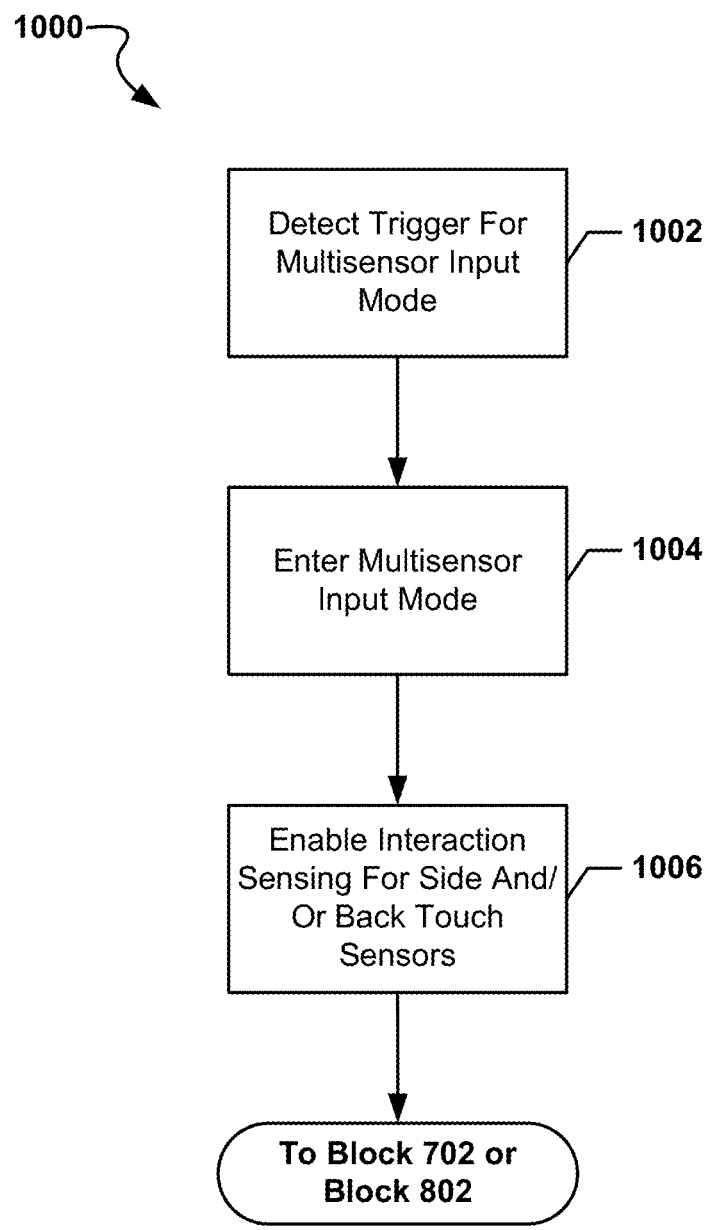
FIG. 10 is a process flow diagram illustrating a method of enabling a multisensor input mode for managing multisensor inputs according to various embodiments.

FIG. 10 illustrates a method 1000 of enabling a multisensor input mode for managing multisensor inputs according to various embodiments. With reference to FIGS. 1A-10, the method 1000 may be implemented in hardware components and/or software components of the mobile computing device (e.g., 100, 300 in FIGS. 1A-3), the operation of which may be controlled by one or more processors (e.g., the general-purpose processor 306) of the mobile computing device. In order to encompass the alternative configurations enabled in various embodiments, the hardware implementing the method 1000 is referred to herein as a "processing device."

In block 1002, the processing device may detect a trigger for a multisensor input mode. The multisensor input mode may be configured to enable processing of user interactions with touch sensors (e.g., touch sensor 102, 104, 106a, 106b, 108, 327 in FIGS. 1A-3) that otherwise may not be enabled to detect some or any user interaction. Such touch sensors may include capacitive inputs sensors of surfaces or areas (e.g., front area 112, rear area 114, sides 116a, 116b, and top area 118 in FIGS. 1A and 1B) of the mobile computing device that are not the front or touchscreen of the mobile computing device.

In some embodiments, the trigger may be a received input from a user interaction with a touch sensor, including a touch sensor configured to detect a specific user interaction to trigger the multisensor input mode but that otherwise may not be enabled to detect some or any other user interaction. For example, a unique grip for which the user places the middle and index finger close together, which is not the normal way for holding the mobile computing device. In another example, a unique tap or back/side gesture may trigger listening for other back/side gestures. In other words, the processing device may only be watching for a hard back tap, which is not normally associated with a standard holding grip. Once this unique tap is identified, then the processing device may start listening for other kinds of back/side touches.

In some embodiments, the trigger may be a signal or data received by the processing device representing a device parameter, which may be referred to as device parameter data. The device parameter data may represent any number and combination of mobile computing device parameters other than interactions with a touch sensor. For example, device parameter data may include readings or signals from other sensors of the mobile computing device, such as a light sensor, an accelerometer, a gyroscope, a temperature sensor, a voltage and/or current sensor, an infrared sensor, etc. Device parameter data may include location data of the mobile computing device, such as global positioning system (GPS) data. Device parameter data may include wired or wireless connection data of the mobile computing device, such as cellular, Wi-Fi, Bluetooth, near-filed communication (NFC), etc., or wired peripheral device connection data, including status of a connection or identification of a device to which the mobile computing device is connected. Device parameter data may include mobile computing device state data, such as a power state (e.g., full, low, charging, specific battery charge or power level, etc.) or an activity state (e.g., active, sleep, hibernate, etc.) of the mobile computing device. In some embodiments, the trigger may include a signal or instruction processed by the processing device as part of implementation of an application executing on the mobile computing device. In some embodiments, the trigger may be a number or combination of received inputs, device parameters, or application related signals or instructions.

In block 1004, the processing device may enter a multisensor input mode. The processing device may determine and load multisensor input data structures (e.g., multisensor input translation table 600 of FIG. 6) configured to interpret user interactions with the multiple capacitive sensor inputs of the mobile computing device. In some embodiments, the processing device may enter the multisensor input mode for different purposes depending on the trigger received, which may prompt the processing device to determine and load a multisensor input data structure associated with the specific purpose. For example, a mobile computing device front down on a surface in combination with different user interactions with a touch sensor on a back of the mobile computing device may trigger the multisensor input mode for different purposes. A tap on the touch sensor may activate a home assistant application, while a swipe along a vertical axis of the touch sensor may adjust the volume of a speaker of the mobile computing device. In another example, if the ambient brightness is very high and different from when a display brightness was last set, user interactions with a touch sensor may adjust the display brightness level.

In block 1006, the processing device may enable a touch sensor to detect inputs they could previously not detect and/or the processing device to processes inputs from the touch sensor for which the processing device did not previously process inputs. In some embodiments, a touch sensor may be activated, more frequently monitored, enabled to send inputs to the processing device, or increased in sensitivity, any of which may include enabling a microcontroller (e.g., microcontroller 328 in FIG. 3) or features of a microcontroller associated with the touch sensor. In some embodiments, the processing device may enable itself to process all or more inputs received from the touch sensor, or monitor or increase monitoring of the touch sensor.

After enabling a touch sensor to detect inputs they could previously not detect and/or the processing device to processes inputs from the touch sensor for which the processing device did not previously process inputs, the processing device may receive a first input from a first touch sensor in block 702, as described herein with reference to the method 700 in FIG. 7 or the method 900 in FIG. 9; or the processing device may receive a first input from a first touch sensor and a second input from a second touch sensor in block 802, as described herein with reference to the method 800 in FIG. 8.

Figure 11:
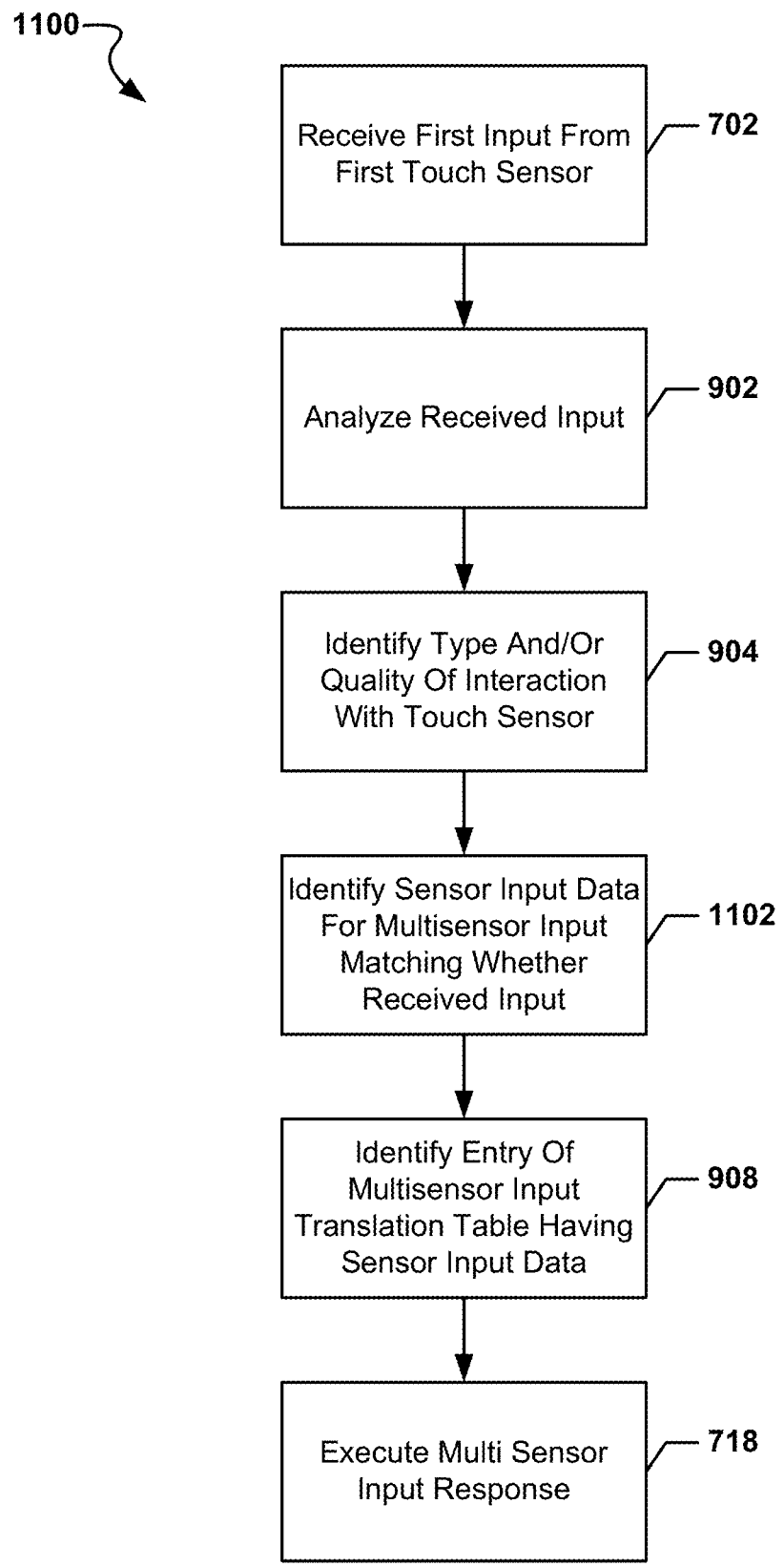
FIG. 11 is a process flow diagram illustrating a method of managing multisensor inputs received in a multisensor input mode according to various embodiments.

FIG. 11 illustrates a method 1100 of managing multisensor inputs received in a multisensor input mode according to various embodiments. With reference to FIGS. 1A-11, the method 1100 may be implemented in hardware components and/or software components of the mobile computing device (e.g., 100, 300 in FIGS. 1A-3), the operation of which may be controlled by one or more processors (e.g., the general-purpose processor 306) of the mobile computing device. In order to encompass the alternative configurations enabled in various embodiments, the hardware implementing the method 1100 is referred to herein as a "processing device."

In some embodiments, blocks 702, 718, 902, 904, 908 may be implemented in manners similar to those described for blocks 702 and 718 with reference to the method 700 in FIG. 7, and blocks 902, 904, 908 with reference to the method 900 in FIG. 9.

In block 702, the processing device may receive a first input from a first touch sensor (e.g., touch sensor 102, 104, 106a, 106b, 108, 327 in FIGS. 1A-3). In block 902, the processing device may analyze a received input from a touch sensor. In block 904, the processing device may identify a type and/or a quality of the interaction with the touch sensor.

In block 1102, the processing device may identify sensor input data (e.g., sensor data in columns 602, 604, 606 of FIG. 6) for a multisensor input matching a received input. As described herein, the mobile computing device may include a multisensor input data structure (e.g., multisensor input translation table 600 of FIG. 6) configured to relate a user interaction with touch sensors with multisensor input responses (e.g., action data in columns 616, 618 of FIG. 6). The multisensor input data structure may include sensor input data that may represent the interactions with the touch sensors, including qualities and/or types of the interactions with the touch sensors. To identify a received input that matches a sensor input data for a multisensor input, the processing device may compare the qualities and/or types of the interactions with the touch sensors of the received input and the sensor input data in the multisensor input data structure. The processing device may determine whether the qualities and/or types of the interactions with the touch sensors of the received input matches any of the sensor input data.

In block 908, the processing device may identify a multisensor input having the sensor input data. In block, 718 the processing device may execute a multisensor input response.

Figure 12:
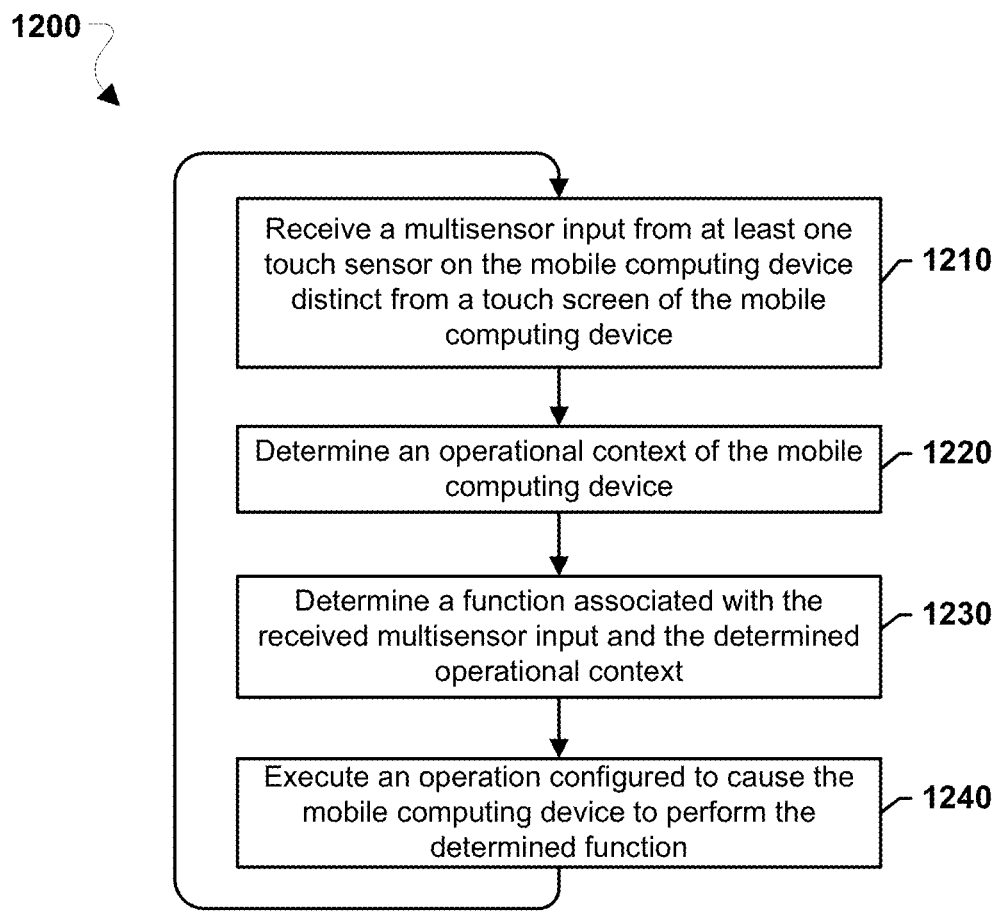
FIG. 12 is a process flow diagram illustrating a method of mapping touch sensor readings to application functions for a mobile computing device according to various embodiments.

FIG. 12 illustrates a method 1200 of mapping touch sensor readings to application functions for a mobile computing device according to various embodiments. With reference to FIGS. 1A-12, the operations of the method 1200 may be implemented in hardware components and/or software components of the mobile computing device (e.g., 100, 300), the operation of which may be controlled by one or more processors (e.g., the general-purpose processor 306 and/or the microcontroller 328) of the mobile computing device.

In block 1210, the processor may receive a multisensor input from at least one touch sensor on the mobile computing device distinct from a touch screen of the mobile computing device. For example, a user touching a touch sensor on the mobile computing device, may cause a change in capacitance measured by the touch sensor. The processor may receive the measured change in capacitance as a multisensor input. The received measurements may reflect characteristics of various types of input including a duration of contact, a number of contact points, a size of the contact point(s), a sequence or contiguous series of contacts, a pattern of simultaneous contacts, and a level of pressure or force applied during the contact. For example, as part of gripping the mobile computing device, a user touching a back-panel touch sensor, located on a back housing (e.g., rear area 114) of the mobile computing device, may cause a recognizable change in capacitance associated with a gripping event. As a further example, a user making a gesture on the back-panel touch sensor, like a curved swipe across a portion of the back housing, may cause a different recognizable change in capacitance associated with that gesture.

In block 1220, the processor may determine an operational context of the mobile computing device using contextual awareness data. Contextual awareness data may include information from various sources helpful for defining the circumstances that form the setting (i.e., the operational context) in which the multisensor input(s) are received. A multisensor input may be intended by a user to execute a first operation in a first operational context, but in a second operational context not to execute the first operation and/or to execute a second operation.

For example, the processor may utilize cues from contextual awareness data to trigger a more comprehensive detection mode for multi-surface touches. Multi-surface touches may include contact with touch sensor on different sides of the mobile computing device. For example, an application currently active on a display of the touchscreen make available additional functions or change a touch sensor detection mode of the mobile computing device. Likewise, a position, orientation, and/or movement of the mobile computing device may provide a trigger to make available additional functions or change a touch sensor detection mode of the mobile computing device. For example, laying the mobile computing device facing flat on a table may trigger a detection mode for multi-surface touches or changes in the detection mode. Also, shaking the mobile computing device may trigger a mode that allows the user to use multi-surface touches to execute functions. As a further example, a processor may utilize environmental characteristics to trigger a particular detection mode of multi-surface touches. For example, if ambient brightness is very high and different from when the display brightness was last set, then a detected touch or movement on a back touch sensor may translate to an adjustment in brightness level.

In block 1230, the processor may determine a function (e.g., a first function) associated with the multisensor input received in block 1210 and the operational context determined in block 1220. The determination in block 1230 may involve identifying or selecting a particular multisensor input translation table or set of tables that is/are appropriate for use for the determined operational context. The appropriate multisensor input translation table(s) may provide a correlation between the multisensor input(s) receive from one or more touch sensors, and a function the processor may perform or causes another component of the mobile computing device to perform. The processor may obtain the particular translation table(s) from memory (e.g., 314 in FIG. 3). Alternatively, or additionally, the determination in block 1230 may involve cascading rules set and/or parametric method that applies the determined operational context and the received multisensor input to determine the function.

In block 1240, the processor may execute an operation configured to cause the mobile computing device to perform the function determined in block 1230. The executed operation may change settings controlling touch sensors, change which multisensor input translation table is used, or change a function associated with touch sensors. For example, a user performs a first "trigger" gesture on the back of the mobile computing device. Once the processor recognizes the trigger gesture, within a predetermined period the processor may receive a shortcut gesture configured to launch a particular application on the mobile computing device, in the next few seconds. Additionally, or alternatively, the executed operation may change other settings of the mobile computing device. Further, the executed operations may transmit a message and/or instruction to another component for executing the determined function. For example, to perform operations associated with the mobile computing device generally and/or applications active on the mobile computing device.

In some embodiments, the processor may repeat the operations of the method 1200 to map further touch sensor readings to application functions for a mobile computing device. Executing the operations of the method 1200 may change the operational context, thus changing or making available additional functions associated with received multisensor inputs. For example, the multisensor input received in block 1210 may represent a unique grip on the mobile computing device, like the user placing the middle and index finger close together, which is not the normal way of holding the mobile computing device. In addition, an operational context of the mobile computing device may include a state in which multi-surface contact is not recognized as an input function (i.e., multi-surface controls are off). In this way, receiving multisensor inputs corresponding to the unique grip when multi-surface controls are off may trigger an operation in block 1240 that turns multi-surface controls on. As another example, the multisensor input received in block 1210 may represent a unique tap or back/side gesture configured to unlock other back/side gestures. In this way, the device may be configured to monitor for a hard back-tap (which is not normally associated with a standard holding grip). Once such a hard back-tap is identified, then the processor may monitor for other kinds of back/side touches that trigger recently unavailable functions. Similarly, a unique tap or back/side gesture may trigger the processor to listen for other subsequent back/side gestures. For example, the processor may always monitor for a particular capacitive profile, like from a hard tap on a back of the mobile computing device, which is not normally associated with a standard grip on the device. Once that particular capacitive profile is detected, then the processor may start monitoring for other kinds of capacitive profiles.

The processor may repeat the operations of the method 1200 in response to receipt of additional multisensor inputs in block 1210. As another example, the processor may repeat the operations of the method 1200 for a predefined number of iterations or a predefined period indicated in parameters associated with an active application on the mobile computing device.

Figure 13:
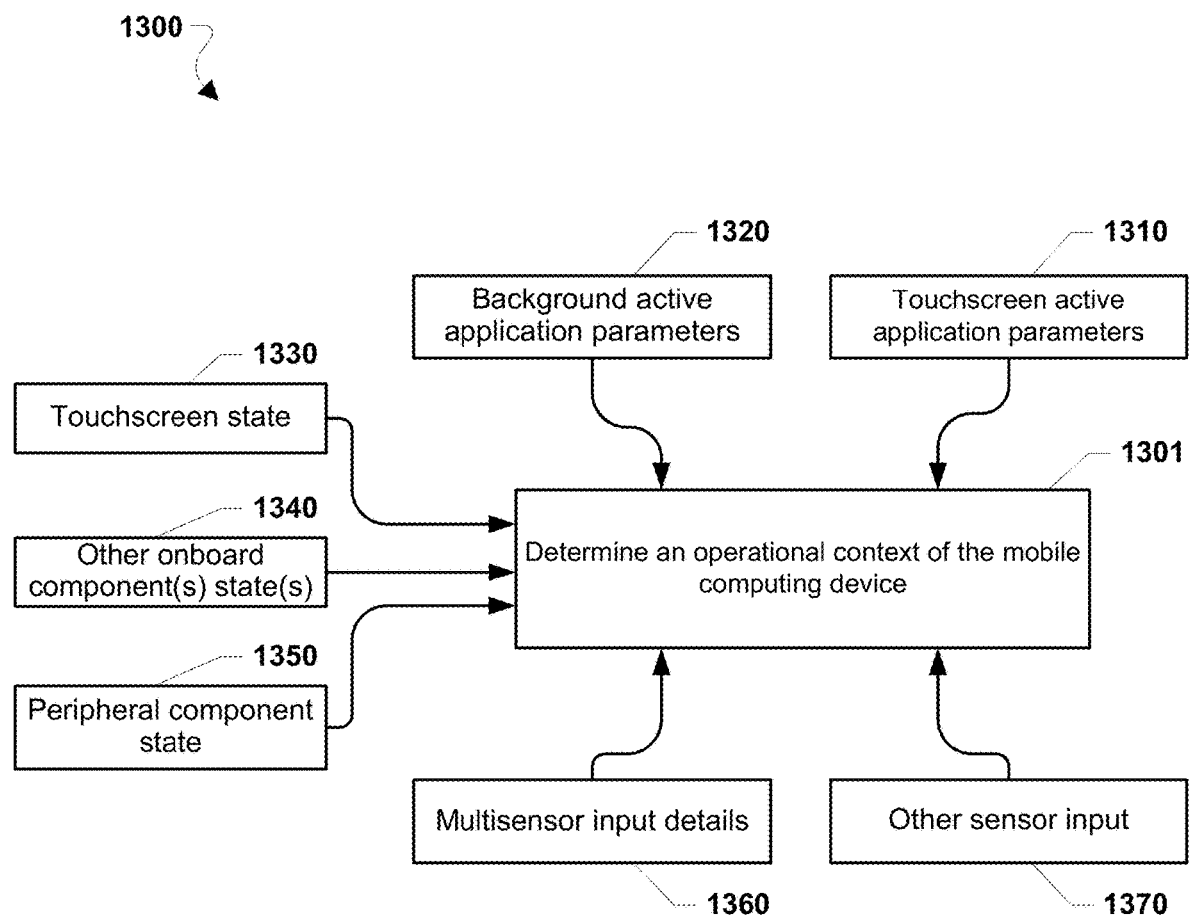
FIG. 13 is a process flow diagram illustrating a method of determining an operational context of the mobile computing device using contextual awareness data

An example method 1300 of determining an operational context of the mobile computing device using contextual awareness data is shown in FIG. 13. In some embodiments, the method 1300 may represent a more detailed view of determining the operational context in block 1120 of method 1100 (FIG. 11). The operational context of the mobile computing device may be determined by combining or fusing, by an inference engine, a plurality of data associated with received inputs, parameters from one or more active applications, and/or state information from one or more components associated with the mobile computing device, such as a multitude of different types of data relevant to conditions under which multisensor inputs are received. In some embodiments, the inference engine can combine or fuse both real-time and non-real time contextual awareness data associated with conditions under which multisensor inputs are received in order to determine the operational context.

Contextual awareness data may include any suitable type of real-time and/or non-real-time data associated with the mobile computing device, such as, for instance, touchscreen active application parameters 1310, background active application parameters 1320, a touchscreen state 1330, other onboard component(s) state(s), a peripheral component state 1350, multisensor input details 1360, other sensor inputs 1370, and any other suitable contextual awareness data, and/or any combination thereof. The touchscreen active application parameters 1310 may include a list of available or currently permissible inputs for an application actively controlling all or part of a display on the touchscreen that may be received as a multisensor input. For example, while reading an email (i.e., an active application), if the user turns the mobile computing device sideways and grasps it with two thumbs on the front and supports it on the back, then the touchscreen may immediately change to a landscape keyboard and provide the user interface for receiving inputs that may be used to reply to that email. As another example, front and back touches may be used to complement each other's slightly different affordances. For example, in a text message, a user tapping on the touchscreen may place a cursor at a certain word display where the user tapped. The user may then touch a back surface of the mobile computing device to more finely position the cursor between words or letters. This exploits the relative advantages of each side: Using combinations of front and side touch inputs may be useful to allow a user to find the touch target and then touch it directly. Back touch may enable the user to move a selector or cursor in a fine-grained manner without the finger on the front being in the way. Similarly, with a photo gallery application active, a swipe rearward facing touch sensor may move a highlighted frame among a grid of pictures. Thereafter, a tap gesture may select or show a context menu.

The background active application parameters 1320 may include a list of available or currently permissible inputs for an application actively running on the mobile computing device, but not actively controlling all or part of a display on the touchscreen that may be received as a multisensor input. The touchscreen state 1330 may provide information regarding whether the touchscreen is on, off, dimmed, or in some other state. For example, with the touchscreen in an off state, received multisensor inputs may be intended for a particular background application. Similarly, other onboard component(s) state(s) 1340, like the remaining charge in a battery of the mobile computing device or whether the mobile computing device is in a power conservation mode, may provide information regarding whether multisensor inputs should be ignored or whether touch sensors, other than the touchscreen, should be turned off The peripheral component state 1350 may provide information regarding whether multisensor inputs may be intended to control that peripheral component. For example, if virtual reality googles or an audio headset are operatively coupled to the mobile computing device, received multisensor inputs may be used to control such peripheral components. The multisensor input details 1360 may include the capacitive profile associated with the multisensor input and identify which touch sensor(s) or which part of one or more particular touch sensors detected the change in capacitance. The other sensor input 1370 may provide information from other sensors of the mobile computing device that may be used for determining an operational context of the mobile computing device. For example, proximity, orientation, and/or motion sensors may be used to recognize the mobile computing device is face down on a surface, in a pocket, moving, stationary, or in some other situation that may inform a current operational context of the mobile computing device.

In some embodiments, in addition to using contextual awareness data, the inference engine may use relevant data (e.g., real-time, non-real time, or a combination thereof) that are not only associated with multisensor inputs or determining the operational context. For example, the inference engine can use real time of day, date, location, and other similar information that may be helpful for determining a current operational context of the mobile computing device.

All this information may be used by an inference engine 1301 to determine a current operational context. For example, inference engine 1301 can generate a contextual assessment corresponding to the determined operational context. The contextual assessment may then be used to determine what to do with received multisensor inputs.

In some embodiments, the inference engine 1301 may utilize a state machine (e.g., deterministic rule based and/or a statistical state machine) to analyze data, e.g., data from available resources such as 1310, 1320, 1330, 1340, 1350, 1360, 1370, and infer decisions on the operational context. The rule base and the statistical state machine of the inference engine may be trained off line, on-line, or partly off-line and on-line. In addition, the inference engine 1301 may also exchange information with a knowledge support system or other remote data source, in determining the operational context.

Figure 14:
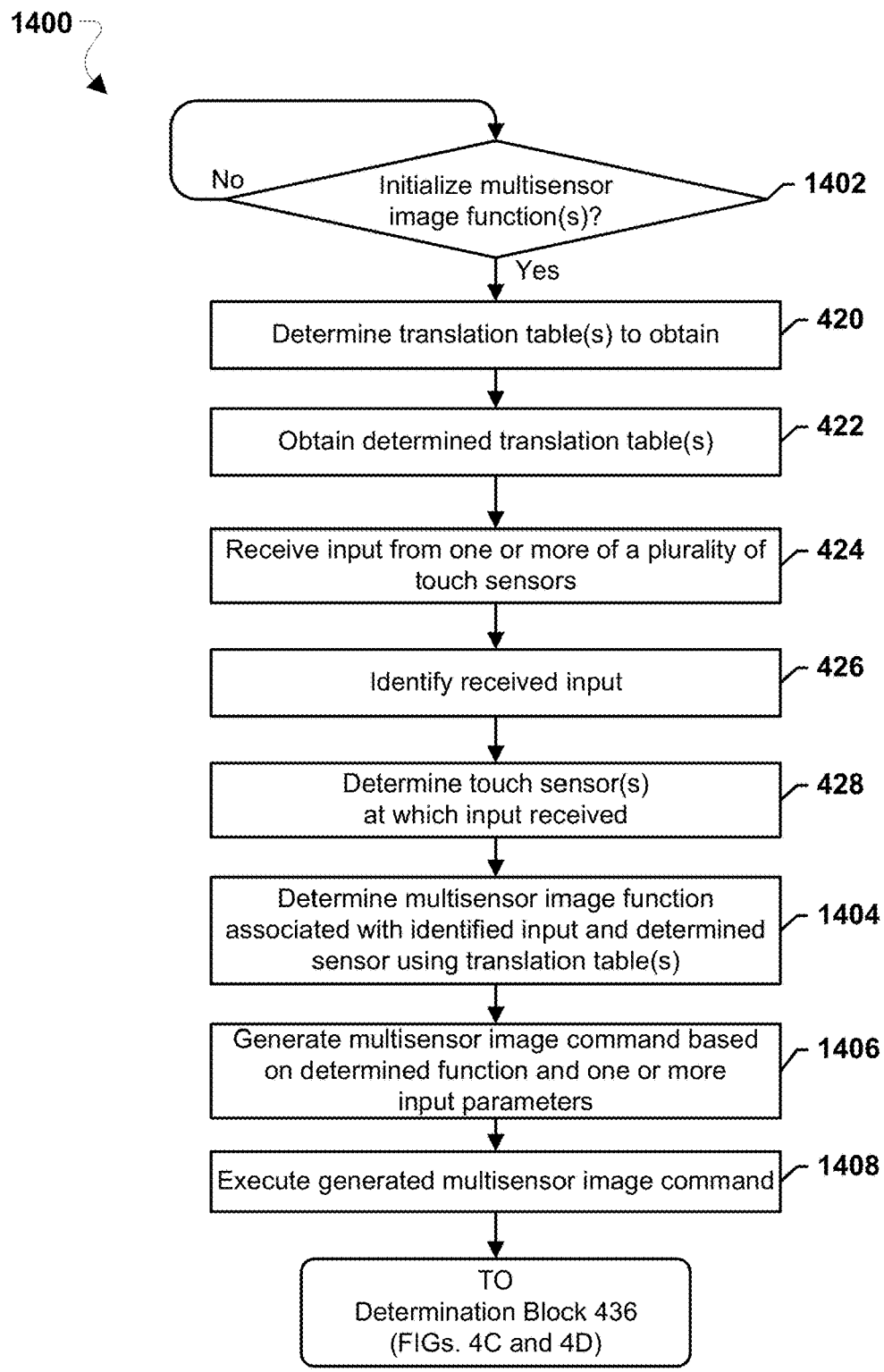
FIG. 14 is a process flow diagram illustrating a method of managing multisensor controls of a mobile computing device with respect to a photo application according to some embodiments.

FIG. 14 illustrates a method 1400 of managing multisensor controls of a mobile computing device with respect to multisensor image functions according to some embodiments. With reference to FIGS. 1A-14, the method 1400 may be implemented in hardware components and/or software components of the mobile computing device (e.g., 100, 300), the operation of which may be controlled by one or more processors (e.g., the general-purpose processor 306) of the mobile computing device. In blocks 420-428, the processor of the mobile computing device may perform operations of like-numbered blocks of the methods 400c or 400d as described.

In determination block 1402, a processor of the mobile computing device may determine whether one or more multisensor image functions has been initialized. Multisensor image functions may include operations that relate inputs to front, back, side, top, etc. touch sensors to particular actions or functionality to be performed with or to one or more images displayed on the mobile computing device. In various embodiments, elements of an image may be analyzed and segmented such that the various segmented images may be selected, manipulated, and/or operated upon. In some embodiments, elements of an image may be segmented into foreground and background elements. In some embodiments, elements of a foreground or background may be individually selected, manipulated, and/or operated upon. As one example, applications configured to handle or manipulate images may invoke multisensor image functions, such as a photo gallery application to display image files stored in a memory of the mobile computing device, a camera application to control operations of a camera device and processing of images captured with the camera, a photo editing application configured to alter one or more embodiments of an image file, or another similar application. As another example, operating system applications, such as those configured to handle or manipulate static or animated backgrounds (e.g., "wallpaper"), foreground elements (e.g., selectable elements such as icons and the like), etc. may invoke multisensor image functions.

In response to determining that the multisensor image function(s) have not been initialized (i.e., determination block 1402="No"), the processor may again determine whether the multisensor image function(s) have been initialized in determination block 1402.

In response to determining that the multisensor image function(s) have been initialized (i.e., determination block 1402="Yes"), the processor may determine one or more translation tables to obtain in block 420. This determination may involve identifying or selecting a particular translation table(s) that is appropriate for use with the multisensor image function(s). The appropriate translation table(s) may provide a correlation between inputs received at one or more touch sensors and a multisensor image function. The processor may obtain the determined one or more translation tables from memory in block 422.

In block 1404, the processor may determine a multisensor image function associated with the identified input and the determined touch sensor using the one or more translation tables. In some embodiments, the processor may determine a multisensor image function associated with an input to a rear touch sensor (e.g., the touch sensor 104) and/or a front touch sensor (e.g., the touch sensor 102) based on the obtained translation table(s). In some embodiments, the processor may translate an input to the front and/or back touch sensor(s) to different multisensor image functions.

For example, the processor may translate an input detected by a front input sensor (e.g., a touchscreen display) into a photo application function to be performed on a foreground of an image presented on the touchscreen display. As another example, the processor may translate an input detected by a rear area input sensor (e.g., a rear area touch sensor) into a photo application function to be performed on a background of an image presented on the touchscreen display. Thus, in this embodiment, a user may adjust the foreground image and the background image without having to switch between the two images.

For example, a photo application function to be performed on the background of the image may include altering the background (e.g., only the background) of the image. In some embodiments, the photo application may be configured to distinguish between foreground elements and background elements of the image. In some embodiments, altering the background of the image may include adjusting a color, a tone, a hue, a level of blur, a level of sharpness, a level of brightness, applying a filter, or another similar adjustment, including combinations thereof. In some embodiments, altering the background of the image may include scrolling through different background images over which the foreground may appear. In some embodiments, altering the background of the image may include changing the position of the background with respect to the foreground. In some embodiments, altering the background of the image may include selecting one or more elements of the background of the image, for example, to perform one or more alterations on the selected element(s). Other examples are possible, including combinations of the foregoing.

As another example, the photo application function for the foreground of the image may include altering the foreground (or only the foreground) of the image. Examples of such alterations may include adjusting a color, a tone, a hue, a level of blur, a level of sharpness, a level of brightness, applying a filter, or another similar adjustment, including combinations thereof; scrolling through different foreground images that may appear over the background; changing the position of the foreground with respect to the background. In some embodiments, altering the foreground of the image may include selecting one or more elements of the foreground of the image, for example, to perform one or more alterations on the selected element(s). Other examples are possible, including combinations of the foregoing.

As another example, the processor may translate an input detected by a front input sensor (e.g., a touchscreen display) and/or a rear input sensor into an operation performed by an operating system application configured to handle or manipulate wallpaper, styles, icon appearance manipulation, or other elements of a user interface. For example, the processor may translate an input detected by a front input sensor (e.g., a touchscreen display) into an operation to move one or more icons, alter an appearance of one or more icons, alter and arrangement or configuration of one or more icons, and other similar operations. As another example, the processor may translate an input detected by a rear area input sensor (e.g., a rear area touch sensor) into an operation to change a wallpaper or other similar background image, select a background image, alter an aspect of a background image, and other similar operations. Thus, in this embodiment, a user may quickly and easily adjust foreground elements and background elements using multisensor image functions.

As another example, the processor may translate an input detected by a front input sensor (e.g., a touchscreen display) and/or a rear input sensor into an operation performed by a game application to enable a user to interact with foreground elements and background elements of the game using multisensor image functions. For example, the processor may translate an input detected by a front input sensor (e.g., a touchscreen display) into an operation to move, select, change, command, or interact with one or more game foreground elements. As another example, the processor may translate an input detected by a rear area input sensor (e.g., a rear area touch sensor) into an operation to move, select, change, command, or interact with one or more game background elements.

In block 1406, the processor may generate a multisensor image command based on the determined functions and one or more input parameters of the received input.

In block 1408, the processor may execute the generated multisensor image command The processor may then perform the operations of determination block 436 (FIGS. 4C and 4D).

Figure 15:
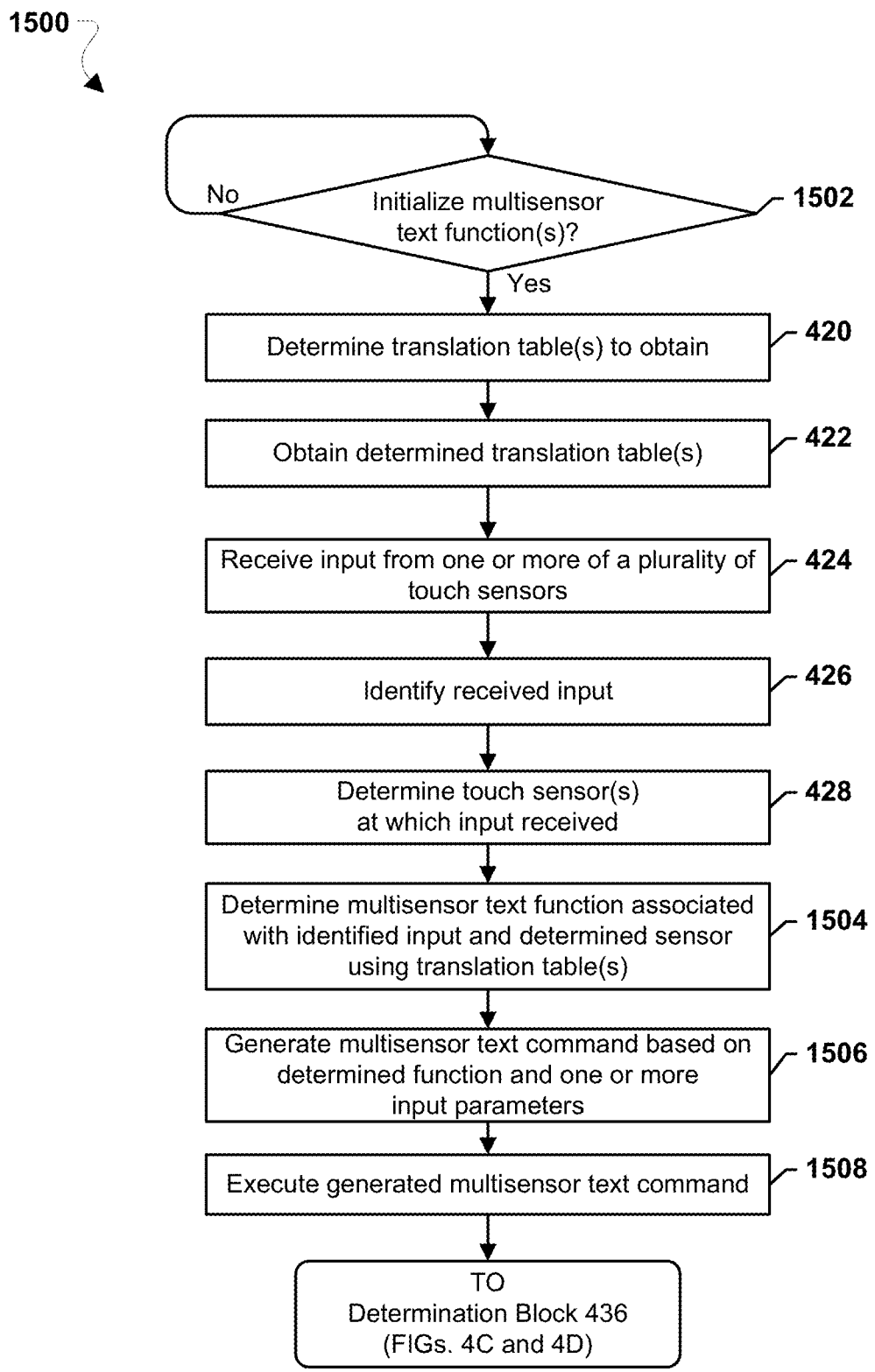
FIG. 15 is a process flow diagram illustrating a method of managing multisensor controls of a mobile computing device with respect to a magnifying glass application according to some embodiments.

FIG. 15 illustrates a method 1500 of managing multisensor controls of a mobile computing device with respect to multisensor text functions according to some embodiments. With reference to FIGS. 1A-15, the method 1500 may be implemented in hardware components and/or software components of the mobile computing device (e.g., 100, 300), the operation of which may be controlled by one or more processors (e.g., the general-purpose processor 306) of the mobile computing device. In blocks 420-428, the processor of the mobile computing device may perform operations of like-numbered blocks of the methods 400c or 400d as described above.

In determination block 1502, a processor of the mobile computing device may determine whether one or more multisensor text functions has been initialized. Multisensor text functions may include operations that really inputs to front, back, side, top, etc. touch sensors to particular actions or functionality to be performed with or to text and/or a background behind text displayed on the mobile computing device. In various embodiments, elements of text or elements the background of may be selected, manipulated, and/or operated upon. In some embodiments, elements of text and/or the background may be individually selected, manipulated, and/or operated upon. As one example, applications that may invoke multisensor text functions include email applications, text messaging applications, word processing applications, Web browsers, and other similar applications. As another example functions within applications may invoke multisensor text functions, for example a "magnifying glass" function. A magnifying glass function may include software instructions for increasing the apparent size of text (and/or an image) within an area of a display (e.g., the touchscreen 326).

In response to determining that the multisensor text function(s) has not been initialized (i.e., determination block 1502="No"), the processor may continue to determine whether the multisensor text function(s) has been initialized in determination block 1502.

In response to determining that the multisensor text function(s) has been initialized (i.e., determination block 1502="Yes"), the processor may determine one or more translation tables to obtain in block 420. This determination may involve identifying or selecting a particular translation table(s) that is appropriate for use with the multisensor text function(s). The appropriate one or more translation tables may indicate a correlation between inputs received at one or more touch sensors and a multisensor text function. The processor may obtain the determined one or more translation tables from memory in block 422.

In block 1504, the processor may determine a multisensor text function associated with the identified input and the determined touch sensor using the one or more translation tables. In some embodiments, the processor may determine a multisensor text function associated with an input to a rear touch sensor (e.g., the touch sensor 104) and/or a front touch sensor (e.g., the touch sensor 102) based on the obtained translation table(s). In some embodiments, the processor may translate an input to the front and/or back touch sensor(s) to different multisensor text function.

For example, the processor may translate an input to a front input sensor (e.g., a touchscreen display) into a function for selecting an area of focus in which text or an image may be "magnified". As another example, the processor may translate an input to a rear area input sensor (e.g., a touch sensor) into a function for moving the text or image underneath the area of focus (e.g., moving the text or image under the "magnifying glass").

As another example, the processor may translate an input to a front input sensor (e.g., a touchscreen display) into a function for selecting a word or area of text. As another example, the processor may translate an input to a rear input sensor (e.g., a touch sensor) into a function for altering or manipulating the selected word or area of text. As another example, the processor may translate an input into the rear input sensor into a function for selecting an operation to be performed on the selected word or area of text. Other examples are also possible, including commendations of the foregoing.

In block 1506, the processor may generate a magnifying glass application command based on the determined functions and one or more input parameters of the received input.

In block 1508, the processor may execute the generated magnifying glass application command The processor may then perform the operations of determination block 436 (FIGS. 4c and 4d).

Figure 16:
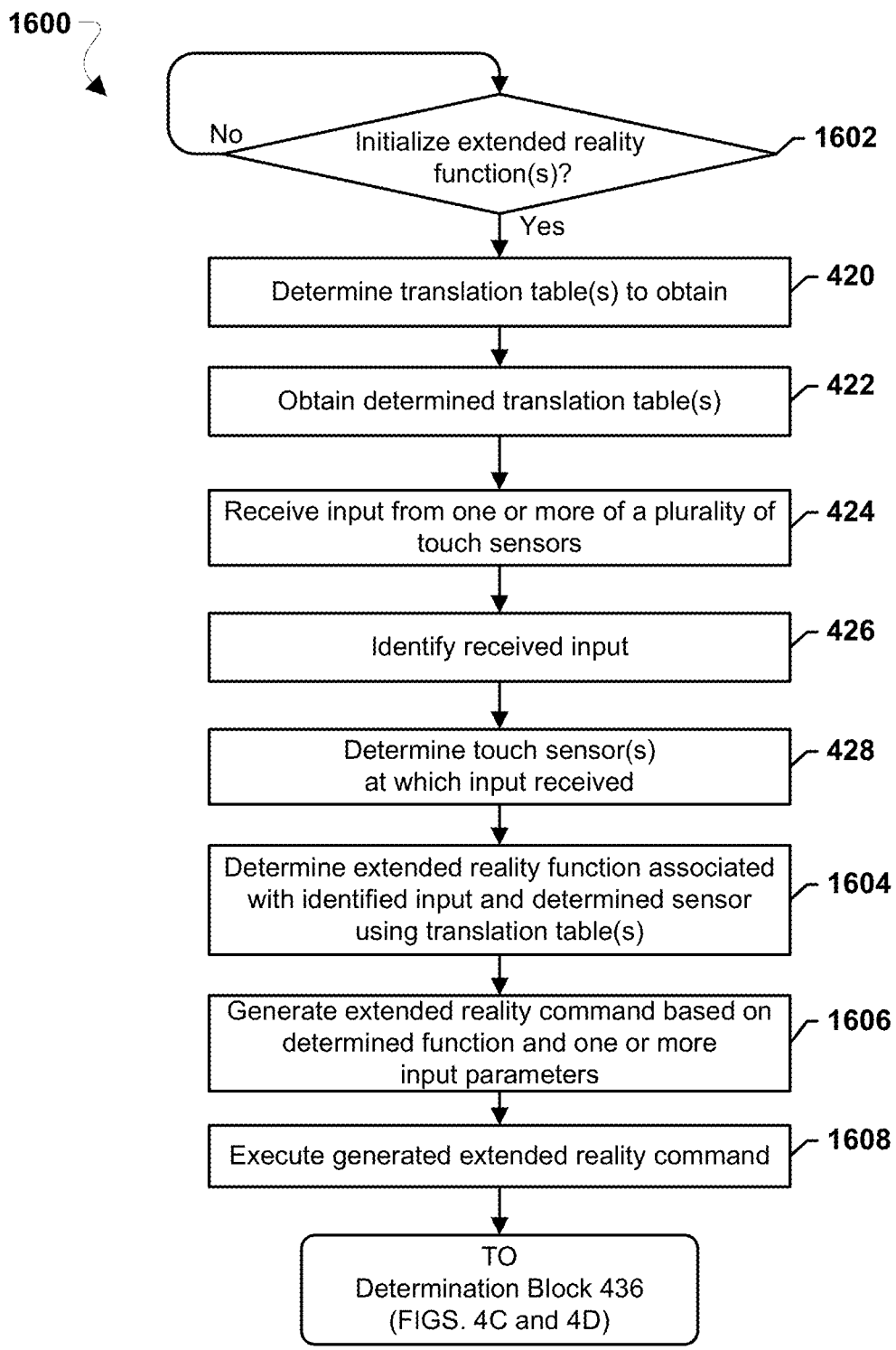
FIG. 16 is a process flow diagram illustrating a method of managing multisensor controls of a mobile computing device with respect to an extended reality application according to some embodiments.

FIG. 16 illustrates a method 1600 of managing multisensor controls of a mobile computing device with respect to extended reality functions according to some embodiments. With reference to FIGS. 1A-16, the method 1600 may be implemented in hardware components and/or software components of the mobile computing device (e.g., 100, 300), the operation of which may be controlled by one or more processors (e.g., the general-purpose processor 306) of the mobile computing device. In blocks 420-428, the processor of the mobile computing device may perform operations of like-numbered blocks of the methods 400c or 400d as described above.

In determination block 1602, a processor of the mobile computing device may determine whether one or more extended reality function(s) has been initialized. In some embodiments, the mobile computing device may communicate with an extended reality device such as an extended reality headset (e.g., the audiovisual device 202). In some embodiments, establishing communication with the extended reality device may include, involve, or trigger an initialization of an extended reality function, and extended reality application running on the mobile computing device, or another similar operation or application. In various embodiments, inputs to a touch sensor on the mobile computing device may control one or more functions of the extended reality device and/or the extended reality application.

In response to determining that the one or more extended reality function(s) has not been initialized (i.e., determination block 1602="No"), the processor may continue to determine whether the extended reality application has been initialized in determination block 1602.

In response to determining that the one or more extended reality function(s) has been initialized (i.e., determination block 1602="Yes"), the processor may determine one or more translation tables to obtain in block 420. This determination may involve identifying or selecting a particular translation table(s) that is appropriate for use with the extended reality functions. The appropriate one or more translation tables may correlate various inputs received one various input sensors to a function of an extended reality application and/or the extended reality device. The processor may obtain the determined one or more translation tables from memory in block 422.

In block 1604, the processor may determine an extended reality function associated with the identified input and the determined touch sensor using the one or more translation tables. In some embodiments, the processor may determine an extended reality function associated with an input to a rear touch sensor (e.g., the touch sensor 104) and/or a front touch sensor (e.g., the touch sensor 102) based on the obtained translation table(s). In some embodiments, the processor may translate an input to the front and/or back touch sensor(s) to different extended reality functions.

In some embodiments, the processor may translate an input to a front input sensor (e.g., a touchscreen display) into an extended reality function to be performed on an element (e.g., a real object) in the real image layer displayed in the extended reality device. In some embodiments, the processor may translate an input to a rear area input sensor (e.g., a touch sensor) into an extended reality function to be performed on an extended reality image element (e.g., a digital object) within the extended reality image layer displayed in the extended reality device.

In some embodiments, an extended reality function to be performed on a real image element, such as a real object, may include zooming into the real object (e.g., magnifying the real object), zooming out from the real object, changing a focus on the real object (e.g., increasing or decreasing a level of focus on a selected or indicated real object), toggling among two or more real objects in view, or other functions, including combinations thereof.

In some embodiments, an extended reality function to be performed on an extended reality image element in the form of a digital object may include any form of interaction with the digital object. Interacting with the digital object may include selecting a digital object (e.g., selecting an image, an icon, text, etc.), scrolling through text, moving a digital object, adjusting or altering the presentation of a digital object, and the like.

In some embodiments, the processor may translate an input to the front and back touch sensor(s) to an extended reality function. For example, the processor may "rotate" a digital object in response to receiving substantially simultaneous inputs to the front and the back touch sensors (e.g., a "swipe" input to the front and back touch sensors, as if a user were "twisting" the mobile computing device).

In block 1606, the processor may generate an extended reality command based on the determined functions and one or more input parameters of the received input.

In block 1608, the processor may execute the generated extended reality command In some embodiments, the processor may send, issue, transmit, etc. the generated command to the extended reality device. In some embodiments, the processor of the extended reality device may execute the command from the processor of the mobile computing device.

The processor of the mobile computing device may then perform the operations of determination block 436 (FIGS. 4C and 4D).

Figure 17:
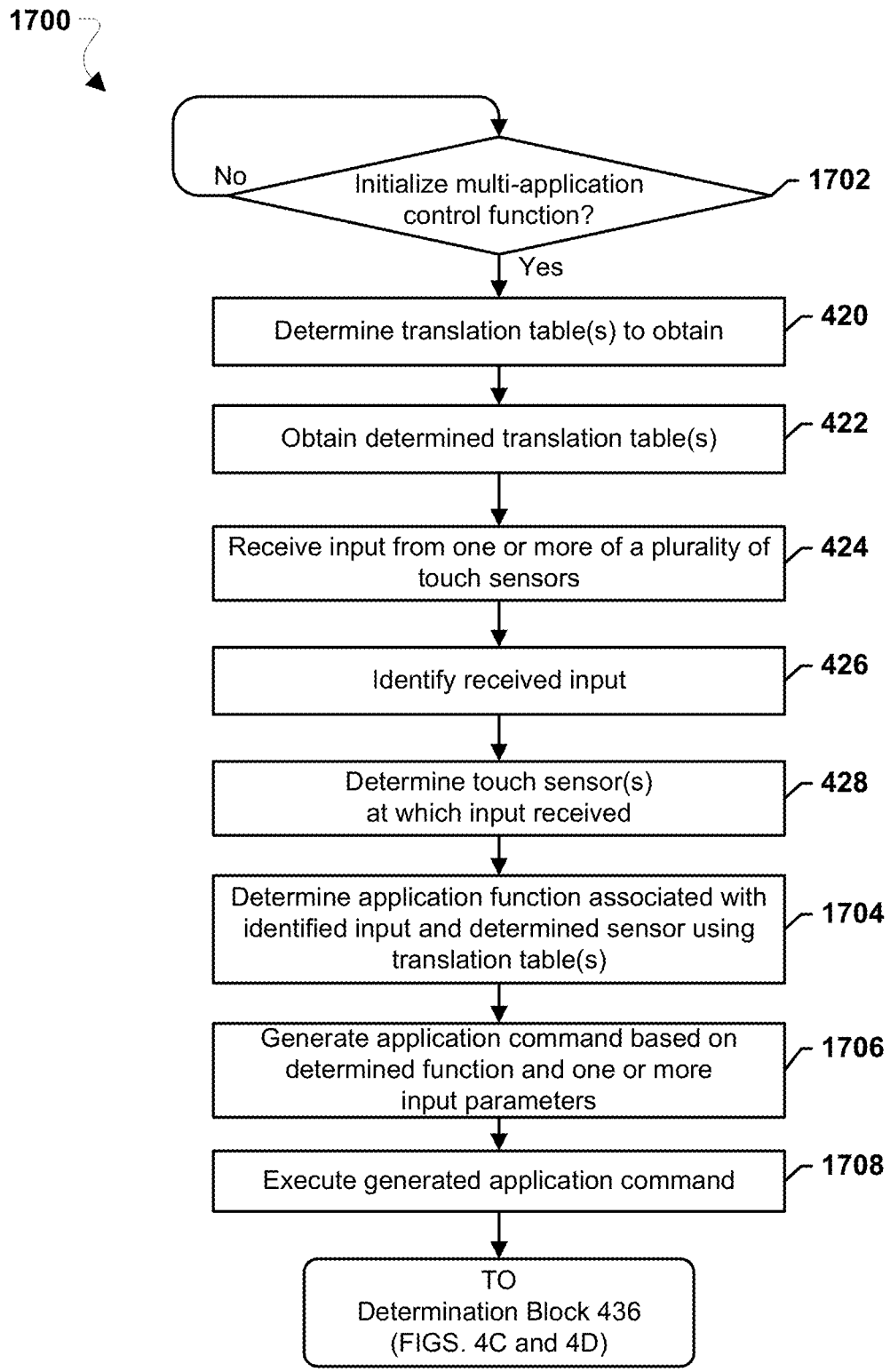
FIG. 17 is a process flow diagram illustrating a method of managing multisensor controls of a mobile computing device with respect to controlling multiple applications based on inputs to various touch sensors of the mobile computing device according to some embodiments.

FIG. 17 illustrates a method 1700 of managing multisensor controls of a mobile computing device with respect to controlling multiple applications based on inputs to various touch sensors of the mobile computing device according to some embodiments. With reference to FIGS. 1A-17, the method 1700 may be implemented in hardware components and/or software components of the mobile computing device (e.g., 100, 300), the operation of which may be controlled by one or more processors (e.g., the general-purpose processor 306) of the mobile computing device. In blocks 420-428, the processor of the mobile computing device may perform operations of like-numbered blocks of the methods 400c or 400d as described above.

In determination block 1702, a processor of the mobile computing device may determine whether a multi-application control function has been initialized. In some embodiments, the mobile computing device may execute, run, etc. two or more software applications independently and without the need for changing selections, interface menus, etc. In some embodiments, executing two or more such applications at or near the same time may trigger an initialization of the multi-application control function. In various embodiments, inputs to a touch sensor on the mobile computing device may control one or more functions of the first application or a second application.

In response to determining that the multi-application control function has not been initialized (i.e., determination block 1702="No"), the processor may continue to determine whether the multi-application control function has been initialized in determination block 1702.

In response to determining that the multi-application control function has been initialized (i.e., determination block 1702="Yes"), the processor may determine one or more translation tables to obtain in block 420. This determination may involve identifying or selecting a particular translation table(s) that is appropriate for use with the two applications. The appropriate translation table(s) may provide a correlation between inputs received at one or more touch sensors and a function of the first application or the second application. The processor may obtain the determined one or more translation tables from memory in block 422.

In block 1704, the processor may determine an application function (i.e., of the first or second application) associated with the identified input and the determined touch sensor using the one or more translation tables. In some embodiments, the processor may determine an application function associated with an input to a rear touch sensor (e.g., the touch sensor 104) and/or a front touch sensor (e.g., the touch sensor 102) based on the obtained translation table(s). In some embodiments, the processor may translate an input to the front and/or back touch sensor(s) to different application functions.

In some embodiments, the processor may translate an input to a front input sensor (e.g., a touchscreen display) into an application function to be performed within or for the first application. In some embodiments, the processor may translate an input to a rear area input sensor (e.g., a touch sensor) into an application function to be performed within or for the second application.

For example, the first application may be a game application that is controlled based on inputs to the front sensor. As another example, the second application may be a phone application that, for example, presents a notification of an incoming call request. The processor may translate an input to the rear area input sensor (e.g., a touch sensor) into a function of the phone application, for example, to accept the call, reject the call, respond to the call with a text message, and the like. In some embodiments, the processor may translate an input to the rear area input sensor (e.g., a touch sensor) into a function of the phone application to control an ongoing or established communication session, such as to mute a microphone of the mobile computing device, to increase or decrease a speaker volume, or another similar phone application function.

As another example, the second application may present a notification over or within the first application. For example, a calendar application may present an event reminder, or a text message application may present a notification of the received text message, over a currently-used "foreground" application. The processor may translate an input to the rear area input sensor (e.g., a touch sensor) into a function for interacting with the notification, such as to dismiss the notification, select the notification, switch to using the application that generated the notification, and the like. The processor may translate an input to the front input sensor (e.g., a touchscreen display) into a function for interacting with the currently-used application.

In block 1706, the processor may generate an application command based on the determined functions and one or more input parameters of the received input.

In block 1708, the processor may execute the generated application command In some embodiments, the processor may execute generated application command within the specified first or second application.

The processor of the mobile computing device may then perform the operations of determination block 436 (FIGS. 4C and 4D).

Figure 18:
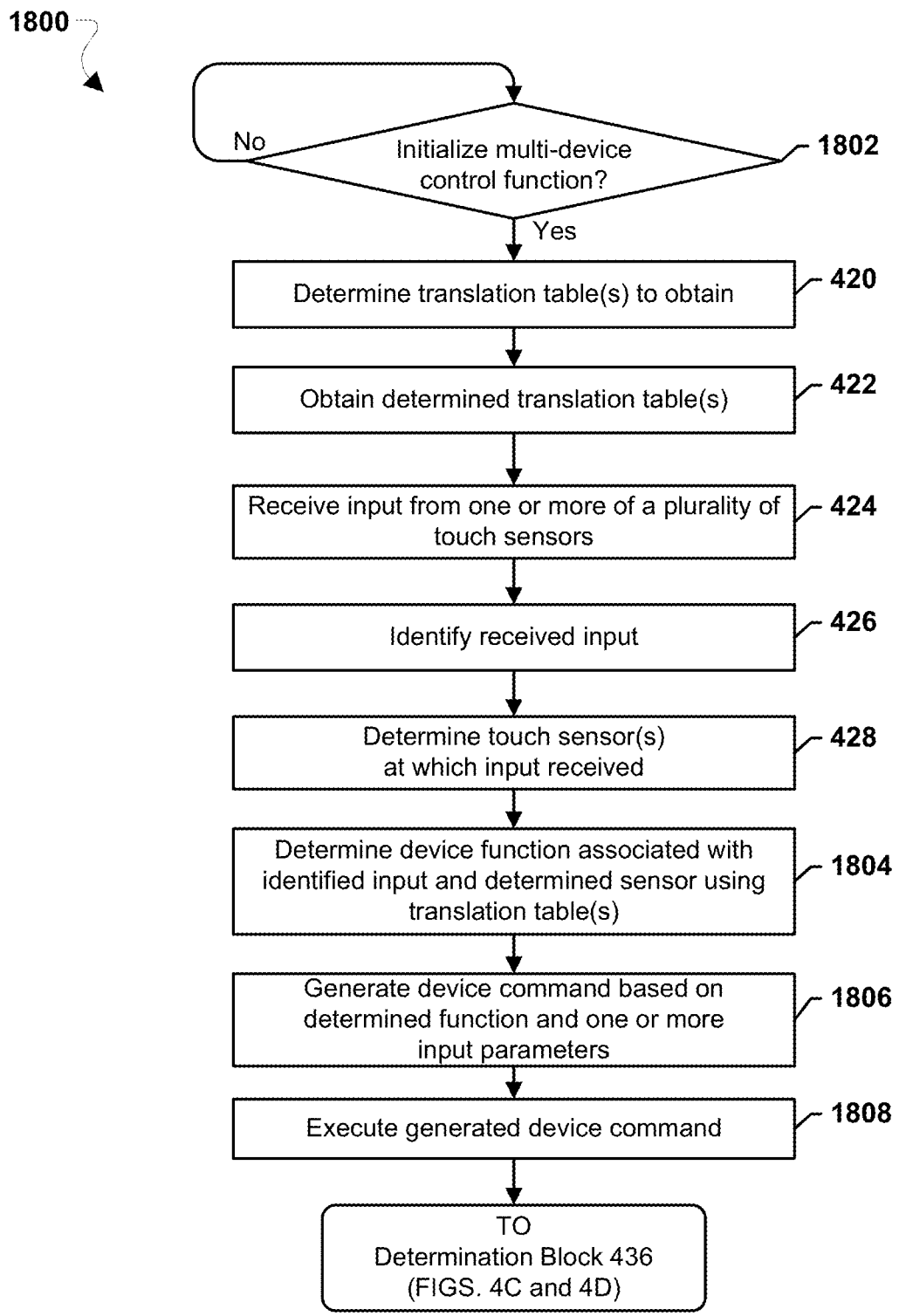
FIG. 18 is a process flow diagram illustrating a method of managing multisensor controls of a mobile computing device for controlling multiple devices based on inputs to various touch sensors of the mobile computing device according to some embodiments.

FIG. 18 illustrates a method 1800 of managing multisensor controls of a mobile computing device for controlling multiple devices based on inputs to various touch sensors of the mobile computing device according to some embodiments. With reference to FIGS. 1A-18, the method 1800 may be implemented in hardware components and/or software components of the mobile computing device (e.g., 100, 300), the operation of which may be controlled by one or more processors (e.g., the general-purpose processor 306) of the mobile computing device. In blocks 420-428, the processor of the mobile computing device may perform operations of like-numbered blocks of the methods 400c or 400d as described above.

In determination block 1802, a processor of the mobile computing device may determine whether a multi-device control function has been initialized. In some embodiments, the mobile computing device may communicate with one or more other devices, such as IoT devices (e.g., the IoT devices 204-208). In some embodiments, the mobile computing device may communicate with the one or more other devices directly, e.g. over a wired or wireless communication link. In some embodiments, the mobile computing device may communicate with the one or more other devices via an intermediary device, such as the IoT hub device 210. In some embodiments, establishing communication with the one or more other devices may include, involve, or trigger an initialization of the multi-device control function. In various embodiments, inputs to a touch sensor on the mobile computing device may control one or more functions of the one or more other devices.

In response to determining that the multi-device control function has not been initialized (i.e., determination block 1802="No"), the processor may continue to determine whether the multi-device control function has been initialized in determination block 1802.

In response to determining that the multi-device control function has been initialized (i.e., determination block 1802="Yes"), the processor may determine one or more translation tables to obtain in block 420. This determination may involve identifying or selecting a particular translation table(s) that is appropriate for use with the one or more other devices. The appropriate translation table(s) may provide a correlation between inputs received at one or more touch sensors and a function of the one or more other devices. The processor may obtain the determined one or more translation tables from memory in block 422.

In block 1804, the processor may determine a device function (i.e., of the one or more other devices) associated with the identified input and the determined touch sensor using the one or more translation tables. In some embodiments, the processor may determine a device function associated with an input to a rear touch sensor (e.g., the touch sensor 104) and/or a front touch sensor (e.g., the touch sensor 102) based on the obtained translation table(s). In some embodiments, the processor may translate an input to the front and/or back touch sensor(s) to functions of different devices.

In some embodiments, the processor may translate an input to a front input sensor (e.g., a touchscreen display) into a device function of a first device. In some embodiments, the processor may translate an input to a rear area input sensor (e.g., a touch sensor) into a device function of a second device.

For example, the first device may be the mobile computing device, and the processor may control a function of the mobile computing device (e.g. an input to an application running on the mobile computing device, control of the function of the mobile computing device, etc.) based on inputs to the front sensor. As another example, the first device may be a first other device, such as one of the IoT devices 204-208, and the processor may control a function of the first other device based on inputs to the front sensor. As another example, the second device may be a second other device (e.g., one of the IoT devices 204-208), and the processor may control function of the second other device based on inputs to the rear area input sensor (e.g., a touch sensor).

For example, the processor may translate an input to the front input sensor (e.g., a touchscreen display) into an application function to be performed within an application running on the mobile computing device. As another example, while the application is running on the mobile computing device and responsive to inputs to the front input sensor (e.g., a touchscreen display), the processor may translate an input to the rear area input sensor (e.g., a touch sensor) into a device function to be performed by a first other device. In some embodiments, the processor may control a function of the first other device based on inputs to the front input sensor (e.g., a touchscreen display), and the processor may control function of the second other device based on inputs to the rear area input sensor (e.g., a touch sensor).

For example, the processor may translate an input to the front and/or rear input sensor into a device function to be performed by an IoT lightbulb or lighting system (e.g., the IoT lightbulb or lighting system 204), such as turning a lightbulb or system on or off, increasing a brightness, dimming a brightness, changing an emitted color, and the like. As another example, the processor may translate an input to the front and/or rear input sensor into a device function to be performed by a smart thermostat (e.g., the smart thermostat 206), such as turning on or off a heating and/or cooling system, altering a thermostat setting, obtaining information from the thermostat, and the like. As another example, the processor may translate an input to the front and/or rear input sensor into a device function to be performed by an IoT security camera (e.g., the IoT security camera 208), such as changing a setting on the security camera, moving or turning the security camera, activating or deactivating the security camera/system, focusing on an object within the view of the security camera, and the like. As another example, the processor may translate an input to the front and/or rear input sensor into a device function to be performed by a smart TV device, such as performing one or more remote control functions of the TV. Other examples are possible, as well as combinations of the foregoing.

In block 1806, the processor may generate a device command based on the determined functions and one or more input parameters of the received input.

In block 1808, the processor may execute the generated device command In some embodiments, the processor may send, issue, transmit, etc. the generated command to the first or second other device.

The processor of the mobile computing device may then perform the operations of determination block 436 (FIGS. 4C and 4D).

Figure 19A:
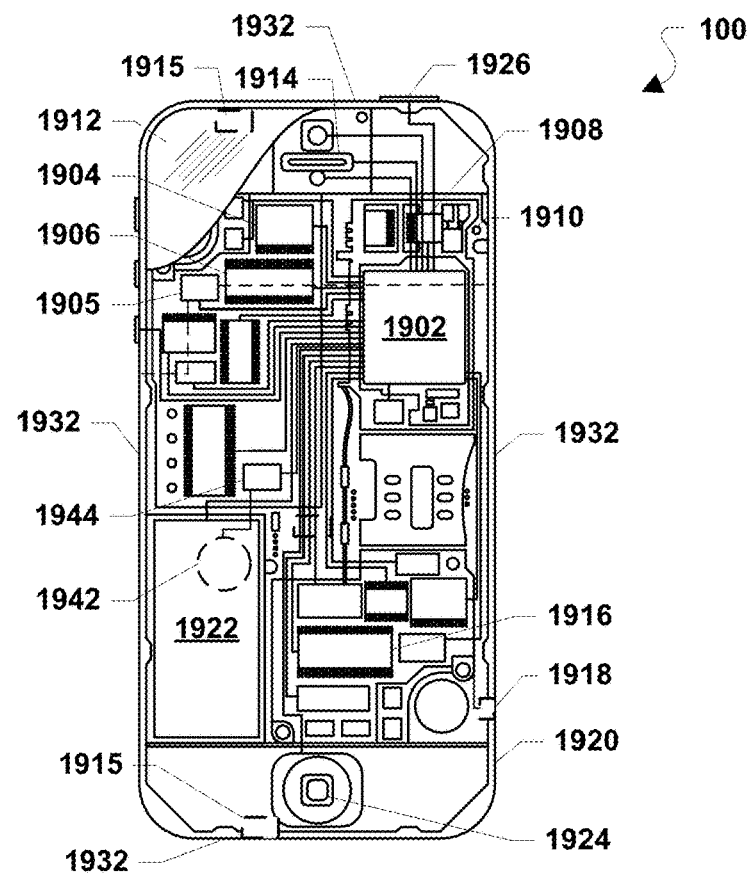
FIGS. 19A and 19B are component diagrams of an example mobile computing device suitable for use with various embodiments.
Figure 19B:
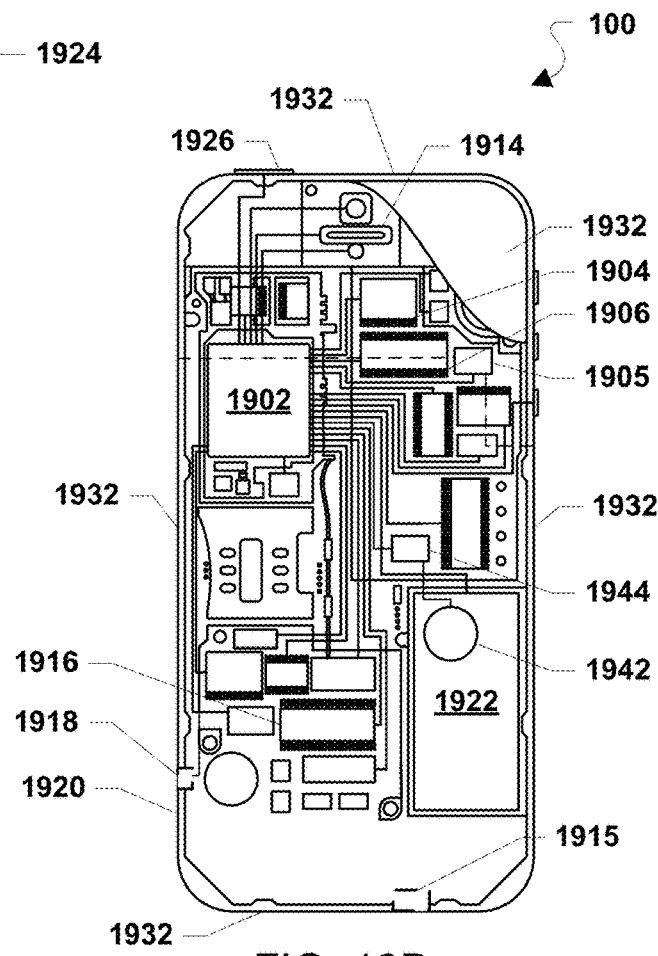

Various embodiments may be implemented one or more of a variety of mobile computing devices, an example of which in the form of a smartphone is illustrated in FIGS. 19A and 19B. With reference to FIGS. 1-19B, a mobile computing device 100 may include a housing body 1920, constructed of a plastic, metal, ceramic, glass, or a combination of such materials, for containing all or some of various components. The mobile computing device 100 may include a processor 1902 coupled to various systems and components. In particular, the processor 1902 may be coupled to an internal memory 1906, a touch screen controller 1904, an input sensor controller 1905 (e.g., a touch sensor controller 19), radio communication elements, speakers 1914, and a microphone 1915. The processor 1902 may be a single core or a multi-core processor designated for general or specific processing tasks. The internal memory 1906 may be volatile or non-volatile memory, and may also be secure and/or encrypted memory, or unsecure and/or unencrypted memory, or any combination thereof.

The touch screen controller 1904 may be coupled to a touch screen display 1912, such as a resistive-sensing touch screen, a capacitive-sensing touch screen, infrared sensing touch screen, etc. A capacitive-sensing touch screen display 1912 may include one or more touch sensors (e.g., 102). The touch sensor controller 1905 and the processor 1902 may be coupled to one or more multi-touch sensors 1932, such as touch sensors (e.g., 102, 104, 106a, 106b, 108, 327). One or more touch sensors 1932 may be located on the back panel (e.g., rear area 114), sides (e.g., 116a, 116b), top, and/or bottom of the mobile computing device 100.

The mobile computing device 100 may include one or more radio signal transceivers 1908 (e.g., Peanut, Bluetooth, Bluetooth LE, ZigBee, Wi-Fi®, radio frequency (RF) radio, etc.) coupled to antennae 1910 for sending and receiving communications. The one or more radio signal transceivers 1908 may be coupled to each other and/or to the processor 1902. The radio signal transceivers 1908 may implement the various wireless transmission protocol stacks and interfaces. For example, the mobile computing device 100 may include a cellular network wireless modem chip 1916 coupled to the processor that enables communication via a cellular network.

The mobile computing device 100 may include a peripheral device connection interface 1918 coupled to the processor 1902. The peripheral device connection interface 1918 may be configured to accept one or more types of physical and communication connections, common or proprietary, such as USB, FireWire, Thunderbolt, or PCIe. The peripheral device connection interface 1918 may also be coupled to a similarly configured peripheral device connection port (not shown).

The mobile computing device 100 may include a power source 1922 (e.g., a battery) coupled to the processor 1902, such as a disposable or rechargeable battery. The rechargeable battery may also be coupled to the peripheral device connection port to receive a charging current from a source external to the mobile computing device 100. Additionally, or alternatively, the rechargeable battery may be charged through wireless charging, such as through wireless charging antenna 1942. A wireless charging controller 1944 may be coupled to the charging antenna 1942 and the power source 1922 and configured to regulate the charging/recharging of the power source 1922 based on a charge state of the power source 1922, availability of wireless charging as sensed by the wireless charging antenna 1942 and/or control signals received from the processor 1902.

In various embodiments, the mobile computing device 100 may include one or more microphones 1915. For example, the mobile computing device may have microphones 1915 that are conventional for receiving voice or other audio frequency energy from a user during a call. The mobile computing device 100 may also include speakers 1914 for providing audio outputs. The mobile computing device 100 may also include one or more physical buttons 1924, 1926 for receiving user inputs.

The processors described herein may be any programmable microprocessor, microcomputer or multiple processor chip or chips that can be configured by software instructions (applications) to perform a variety of functions, including the functions of various embodiments described above. In some devices, multiple processors may be provided, such as one processor dedicated to wireless communication functions and one processor dedicated to running other applications. Typically, software applications may be stored in the internal memory before they are accessed and loaded into the processors. The processors may include internal memory sufficient to store the application software instructions. In many devices the internal memory may be a volatile or nonvolatile memory, such as flash memory, or a mixture of both. For the purposes of this description, a general reference to memory refers to memory accessible by the processors, including internal memory or removable memory plugged into the device and memory within the processor, themselves.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 500-1700 may be substituted for or combined with one or more operations of the methods 500-1700, and vice versa.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the claims.

The hardware used to implement various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the spirit or scope of the claims. Thus, the present disclosure is not intended to be limited to the embodiments shown herein but is to be accorded the widest scope consistent with the following claims and the principles and novel features disclosed herein.

What is claimed is:

1. A method of managing multilayer controls of a mobile computing device having one or more touch sensors, the method comprising:

receiving, by a processor of the mobile computing device, an input at a mobile computing device for performing a function with respect to content at the mobile device, wherein the content at the mobile device is segmented into at least a first command layer having one or more objects and a second command layer having one or more objects;

determining whether the received input is associated with a first object of the first command layer or a second object of the second command layer;

determining a function to be performed on the first object of the first command layer or the second object of the second command layer based on whether the first command layer or the second command layer is determined to be associated with the received input; and performing the determined function on the first object or the second object.

2. The method of claim 1, wherein receiving, by the processor of the mobile computing device, the input at the mobile computing device for performing a function with respect to content at the mobile device comprises receiving the input at one of the touch sensors of the mobile computing device for performing a function with respect to content at the mobile device.

3. The method of claim 1, further comprising:
obtaining a command layer translation table from a memory of the mobile computing device; and
determining a touch sensor at which the input was received;
wherein determining the function to be performed on the first object of the first command layer or the second object of the second command layer comprises determining the function associated with the received input and the associated command layer based on the determined touch sensor using the translation table.

4. The method of claim 1, wherein:
the first command layer comprises a first image layer of an image displayed by the mobile device, and the second command layer comprises a second image layer of the displayed image; and
performing the determined function on the first object or the second object comprises performing the determined function on an element of the first image layer or on an element of the second image layer.

5. The method of claim 1, wherein:
the first command layer comprises a foreground layer of an image displayed by the mobile device, and the second command layer comprises a background layer of the displayed image; and
performing the determined function on the first object or the second object comprises performing the determined function on an element of the foreground layer or on an element of the background layer.

6. The method of claim 1, wherein:
the first command layer comprises a first dimension of an image displayed by the mobile device, and the second command layer comprises a second dimension of the displayed image; and
performing the determined function on the first object or the second object comprises performing the determined function on the first dimension of the image or on the second dimension of the image.

7. The method of claim 1, wherein:
the first command layer comprises a first text layer of text displayed by the mobile device, and the second command layer comprises a second text layer of the displayed text; and
performing the determined function on the first object or the second object comprises performing the determined function on an element of the first text layer or on an element of the second text layer.

8. The method of claim 1, wherein:
the first command layer comprises a processor-generated image layer of digital objects in an extended reality image displayed by the mobile device, and the second command layer comprises a real image layer of real objects displayed in the displayed extended reality image; and
performing the determined function on the first object or the second object comprises performing the determined function on an extended reality image element within the first extended reality image layer or on a real element within the real image layer.

9. The method of claim 1, wherein:
the first command layer comprises a first application executing on the mobile device, and the second command layer comprises a second application executing on the mobile device; and
performing the determined function on the first object or the second object comprises sending an instruction to perform the determined function to the first application or the second application.

10. The method of claim 1, wherein:
the first command layer comprises a representation of a first device configured to receive commands from the mobile computing device, and the second command layer comprises a representation of a second device configured to receive commands from the mobile computing device; and
performing the determined function on the first object or the second object comprises sending an instruction to perform the determined function to the first device or the second device.

11. The method of claim 1, wherein a first group of the one or more touch sensors disposed substantially on a front of the mobile computing device is mapped to the first command layer, and a second group of the one or more touch sensors disposed substantially on a back of the mobile computing device is mapped to the second command layer.

12. The method of claim 11, wherein the received input is one of two or more inputs received by the processor at overlapping times from one of the touch sensors of the first group and one of the touch sensors of the second group.

13. The method of claim 11, wherein a third group of the one or more touch sensors disposed substantially on a side of the mobile computing device is mapped to one or more of the first command layer and the second command layer.

14. The method of claim 13, wherein the received input is one of two or more inputs received by the processor at overlapping times from one of the touch sensors of the third group and a touch sensor from among the first group and the second group.

15. A mobile computing device, comprising:
one or more touch sensors;
a memory; and
a processor coupled to the one or more touch sensors and the memory, and configured with processor-executable instructions to perform operations comprising:
receiving an input for performing a function with respect to content, wherein the content is segmented into at least a first command layer having one or more objects and a second command layer having one or more objects;
determining whether the received input is associated with a first object of the first command layer or a second object of the second command layer;
determining a function to be performed on the first object of the first command layer or the second object of the second command layer based on whether the first command layer or the second command layer is determined to be associated with the received input; and
performing the determined function on the first object or the second object.

16. The mobile computing device of claim 15, wherein the processor is configured with processor-executable instructions to perform operations such that receiving the input at the mobile computing device for performing a function with respect to content at the mobile device comprises receiving the input at one of the touch sensors of the mobile computing device for performing a function with respect to content at the mobile device.

17. The mobile computing device of claim 15, wherein the processor is configured with processor-executable instructions to perform operations further comprising:
obtaining a command layer translation table from the memory; and
determining a touch sensor at which the input was received,
wherein the processor is configured with processor-executable instructions to perform operations such that determining a function to be performed on the first object of the first command layer or the second object of the second command layer comprises determining the function associated with the received input and the associated command layer based on the determined touch sensor using the translation table.

18. The mobile computing device of claim 15, wherein the processor is configured with processor-executable instructions to perform operations such that:
the first command layer comprises a first image layer of an image displayed by the mobile device, and the second command layer comprises a second image layer of the displayed image; and
performing the determined function on the first object or the second object comprises performing the determined function on an element of the first image layer or on an element of the second image layer.

19. The mobile computing device of claim 15, wherein the processor is configured with processor-executable instructions to perform operations such that:
the first command layer comprises a foreground layer of an image displayed by the mobile device, and the second command layer comprises a background layer of the displayed image; and
performing the determined function on the first object or the second object comprises performing the determined function on an element of the foreground layer or on an element of the background layer.

20. The mobile computing device of claim 15, wherein the processor is configured with processor-executable instructions to perform operations such that:
the first command layer comprises a first dimension of an image displayed by the mobile device, and the second command layer comprises a second dimension of the displayed image; and
performing the determined function on the first object or the second object comprises performing the determined function on an element of the foreground layer or on an element of the background layer.

21. The mobile computing device of claim 15, wherein the processor is configured with processor-executable instructions to perform operations such that:
the first command layer comprises a first text layer of text displayed by the mobile device, and the second command layer comprises a second text layer of the displayed text; and
performing the determined function on the first object or the second object comprises performing the determined function on an element of the first text layer or on an element of the second text layer.

22. The mobile computing device of claim 15, wherein the processor is configured with processor-executable instructions to perform operations such that:
the first command layer comprises a processor-generated image layer of digital objects in an extended reality image displayed by the mobile device, and the second command layer comprises a real image layer of real objects displayed in the displayed extended reality image; and
performing the determined function on the first object or the second object comprises performing the determined function on an extended reality image element within the first extended reality image layer or on a real element within the real image layer.

23. The mobile computing device of claim 15, wherein the processor is configured with processor-executable instructions to perform operations such that:
the first command layer comprises a first application executing on the mobile device, and the second command layer comprises a second application executing on the mobile device; and
performing the determined function on the first object or the second object comprises sending an instruction to perform the determined function to the first application or the second application.

24. The mobile computing device of claim 15, wherein the processor is configured with processor-executable instructions to perform operations such that:
the first command layer comprises a representation of a first device configured to receive commands from the mobile computing device, and the second command layer comprises a representation of a second device configured to receive commands from the mobile computing device; and
performing the determined function on the first object or the second object comprises sending an instruction to perform the determined function to the first device or the second device.

25. The mobile computing device of claim 15, wherein the processor is configured with processor-executable instructions to perform operations such that a first group of the one or more touch sensors disposed substantially on a front of the mobile computing device is mapped to the first command layer, and a second group of the one or more touch sensors disposed substantially on a back of the mobile computing device is mapped to the second command layer.

26. The mobile computing device of claim 25, wherein the received input is one of two or more inputs received by the processor at overlapping times from one of the touch sensors of the first group and one of the touch sensors of the second group.

27. The mobile computing device of claim 25, wherein the processor is configured with processor-executable instructions to perform operations such that a third group of the one or more touch sensors disposed substantially on a side of the mobile computing device is mapped to one or more of the first command layer and the second command layer.

28. The mobile computing device of claim 27, wherein the received input is one of two or more inputs received by the processor at overlapping times from one of the touch sensors of the third group and a touch sensor from among the first group and the second group.

29. A non-transitory processor-readable storage medium having stored thereon processor-executable instructions configured to cause a processor of a mobile computing device having one or more touch sensors to perform operations for managing multilayer controls of the mobile computing device, comprising:
receiving an input for performing a function with respect to content, wherein the content is segmented into at least a first command layer having one or more objects and a second command layer having one or more objects;

determining whether the received input is associated with a first object of the first command layer or a second object of the second command layer;

determining a function to be performed on the first object of the first command layer or the second object of the second command layer based on whether the first command layer or the second command layer is determined to be associated with the received input; and performing the determined function on the first object or the second object.

30. The non-transitory processor-readable storage medium of claim 29, wherein the stored processor-executable instructions are configured to cause the processor of the mobile device to perform operations such that receiving the input for performing a function with respect to content comprises receiving the input at one of the touch sensors of the mobile computing device.

31. The non-transitory processor-readable storage medium of claim 29, wherein the stored processor-executable instructions are configured to cause the processor of the mobile device to perform operations further comprising:

obtaining a command layer translation table from a memory of the mobile computing device; and determining a touch sensor at which the input was received;

wherein the stored processor-executable instructions are configured to cause the processor of the mobile device to perform operations such that determining a function to be performed on the first object of the first command layer or the second object of the second command layer comprises determining the function associated with the received input and the associated command layer based on the determined touch sensor using the translation table.

32. The non-transitory processor-readable storage medium of claim 29, wherein the stored processor-executable instructions are configured to cause the processor of the mobile device to perform operations such that:

the first command layer comprises a first image layer of an image displayed by the mobile device, and the second command layer comprises a second image layer of the displayed image; and performing the determined function on the first object or the second object comprises performing the determined function on an element of the first image layer or on an element of the second image layer.

33. The non-transitory processor-readable storage medium of claim 29, wherein the stored processor-executable instructions are configured to cause the processor of the mobile device to perform operations such that:

the first command layer comprises a foreground layer of an image displayed by the mobile device, and the second command layer comprises a background layer of the displayed image; and performing the determined function on the first object or the second object comprises performing the determined function on an element of the foreground layer or on an element of the background layer.

34. The non-transitory processor-readable storage medium of claim 29, wherein the stored processor-executable instructions are configured to cause the processor of the mobile device to perform operations such that:

the first command layer comprises a first dimension of an image displayed by the mobile device, and the second command layer comprises a second dimension of the displayed image; and performing the determined function on the first object or the second object comprises performing the determined function on the first dimension of the image or on the second dimension of the image.

35. The non-transitory processor-readable storage medium of claim 29, wherein the stored processor-executable instructions are configured to cause the processor of the mobile device to perform operations such that:

the first command layer comprises a first text layer of text displayed by the mobile device, and the second command layer comprises a second text layer of the displayed text; and performing the determined function on the first object or the second object comprises performing the determined function on an element of the first text layer or on an element of the second text layer.

36. The non-transitory processor-readable storage medium of claim 29, wherein the stored processor-executable instructions are configured to cause the processor of the mobile device to perform operations such that:

the first command layer comprises a processor-generated image layer of digital objects in an extended reality image displayed by the mobile device, and the second command layer comprises a real image layer of real objects displayed in the displayed extended reality image; and performing the determined function on the first object or the second object comprises performing the determined function on an extended reality image element within the first extended reality image layer or on a real element within the real image layer.

37. The non-transitory processor-readable storage medium of claim 29, wherein the stored processor-executable instructions are configured to cause the processor of the mobile device to perform operations such that:

the first command layer comprises a first application executing on the mobile device, and the second command layer comprises a second application executing on the mobile device; and performing the determined function on the first object or the second object comprises sending an instruction to perform the determined function to the first application or the second application.

38. The non-transitory processor-readable storage medium of claim 29, wherein the stored processor-executable instructions are configured to cause the processor of the mobile device to perform operations such that:

the first command layer comprises a representation of a first device configured to receive commands from the mobile computing device, and the second command layer comprises a representation of a second device configured to receive commands from the mobile computing device; and performing the determined function on the first object or the second object comprises sending an instruction to perform the determined function to the first device or the second device.

39. The non-transitory processor-readable storage medium of claim 29, wherein the stored processor-executable instructions are configured to cause the processor of the mobile device to perform operations such that a first group of the one or more touch sensors disposed substantially on a front of the mobile computing device is mapped to the first command layer, and a second group of the one or more touch sensors disposed substantially on a back of the mobile computing device is mapped to the second command layer.

40. The non-transitory processor-readable storage medium of claim 39, wherein the received input is one of two or more inputs received by the processor at overlapping times from one of the touch sensors of the third group and a touch sensor from among the first group and the second group.

41. The non-transitory processor-readable storage medium of claim 39, wherein the stored processor-executable instructions are configured to cause the processor of the mobile device to perform operations such that a third group of the one or more touch sensors disposed substantially on a side of the mobile computing device is mapped to one or more of the first command layer and the second command layer.

42. The non-transitory processor-readable storage medium of claim 41, wherein the received input is one of two or more inputs received by the processor at overlapping times from one of the touch sensors of the third group and a touch sensor from among the first group and the second group.

43. A mobile computing device, comprising:
one or more touch sensors;
means for receiving an input for performing a function with respect to content, wherein the content at the mobile device is segmented into at least a first command layer having one or more objects and a second command layer having one or more objects;
means for determining whether the received input is associated with a first object of the first command layer or a second object of the second command layer;
means for determining a function to be performed on the first object of the first command layer or the second object of the second command layer based on whether the first command layer or the second command layer is determined to be associated with the received input; and
means for performing the determined function on the first object or the second object.

44. The mobile computing device of claim 43, wherein means for receiving the input at the mobile computing device for performing a function with respect to content comprises means for receiving the input at one of the touch sensors.

45. The mobile computing device of claim 43, further comprising:
means for obtaining a command layer translation table from a memory of the mobile computing device; and
means for determining a touch sensor at which the input was received;
wherein means for determining a function to be performed on the first object of the first command layer or the second object of the second command layer comprises means for determining the function associated with the received input and the associated command layer based on the determined touch sensor using the translation table.

46. The mobile computing device of claim 43, wherein:
the first command layer comprises a first image layer of an image displayed by the mobile device, and the second command layer comprises a second image layer of the displayed image; and
means for performing the determined function on the first object or the second object comprises means for performing the determined function on an element of the first image layer or on an element of the second image layer.

47. The mobile computing device of claim 43, wherein:
the first command layer comprises a foreground layer of an image displayed by the mobile device, and the second command layer comprises a background layer of the displayed image; and
means for performing the determined function on the first object or the second object comprises means for performing the determined function on an element of the foreground layer or on an element of the background layer.

48. The mobile computing device of claim 43, wherein:
the first command layer comprises a first dimension of an image displayed by the mobile device, and the second command layer comprises a second dimension of the displayed image; and
means for performing the determined function on the first object or the second object comprises means for performing the determined function on the first dimension of the image or on the second dimension of the image.

49. The mobile computing device of claim 43, wherein:
the first command layer comprises a first text layer of text displayed by the mobile device, and the second command layer comprises a second text layer of the displayed text; and
means for performing the determined function on the first object or the second object comprises means for performing the determined function on an element of the first text layer or on an element of the second text layer.

50. The mobile computing device of claim 43, wherein:
the first command layer comprises a processor-generated image layer of digital objects in an extended reality image displayed by the mobile device, and the second command layer comprises a real image layer of real objects displayed in the displayed extended reality image; and
means for performing the determined function on the first object or the second object comprises means for performing the determined function on an extended reality image element within the first extended reality image layer or on a real element within the real image layer.

51. The mobile computing device of claim 43, wherein:
the first command layer comprises a first application executing on the mobile device, and the second command layer comprises a second application executing on the mobile device; and
means for performing the determined function on the first object or the second object comprises means for sending an instruction to perform the determined function to the first application or the second application.

52. The mobile computing device of claim 43, wherein:
the first command layer comprises a representation of a first device configured to receive commands from the mobile computing device, and the second command layer comprises a representation of a second device configured to receive commands from the mobile computing device; and means for performing the determined function on the first object or the second object comprises means for sending an instruction to perform the determined function to the first device or the second device.

53. The mobile computing device of claim 43, wherein a first group of the one or more touch sensors disposed substantially on a front of the mobile computing device is mapped to the first command layer, and a second group of the one or more touch sensors disposed substantially on a back of the mobile computing device is mapped to the second command layer.

54. The mobile computing device of claim 53, wherein the received input is one of two or more inputs received by the processor at overlapping times from one of the touch sensors of the third group and a touch sensor from among the first group and the second group.

55. The mobile computing device of claim 53, wherein a third group of the one or more touch sensors disposed substantially on a side of the mobile computing device is mapped to one or more of the first command layer and the second command layer.

56. The mobile computing device of claim 55, wherein the received input is one of two or more inputs received by the processor at overlapping times from one of the touch sensors of the third group and a touch sensor from among the first group and the second group.

\* \* \* \* \*